United States Patent
Sakuma et al.

(10) Patent No.: US 11,437,403 B2
(45) Date of Patent: Sep. 6, 2022

(54) FERROELECTRIC MEMORY DEVICE

(71) Applicant: Kioxia Corporation, Minato-ku (JP)

(72) Inventors: Keiko Sakuma, Yokkaichi (JP); Akio Kaneko, Yokkaichi (JP); Hidenori Miyagawa, Yokkaichi (JP); Yuuichi Kamimuta, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 28 days.

(21) Appl. No.: 16/902,533

(22) Filed: Jun. 16, 2020

(65) Prior Publication Data
US 2021/0082957 A1    Mar. 18, 2021

(30) Foreign Application Priority Data

Sep. 18, 2019  (JP) .............................. JP2019-169046

(51) Int. Cl.
*H01L 27/11597*  (2017.01)
*H01L 27/11587*  (2017.01)
(Continued)

(52) U.S. Cl.
CPC .. *H01L 27/11597* (2013.01); *H01L 27/11551* (2013.01); *H01L 27/11556* (2013.01);
(Continued)

(58) Field of Classification Search
CPC ......... H01L 27/11551; H01L 27/11556; H01L 27/11585; H01L 27/1159; H01L 27/11597
See application file for complete search history.

(56) References Cited

U.S. PATENT DOCUMENTS 9,362,487 B2   6/2016 Inumiya et al.
9,761,798 B2   9/2017 Kamimuta et al.
(Continued)

FOREIGN PATENT DOCUMENTS

JP    2011-165711 A    8/2011
JP    2016-534575 A    11/2016
(Continued)

OTHER PUBLICATIONS

P. Polakowski, et al., "Ferroelectricity in undoped hafnium oxide", Appl. Phys. Lett. 106, 232905, 2015, 6 pages.
(Continued)

*Primary Examiner* — Matthew E Warren
(74) *Attorney, Agent, or Firm* — Oblon, McClelland, Maier & Neustadt, L.L.P.

(57) ABSTRACT

Provided is a storage device according to an embodiment including: a stacked body including gate electrode layers stacked in a first direction; a semiconductor layer provided in the stacked body and extending in the first direction; and a gate insulating film provided between the semiconductor layer and the gate electrode layer, the gate insulating film having a first region disposed between the gate electrode layer and the semiconductor layer and a second region disposed between the two first regions adjacent to each other in the first direction, the gate insulating film containing a hafnium oxide, in which a first thickness of the first region in the second direction from the semiconductor layer toward the gate electrode layer is smaller than a second thickness of the second region in the second direction.

16 Claims, 35 Drawing Sheets

(51) Int. Cl.
*H01L 27/11556* (2017.01)
*H01L 27/11585* (2017.01)
*H01L 27/11551* (2017.01)
*H01L 21/311* (2006.01)

(52) U.S. Cl.
CPC .. *H01L 27/11585* (2013.01); *H01L 27/11587* (2013.01); *H01L 21/31111* (2013.01)

(56) References Cited

U.S. PATENT DOCUMENTS

| | | |
|---|---|---|
| 9,954,167 B2 | 4/2018 | Fujii et al. |
| 2011/0188288 A1 | 8/2011 | Minami |
| 2011/0294290 A1* | 12/2011 | Nakanishi ......... H01L 27/11524 438/666 |
| 2015/0076437 A1 | 3/2015 | Tao et al. |
| 2019/0296234 A1 | 9/2019 | Yoshimura et al. |

FOREIGN PATENT DOCUMENTS

| | | | | |
|---|---|---|---|---|
| JP | 6193828 B2 | | 9/2017 | |
| JP | 2018037441 A | * | 3/2018 | |
| JP | 6367152 B2 | | 8/2018 | |
| JP | 2019-169573 A | | 10/2019 | |
| KR | 20110128717 A | * | 11/2011 | ........ H01L 27/11582 |
| KR | 20210102981 A | * | 8/2021 | ......... H01L 29/7889 |
| TW | 202044544 A | * | 12/2020 | ........ H01L 27/11578 |

OTHER PUBLICATIONS

M. H. Park, et al., "Evolution of phases and ferroelectric properties of thin $Hf_{0.5}Zr_{0.5}O_2$ films according to the thickness and annealing temperature", Appl. Phys. Lett. 102, 242905, 2013, pp. 6.

M. Hoffmann, et al., "Stabilizing the ferroelectric phase in doped hafnium oxide", Journal of Applied Physics 118, 072006, 2015, 10 pages.

* cited by examiner

BB' CROSS SECTION

AA' CROSS SECTION

YY' CROSS SECTION

XX' CROSS SECTION

DD' CROSS SECTION

CC' CROSS SECTION

FF' CROSS SECTION

EE' CROSS SECTION

GG' CROSS SECTION

HH' CROSS SECTION

II' CROSS SECTION

JJ' CROSS SECTION

KK' CROSS SECTION

LL' CROSS SECTION

NN' CROSS SECTION

MM' CROSS SECTION

PP' CROSS SECTION

OO' CROSS SECTION

RR' CROSS SECTION

QQ' CROSS SECTION

FERROELECTRIC MEMORY DEVICE

CROSS-REFERENCE TO RELATED APPLICATION

This application is based upon and claims the benefit of priority from Japanese Patent Application No. 2019-169046, filed on Sep. 18, 2019, the entire contents of which are incorporated herein by reference.

FIELD

Embodiments described herein relate generally to storage devices.

BACKGROUND

Ferroelectric memories have attracted attention as non-volatile memories. As ferroelectric memories, there is exemplified a three-terminal type memory in which a gate insulating film of a transistor is a ferroelectric film or a two-terminal type memory such as a ferroelectric tunnel junction (FTJ) memory in which a ferroelectric film is provided between two electrodes.

The ferroelectric memory uses the polarization inversion of the ferroelectric material to perform writing of data into a memory cell and erasing of data from the memory cell. When a ferroelectric memory is scaled down, there is a concern in that memory characteristics may be degraded due to, for example, inter-cell interference between adjacent memory cells. In addition, for example, there is a concern in that partial polarization of the gate insulating film may cause a variation in threshold voltage, and thus, memory characteristics may be degraded.

DETAILED DESCRIPTION

Figure 1:
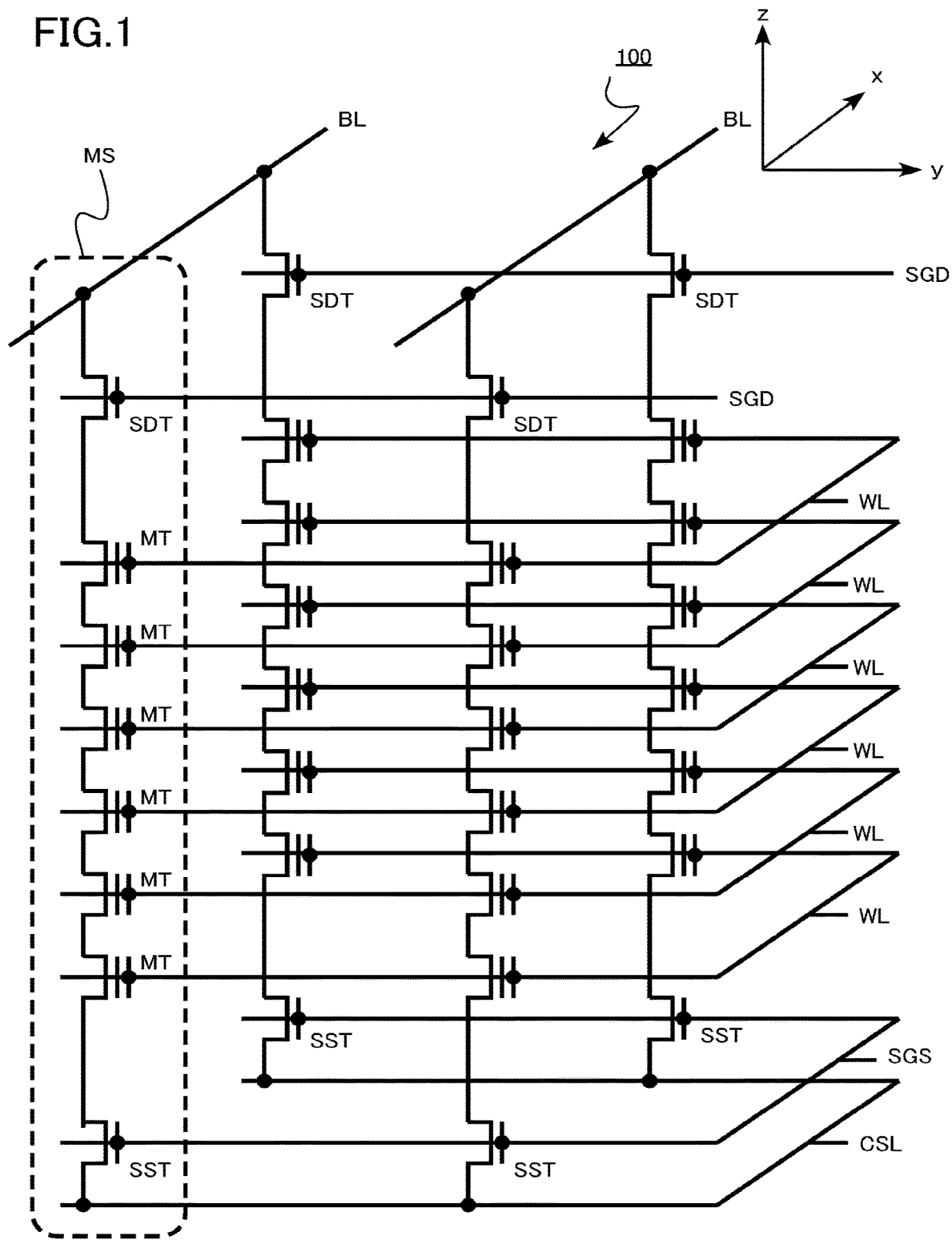
FIG. 1 is a circuit diagram of a memory cell array of a storage device according to a first embodiment.

A storage device according to an embodiment is configured to include: a stacked body including gate electrode layers stacked in a first direction, the gate electrode layers including a first gate electrode layer and a second gate electrode layer neighboring the first gate electrode layer in the first direction; a semiconductor layer provided in the stacked body and extending in the first direction; and a gate insulating film including a first region, a second region, and a third region, the second region interposed between the first region and the third region, the first region interposed between the first gate electrode layer and the semiconductor layer, the third region interposed between the second gate electrode layer and the semiconductor layer, and the gate insulating film containing a hafnium oxide, in which a first thickness of the first region in a second direction from the first gate electrode layer toward the semiconductor layer is smaller than a second thickness of the second region in the second direction.

Hereinafter, embodiments will be described with reference to the drawings. In addition, in the following description, the same or similar members and the like are denoted by the same reference numerals, and the description of the members and the like once described is appropriately omitted.

In the present specification, for the convenience, the terms "upper" and "lower" may be used. The terms "upper" and "lower" are terms merely indicating a relative positional relationship in the drawing and are not terms defining a positional relationship with respect to gravity.

The qualitative analysis and the quantitative analysis of the chemical composition of members constituting the storage device in the present specification can be performed by, for example, secondary ion mass spectroscopy (SIMS) and energy dispersive X-ray spectroscopy (EDX). In addition, for example, a transmission electron microscope (TEM) can be used to measure the thicknesses of the members constituting the storage device, the distance between the members, and the like. In addition, for example, X-ray photoelectron spectroscopy (XPS) and nano beam electron diffraction (nano beam diffraction: NBD) can be used for the identification of the crystal systems and the comparison of the existence ratio of the crystal systems of the members constituting the storage device.

In the present specification, the term "ferroelectric material" denotes a material that has spontaneous polarization without an external electric field being applied and that inverts the polarization when an external electric field is applied. In addition, in the present specification, the term "paraelectric material" denotes a material in which polarization occurs when an electric field is applied and in which polarization disappears when an electric field is removed.

In the present specification, a "metal" is a general term for a material exhibiting metal properties. Therefore, for example, a metal nitride exhibiting metal properties is also included in the scope of a "metal".

First Embodiment

A storage device according to a first embodiment is configured to include a stacked body including gate electrode layers stacked in a first direction, the gate electrode layers including a first gate electrode layer and a second gate electrode layer neighboring the first gate electrode layer in the first direction; a semiconductor layer provided in the stacked body and extending in the first direction; and a gate insulating film including a first region, a second region, and a third region, the second region interposed between the first region and the third region, the first region interposed between the first gate electrode layer and the semiconductor layer, the third region interposed between the second gate electrode layer and the semiconductor layer, and the gate insulating film containing a hafnium oxide. A first thickness of the first region in a second direction from the first gate electrode layer toward the semiconductor layer is smaller than a second thickness of the second region in the second direction The storage device according to the first embodiment is a three-dimensional NAND flash memory having a memory cell transistor MT. The memory cell transistor MT includes a ferroelectric film in the gate insulating film. The storage device according to the first embodiment is a three-terminal type memory.

FIG. 1 is a circuit diagram of a memory cell array of the storage device according to the first embodiment.

As illustrated in FIG. 1, the memory cell array 100 of the three-dimensional NAND flash memory according to the first embodiment is configured to include: a plurality of word lines WL (gate electrode layers); a common source line CSL; a source select gate line SGS; a plurality of drain select gate lines SGD; a plurality of bit lines BL; and a plurality of memory strings MS.

The plurality of word lines WL are stacked and arranged in the z direction. The plurality of memory strings MS extend in the z direction. The plurality of bit lines BL extend, for example, in the x direction.

As illustrated in FIG. 1, the memory string MS is configured to include: a source selection transistor SST; a plurality of memory cell transistors MT; and a drain selection transistor SDT which are connected in series between a common source line CSL and a bit line BL. One memory string MS can be selected by the bit line BL and the drain select gate line SGD, and one memory cell transistor MT can be selected by the word line WL. The memory cell transistor MT is a three-terminal element.

Figure 2A:
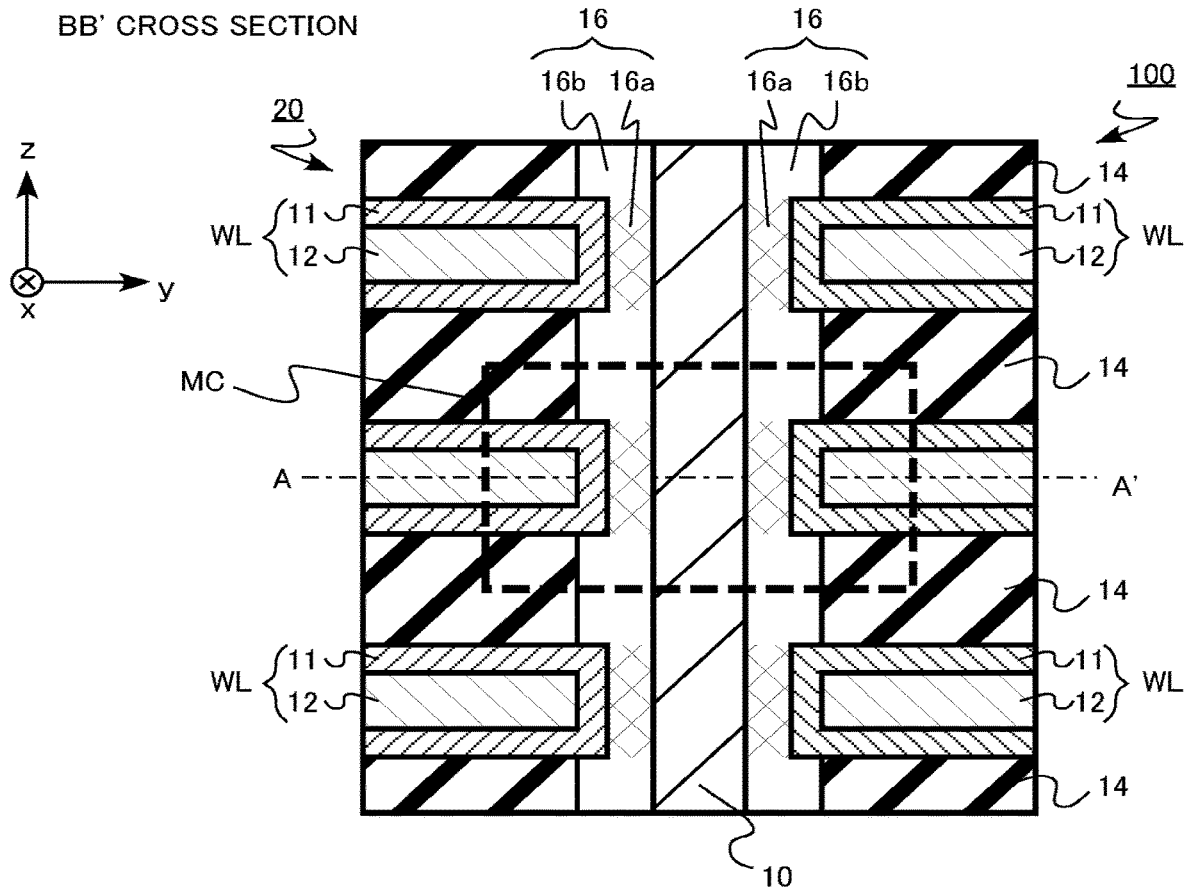
FIGS. 2A and 2B are schematic cross-sectional views of a portion of the memory cell array of the storage device according to the first embodiment.
Figure 2B:
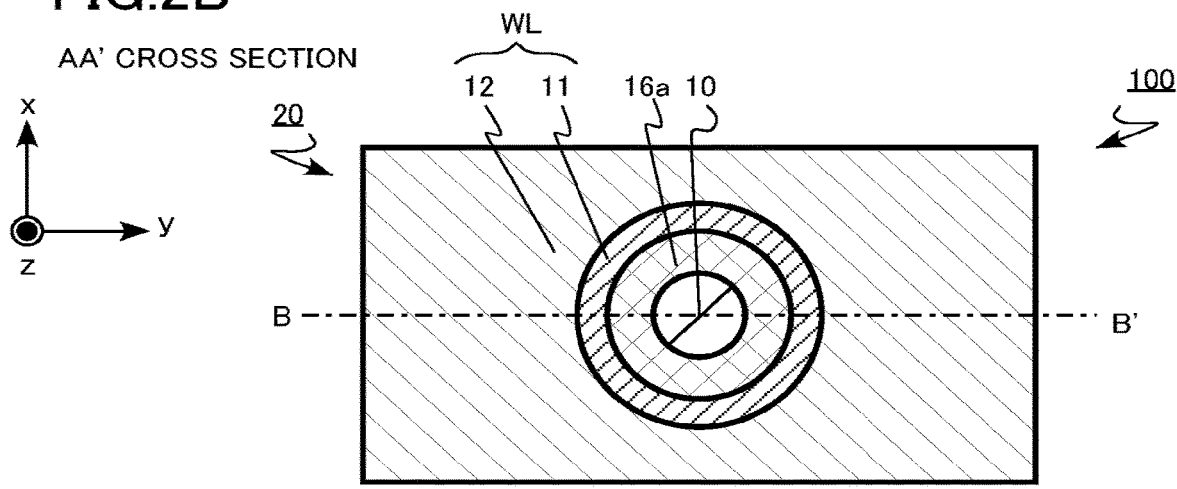

FIGS. 2A and 2B are schematic cross-sectional views of a portion of the memory cell array of the storage device according to the first embodiment. FIGS. 2A and 2B illustrate cross sections of a plurality of memory cells MC in one memory string MS surrounded by, for example, a dotted line in the memory cell array 100 of FIG. 1.

FIG. 2A is a yz cross-sectional view of the memory cell array 100. FIG. 2A is a BB' cross section of FIG. 2B. FIG. 2B is an xy cross-sectional view of the memory cell array 100. FIG. 2B is an AA' cross section of FIG. 2A. In FIG. 2A, a region surrounded by a broken line is one memory cell MC.

Figure 3:
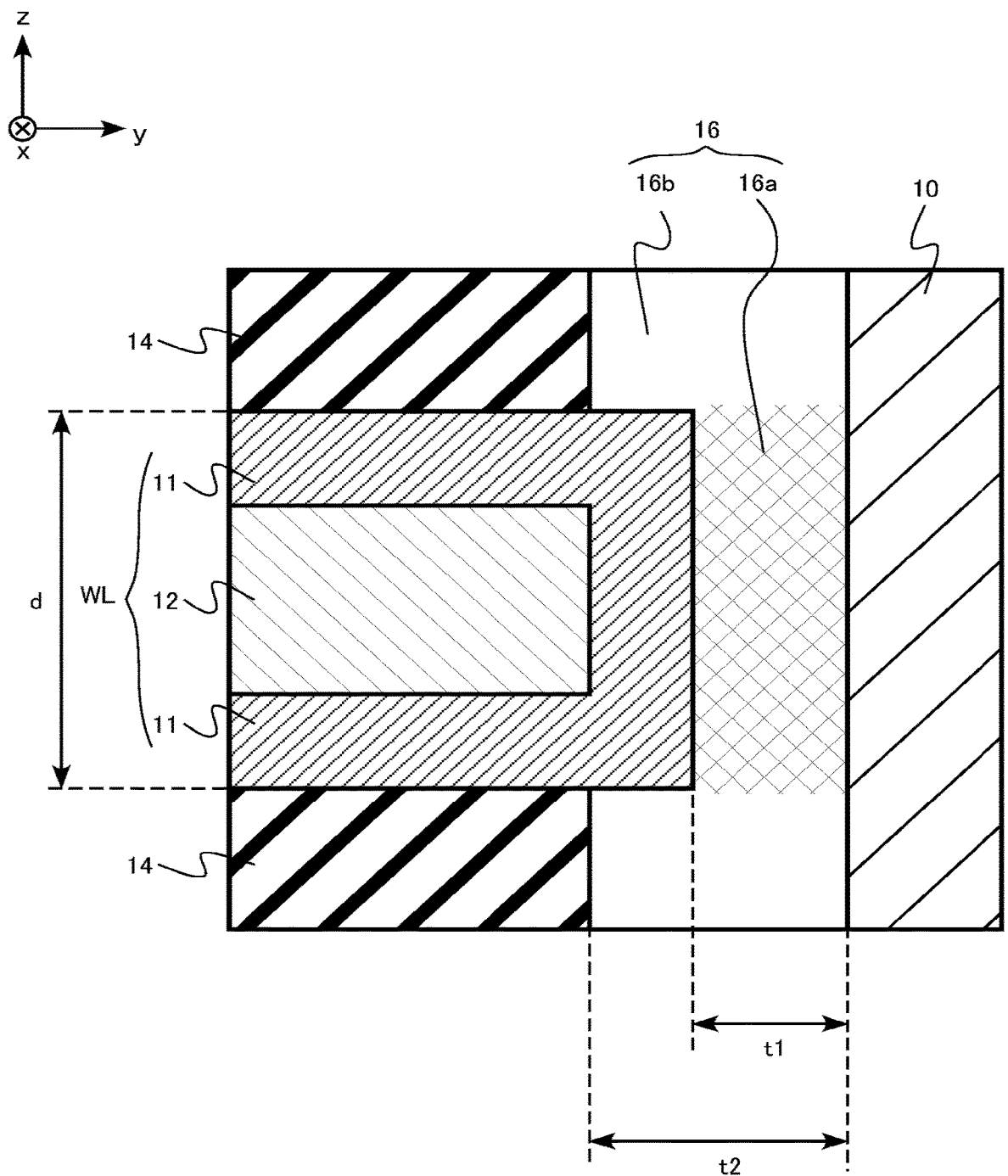
FIG. 3 is a schematic cross-sectional view of a memory cell of the storage device according to the first embodiment.

FIG. 3 is a schematic cross-sectional view of the memory cell of the storage device according to the first embodiment. FIG. 3 is an enlarged cross-sectional view of a portion of the memory cell MC. FIG. 3 is a yz cross-sectional view of the memory cell MC.

As illustrated in FIGS. 2A, 2B, and 3, the memory cell array 100 is configured to include: a plurality of word lines WL (gate electrode layers); a semiconductor layer 10; a plurality of interlayer insulating layers 14 (insulating layers); and a gate insulating film 16. The plurality of word lines WL and the plurality of interlayer insulating layers 14 constitute a stacked body 20.

The word line WL has, for example, a barrier metal layer 11 and a main metal layer 12. The gate insulating film 16 has a ferroelectric region 16a (first region, third region) and a paraelectric region 16b (second region).

Hereinafter, the x direction illustrated in FIGS. 1, 2A, 2B, and 3 is defined as a third direction, the y direction is defined as a second direction, and the z direction is defined as a first direction.

The word lines WL and the interlayer insulating layer 14 are provided, for example, on a semiconductor substrate (not illustrated). The semiconductor substrate is, for example, a silicon substrate.

The word lines WL and the interlayer insulating layers 14 are alternately stacked on the semiconductor substrate in the z direction (first direction). The word lines WL are arranged apart from each other in the z direction. The plurality of word lines WL and the plurality of interlayer insulating layers 14 constitute a stacked body 20.

The word line WL is, for example, a plate-shaped conductor. The word line WL contains, for example, a metal, a metal nitride, a metal carbide, or a semiconductor. The word line WL has, for example, a barrier metal layer 11 and a main metal layer 12.

The barrier metal layer 11 is made of, for example, a metal nitride or a metal carbide. The barrier metal layer 11 is made of, for example, a titanium nitride, a tantalum nitride, a tungsten nitride, a tantalum nitride, a titanium carbide, a tungsten carbide, or a tantalum carbide. The main metal layer 12 is made of, for example, a metal. The main metal layer 12 is made of, for example, tungsten (W), titanium (Ti), or tantalum (Ta).

The word line WL functions as a control electrode of the memory cell transistor MT. The word line WL is an example of a gate electrode layer.

The thickness (d in FIG. 3) of the word line WL in the z direction (first direction) is, for example, 5 nm or more and 40 nm or less.

The interlayer insulating layer 14 separates the word lines WL from each other. The interlayer insulating layer 14 is made of, for example, an oxide, an oxynitride, or a nitride. The interlayer insulating layer 14 is made of, for example, a silicon oxide.

The thickness of the interlayer insulating layer 14 in the z direction (first direction) is, for example, 5 nm or more and 40 nm or less.

The semiconductor layer 10 is provided in the stacked body 20. The semiconductor layer 10 extends in the z direction. The semiconductor layer 10 is provided to penetrate the stacked body 20. The semiconductor layer 10 has, for example, a columnar shape.

The semiconductor layer 10 is made of, for example, a polycrystalline semiconductor. The semiconductor layer 10 is made of, for example, polycrystalline silicon. The semiconductor layer 10 functions as a channel of the memory cell transistor MT.

The gate insulating film 16 is provided between the semiconductor layer 10 and the word line WL. The gate insulating film 16 extends in the z direction.

The gate insulating film 16 is provided along the side surface of semiconductor layer 10. The gate insulating film 16 is also provided between the semiconductor layer 10 and the interlayer insulating layer 14. The gate insulating film 16 is provided between the adjacent memory cell transistors MT without being divided.

The gate insulating film 16 is in contact with, for example, the semiconductor layer 10 and the word line WL. The gate insulating film 16 contains a hafnium oxide. The gate insulating film 16 contains, for example, the hafnium oxide as a main component. The phrase "contains the hafnium oxide as a main component" denotes that the molar ratio of the hafnium oxide is the highest among the materials contained in the gate insulating film 16. The molar ratio of the hafnium oxide is, for example, 90° or more.

The hafnium oxide constituting the gate insulating film 16 may contain, for example, at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The containing of the above-mentioned additive element allows the hafnium oxide to easily exhibit ferroelectricity.

The gate insulating film 16 has ferroelectric region 16a (first region, third region) and paraelectric region 16b (second region). The ferroelectric region 16a is provided between the semiconductor layer 10 and the word line WL. The paraelectric region 16b is provided between the semiconductor layer 10 and the interlayer insulating layer 14. The paraelectric region 16b is interposed between two ferroelectric regions 16a adjacent to each other in the z direction.

The ferroelectric region 16a and the paraelectric region 16b have, for example, the same chemical composition. The phrase "the same chemical composition" denotes that the composition is within a range of a variation of the composition occurring unavoidably, for example, in manufacturing.

The ferroelectric region 16a contains a ferroelectric material. The ferroelectric region 16a contains a hafnium oxide of a ferroelectric material. For example, the main component of the ferroelectric region 16a is a hafnium oxide. The ferroelectric region 16a is made of, for example, a hafnium oxide of a ferroelectric material.

The ferroelectric region 16a contains an orthorhombic hafnium oxide. The hafnium oxide contained in the ferroelectric region 16a mainly has an orthorhombic crystal. More specifically, the hafnium oxide contained in the ferroelectric region 16a mainly has a third orthorhombic crystal (orthorhombic III, space group Pbc21, space group number 29). A main crystal structure of the hafnium oxide contained in the ferroelectric region 16a is orthorhombic. The proportion occupied by the orthorhombic crystal to the crystal of the hafnium oxide contained in the ferroelectric region 16a is the largest.

The paraelectric region 16b contains a paraelectric material. The paraelectric region 16b contains a hafnium oxide of a paraelectric material. For example, the main component of the paraelectric region 16b is a hafnium oxide. The paraelectric region 16b is made of, for example, a hafnium oxide of a paraelectric material.

The paraelectric region 16b contains a hafnium oxide having a crystal other than the orthorhombic crystal. The crystal other than the orthorhombic crystal is a cubic crystal, a hexagonal crystal, a tetragonal crystal, a monoclinic crystal, or a triclinic crystal. The hafnium oxide contained in the paraelectric region 16b mainly has a crystal other than the orthorhombic crystal. A main crystal structure of the hafnium oxide contained in the paraelectric region 16b is a crystal structure other than the orthorhombic. The proportion occupied by the crystal other than the orthorhombic crystal to the crystal of the hafnium oxide contained in the paraelectric region 16b is the largest.

The first thickness (t1 in FIG. 3) of the ferroelectric region 16a in the y direction (second direction) from the word line WL toward the semiconductor layer 10 is smaller than the second thickness (t2 in FIG. 3) of the paraelectric region 16b in the y direction. The second thickness t2 is, for example, 1.2 times or more and 3 times or less the first thickness t1.

The first thickness t1 of the ferroelectric region 16a is, for example, 5 nm or more and 10 nm or less. The second thickness t2 of the paraelectric region 16b is, for example, 15 nm or more and 30 nm or less.

In the memory cell MC according to the first embodiment, the polarization inversion state of the ferroelectric material contained in the ferroelectric region 16a of the gate insulating film 16 is controlled by a voltage applied between the word line WL and the semiconductor layer 10. According to the polarization inversion state of the ferroelectric region 16a, the threshold voltage of the memory cell transistor MT is changed.

When the threshold voltage of the memory cell transistor MT is changed, the "on" current of the memory cell transistor MT is changed. For example, when the state where the threshold voltage is high and the "on" current is low is defined as data "0", and the state where the threshold voltage is low and the "on" current is high is defined as data "1", the memory cell can store 1-bit data of "0" and "1".

Next, an example of a method of manufacturing the storage device according to the first embodiment will be described. FIGS. 4, 5, 6, 7, 8, 9, 10, and 11 are schematic cross-sectional views illustrating the method of manufacturing the storage device according to the first embodiment. FIGS. 4, 5, 6, 7, 8, 9, 10, and 11 illustrate the respective cross sections corresponding to FIG. 2A. FIGS. 4, 5, 6, 7, 8, 9, 10, and 11 illustrate an example of the method of manufacturing the memory cell array 100 of the storage device.

Figure 4:
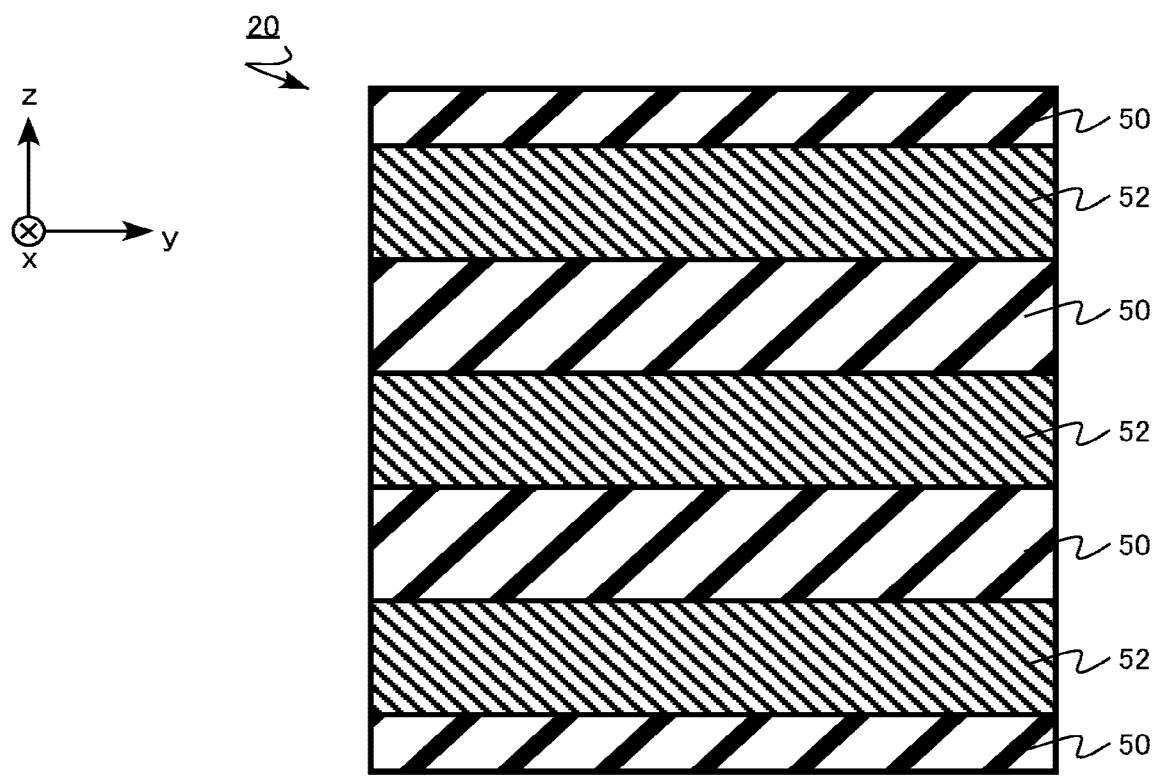
FIG. 4 is a schematic cross-sectional view illustrating a method of manufacturing the storage device according to the first embodiment.

First, a silicon oxide layer 50 and a silicon nitride layer 52 are alternately stacked on the semiconductor substrate (not illustrated) (FIG. 4). The stacked body 20 is formed by the silicon oxide layer 50 and the silicon nitride layer 52. The silicon oxide layer 50 and the silicon nitride layer 52 are formed by, for example, a chemical vapor deposition method (CVD method). A portion of the silicon oxide layer 50 finally becomes the interlayer insulating layer 14.

Figure 5:
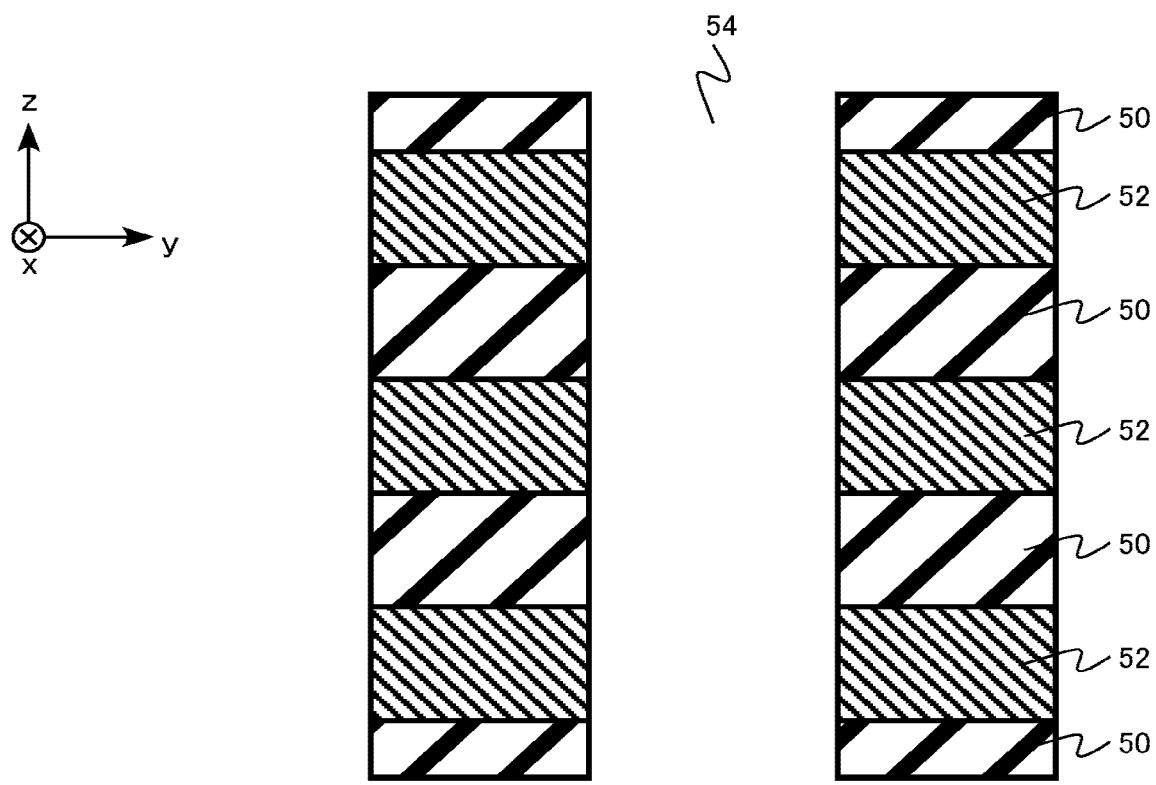
FIG. 5 is a schematic cross-sectional view illustrating the method of manufacturing the storage device according to the first embodiment.

Next, an opening 54 is formed in the silicon oxide layer 50 and the silicon nitride layer 52 (FIG. 5). The opening 54 is formed by, for example, a lithography method and a reactive ion etching method (RIE method).

Figure 6:
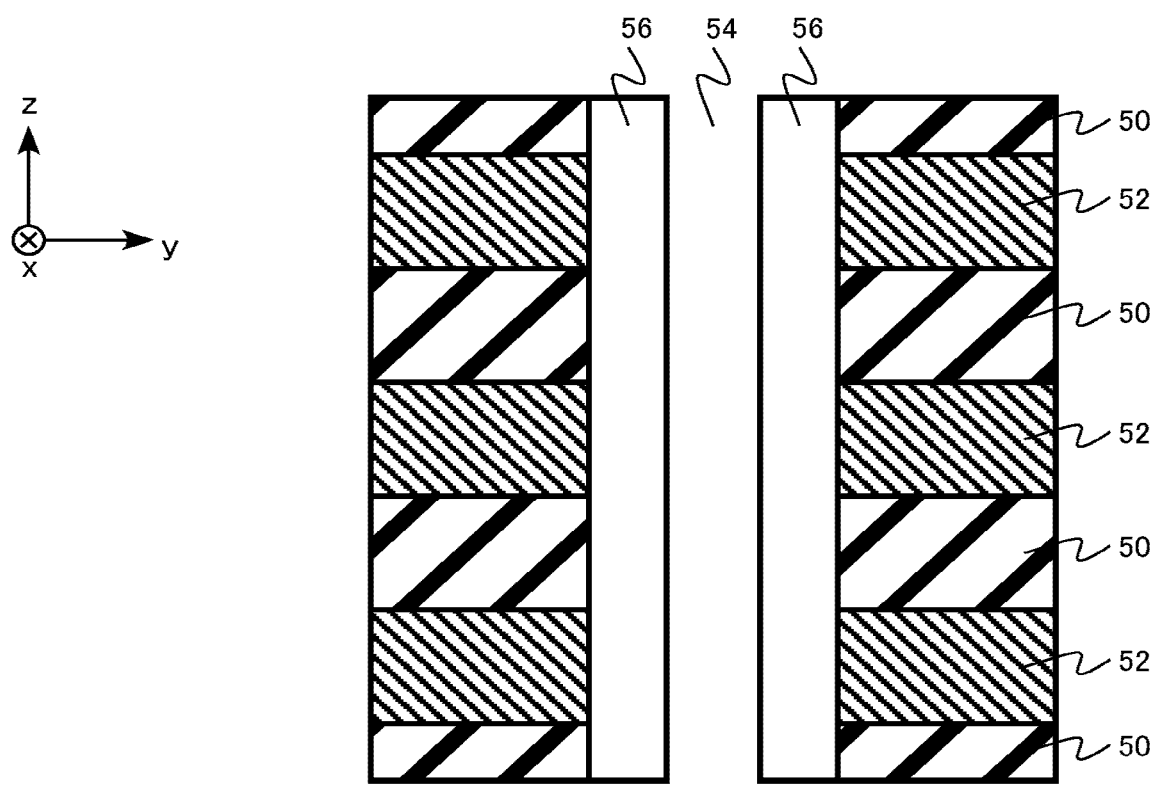
FIG. 6 is a schematic cross-sectional view illustrating the method of manufacturing the storage device according to the first embodiment.

Next, a hafnium oxide film 56 is formed on the inner surface of the opening 54 (FIG. 6). The hafnium oxide film 56 is formed by, for example, an atomic layer deposition method (ALD method). The hafnium oxide film 56 finally becomes the gate insulating film 16.

Figure 7:
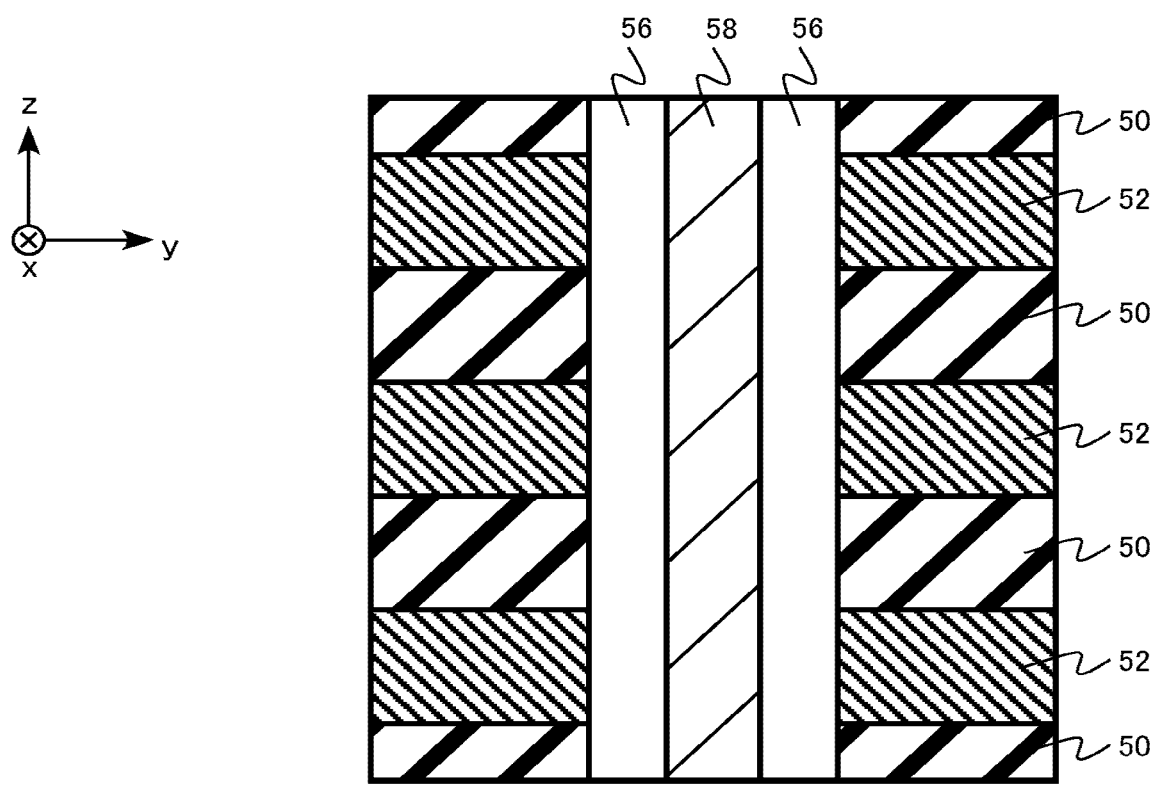
FIG. 7 is a schematic cross-sectional view illustrating the method of manufacturing the storage device according to the first embodiment.

Next, an amorphous silicon film 58 is formed in the opening 54, and the opening 54 is buried (FIG. 7). The amorphous silicon film 58 finally becomes the semiconductor layer 10.

Figure 8:
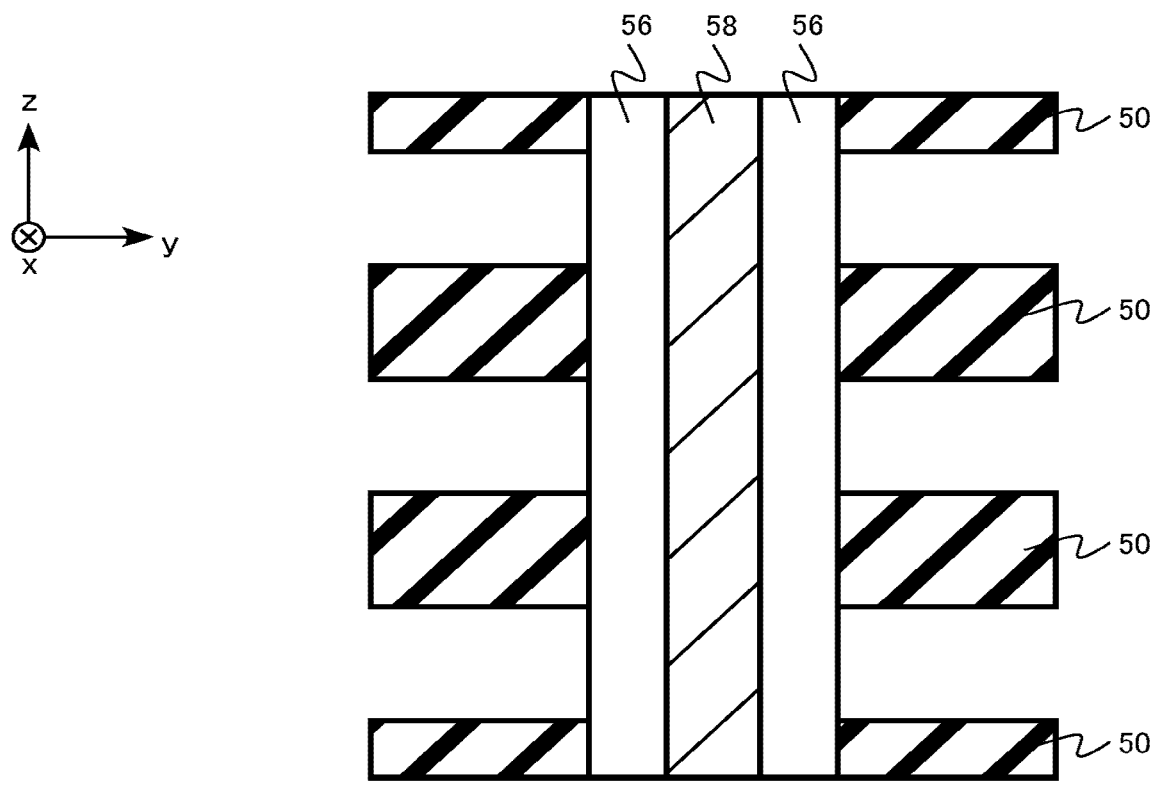
FIG. 8 is a schematic cross-sectional view illustrating the method of manufacturing the storage device according to the first embodiment.

Next, the silicon nitride layer 52 is selectively removed by wet etching using an etching groove (not illustrated) (FIG. 8). For the wet etching, for example, a phosphoric acid solution is used to selectively etch the silicon nitride layer 52 with respect to the silicon oxide layer 50.

Figure 9:
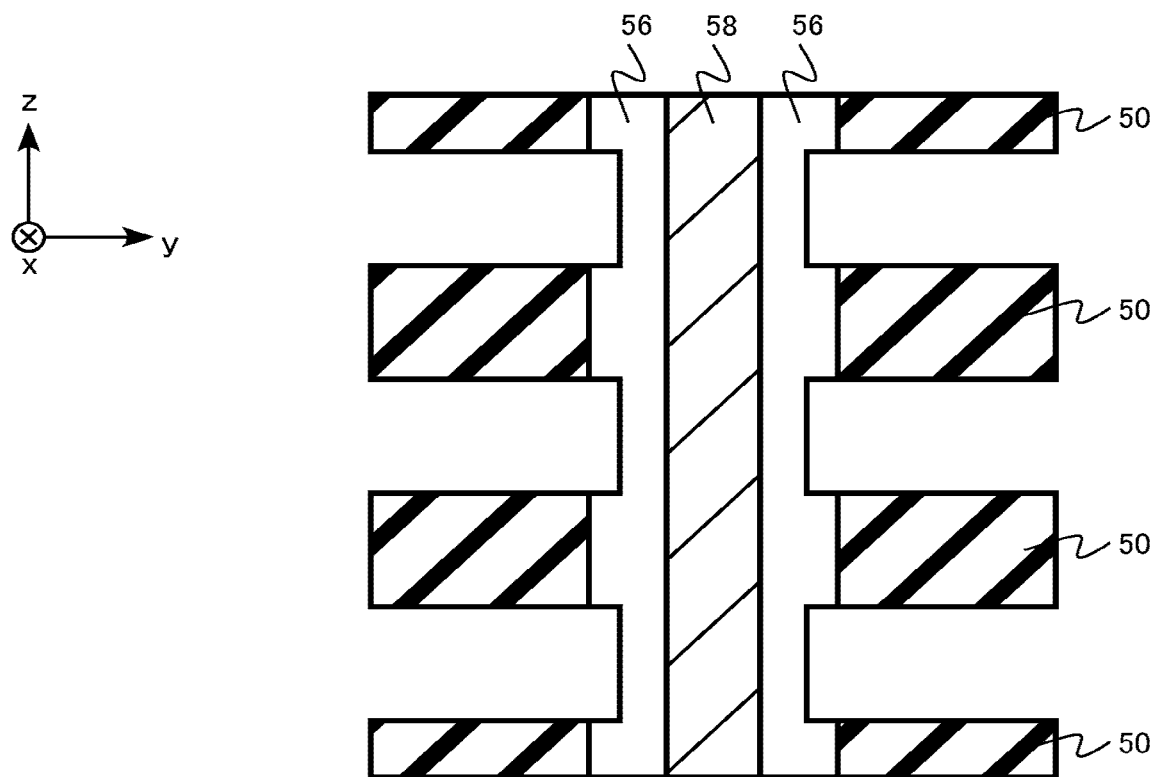
FIG. 9 is a schematic cross-sectional view illustrating the method of manufacturing the storage device according to the first embodiment.

Next, a portion of the hafnium oxide film 56 is removed by wet etching using a groove for etching (not illustrated) (FIG. 9). For example, a portion of the hafnium oxide film 56 is selectively etched with respect to the silicon oxide layer 50. In the wet etching, for example, a phosphoric acid solution containing a silicon fluoride is used to selectively etch the hafnium oxide film 56 with respect to the silicon oxide layer 50.

Figure 10:
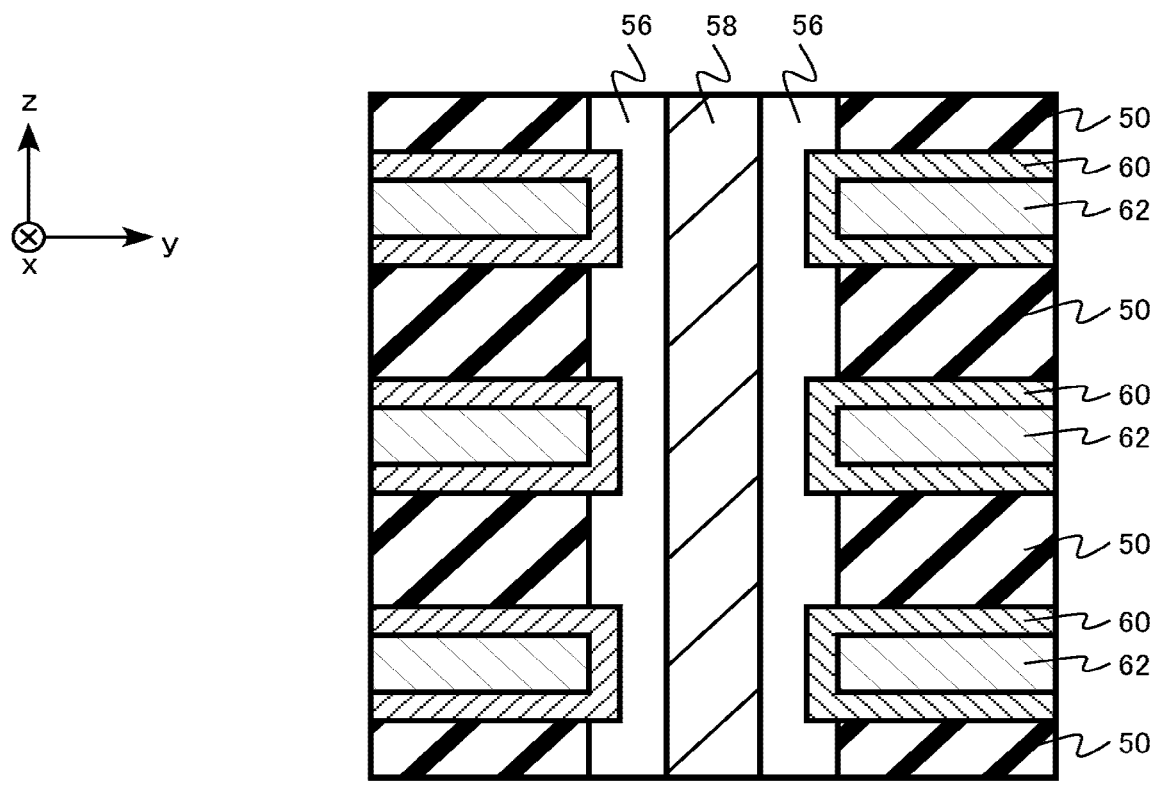
FIG. 10 is a schematic cross-sectional view illustrating the method of manufacturing the storage device according to the first embodiment.

Next, a titanium nitride film 60 and a tungsten film 62 are formed (FIG. 10). The titanium nitride film 60 and the tungsten film 62 are formed by, for example, a CVD method. The titanium nitride film 60 and the tungsten film 62 are examples of the barrier metal layer 11 and the main metal layer 12, respectively.

Figure 11:
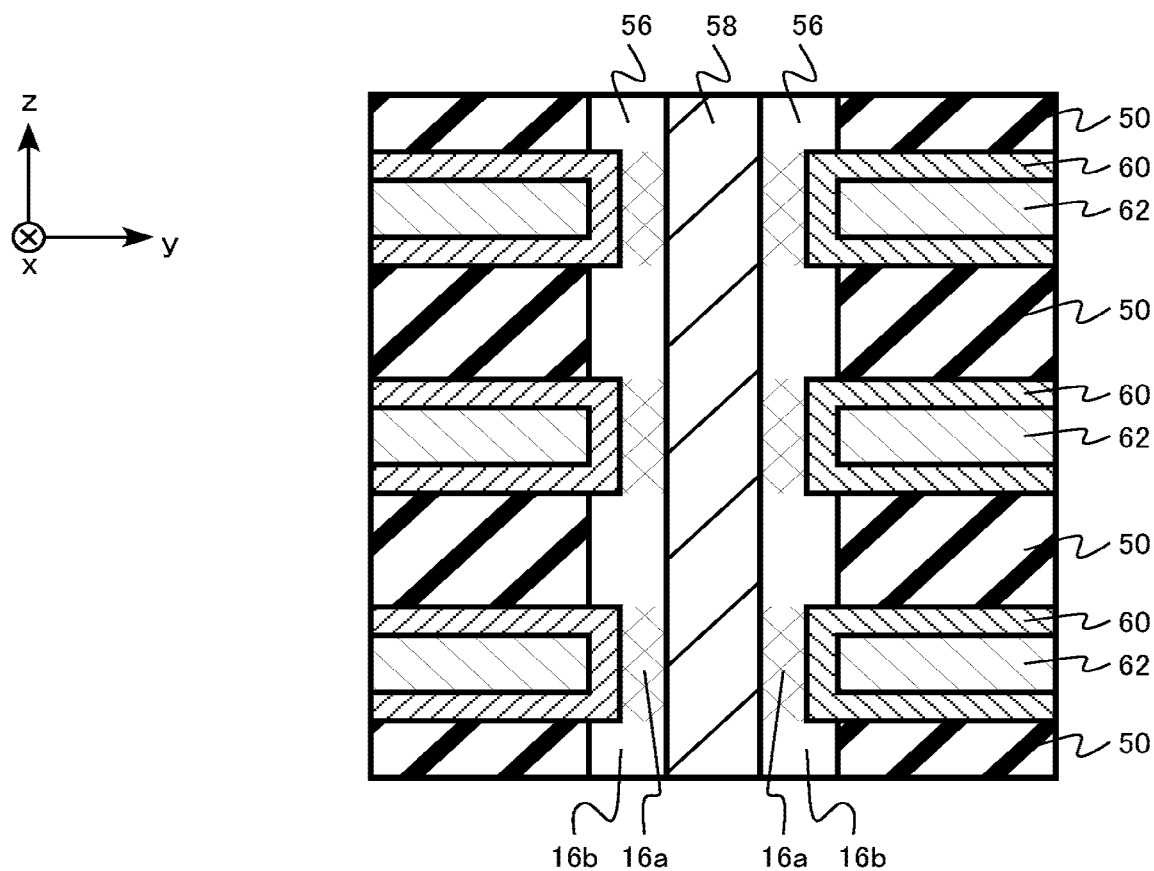
FIG. 11 is a schematic cross-sectional view illustrating the method of manufacturing the storage device according to the first embodiment.

Next, crystallization annealing is performed (FIG. 11). By the crystallization annealing, a region of the hafnium oxide film 56 between the amorphous silicon film 58 and the titanium nitride film 60 becomes a ferroelectric material. This region becomes the ferroelectric region 16a. On the other hand, a region of the hafnium oxide film 56 between the amorphous silicon film 58 and the silicon oxide layer 50 becomes a paraelectric material. This region becomes the paraelectric region 16b. In addition, the amorphous silicon film 58 is crystallized into polycrystalline silicon.

With the above-described manufacturing method, the memory cell array 100 of the storage device according to the first embodiment is manufactured.

Next, the functions and the effects of the storage device according to the first embodiment will be described.

Figure 12A:
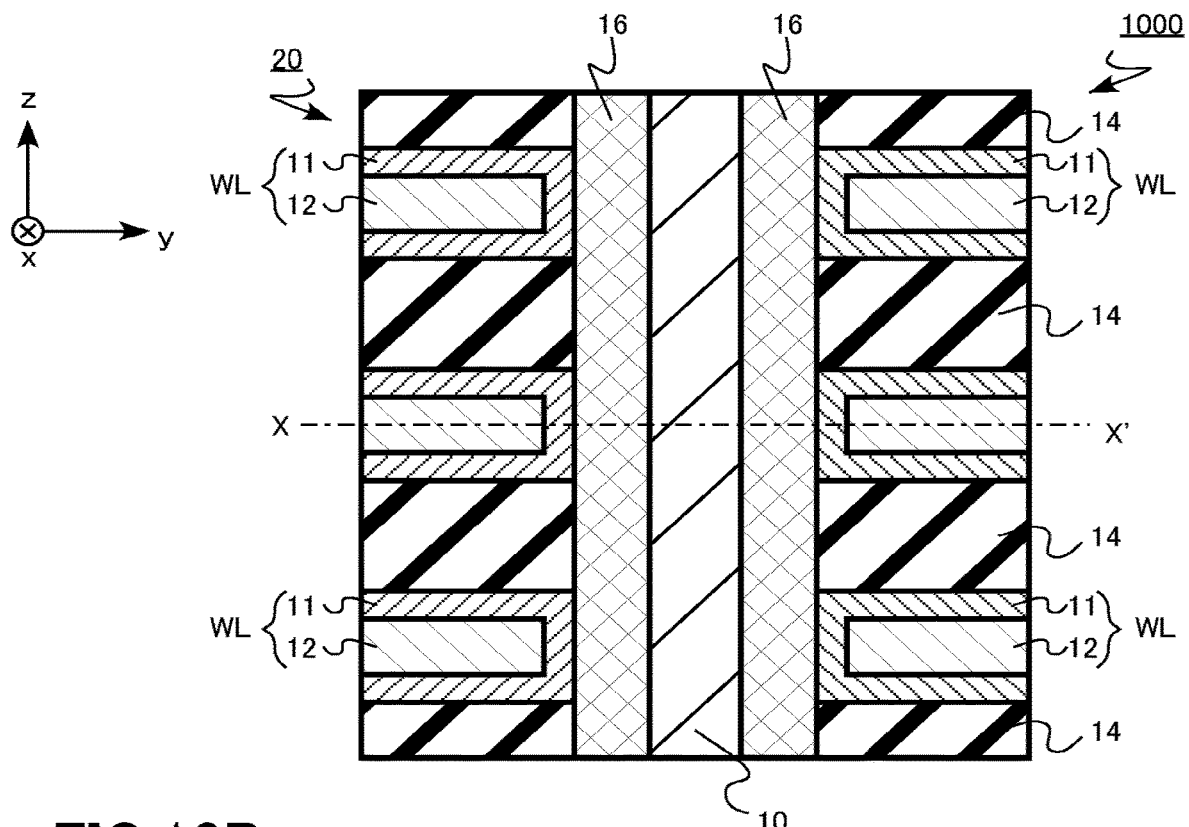
FIGS. 12A and 12B are schematic cross-sectional views of a portion of a memory cell array of a storage device according to Comparative Example.
Figure 12B:
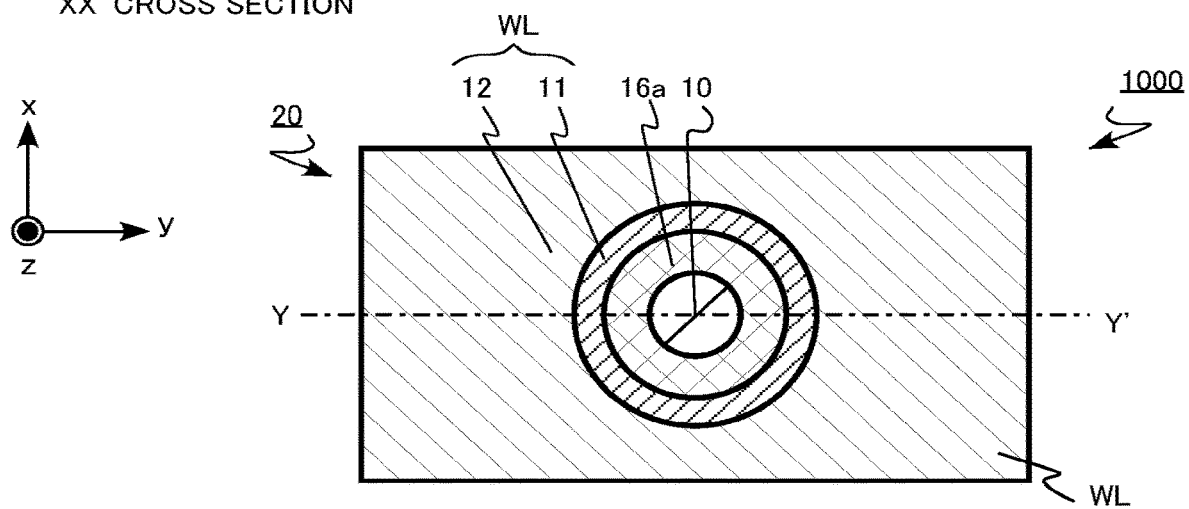

FIGS. 12A and 12B are schematic cross-sectional views of a portion of a memory cell array of a storage device according to Comparative Example. FIGS. 12A and 12B illustrate cross sections corresponding to FIGS. 2A and 2B.

The memory cell array 1000 of the storage device according to Comparative Example is different from the memory cell array 100 according to the first embodiment in that the thickness of the gate insulating film 16 in the y direction is uniform and the entire region of the gate insulating film 16 is made of a ferroelectric material.

For example, when the memory cell array 1000 according to Comparative Example is scaled down, there is a concern in that memory characteristics may be degraded due to inter-cell interference between adjacent memory cells. For example, when the interval between the word lines WL is reduced due to the scaling-down, the polarization states of the gate insulating films 16 under the adjacent word lines WL may be changed due to the voltages applied to the word line WL, and there is a concern in that erroneous writing may occur.

In addition, for example, in the memory cell array 1000 according to Comparative Example, the polarization states of the gate insulating films 16 on both sides of the word line WL are also partially changed due to the fringe component of the electric field extending from the word line WL. When the memory cell array 1000 is scaled down, the channel length of the memory cell transistor MT becomes shortened. For this reason, the polarization states of the gate insulating films 16 on both sides of the word line WL greatly affect the threshold voltage of the memory cell transistor MT. Therefore, there is a concern in that a variation in threshold voltage of the memory cell transistor MT may cause.

The memory cell array 100 of the storage device according to the first embodiment has a structure in which the ferroelectric regions 16a under the two word lines WL are physically separated by the paraelectric region 16b. The paraelectric material has a lower dielectric constant than ferroelectric material. Therefore, degradation of memory characteristics due to inter-cell interference is suppressed.

In addition, in the memory cell array 100, the gate insulating films 16 on both sides of the word line WL become paraelectric regions 16b. For this reason, the polarization states of the gate insulating films 16 on both sides of the word line WL are not changed due to the fringe component of the electric field extending from the word line WL.

Therefore, a variation in threshold voltage of the memory cell transistor MT is suppressed.

In addition, in the memory cell array 100, the gate insulating film 16 between the semiconductor layer 10 and the word line WL is thinner than the gate insulating film 16 between the semiconductor layer 10 and the interlayer insulating layer 14. Therefore, in the crystallization annealing at the time of the manufacture of the memory cell array 100, the gate insulating film 16 between the semiconductor layer 10 and the word line WL is likely to be made of a ferroelectric material.

From the viewpoint of facilitating the use of a ferroelectric material for the gate insulating film 16 between the semiconductor layer 10 and the word line WL, the word line WL preferably contains a titanium nitride. In addition, the titanium nitride is preferably in contact with the gate insulating film 16.

From the viewpoint of facilitating the use of a ferroelectric material for the gate insulating film 16 between the semiconductor layer 10 and the word line WL, the second thickness t2 of the paraelectric region 16b is preferably 1.2 times or more the first thickness t1 of the ferroelectric region 16a.

From the viewpoint of facilitating the use of a ferroelectric material for the gate insulating film 16 between the semiconductor layer 10 and the word line WL, the first thickness t1 of the ferroelectric region 16a is preferably 10 nm or less.

As described above, according to the first embodiment, the ferroelectric material under the word line WL and the ferroelectric material under the adjacent word line WL are physically separated. Therefore, it is possible to realize a storage device in which degradation of memory characteristics due to inter-cell interference and a variation in threshold voltage is suppressed.

Second Embodiment

A storage device according to a second embodiment is different from the storage device according to the first embodiment in that the first region contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba), and the second region contains or does not contain the at least one element, and the first concentration of at least one element in the first region is higher than the second concentration of at least one element in the second region. In addition, the storage device according to the second embodiment is different from the storage device according to the first embodiment in that an intermediate layer containing at least one element is included between the first gate electrode layer and an insulating layer. Hereinafter, description of contents overlapping with those of the first embodiment will be omitted.

Figure 13A:
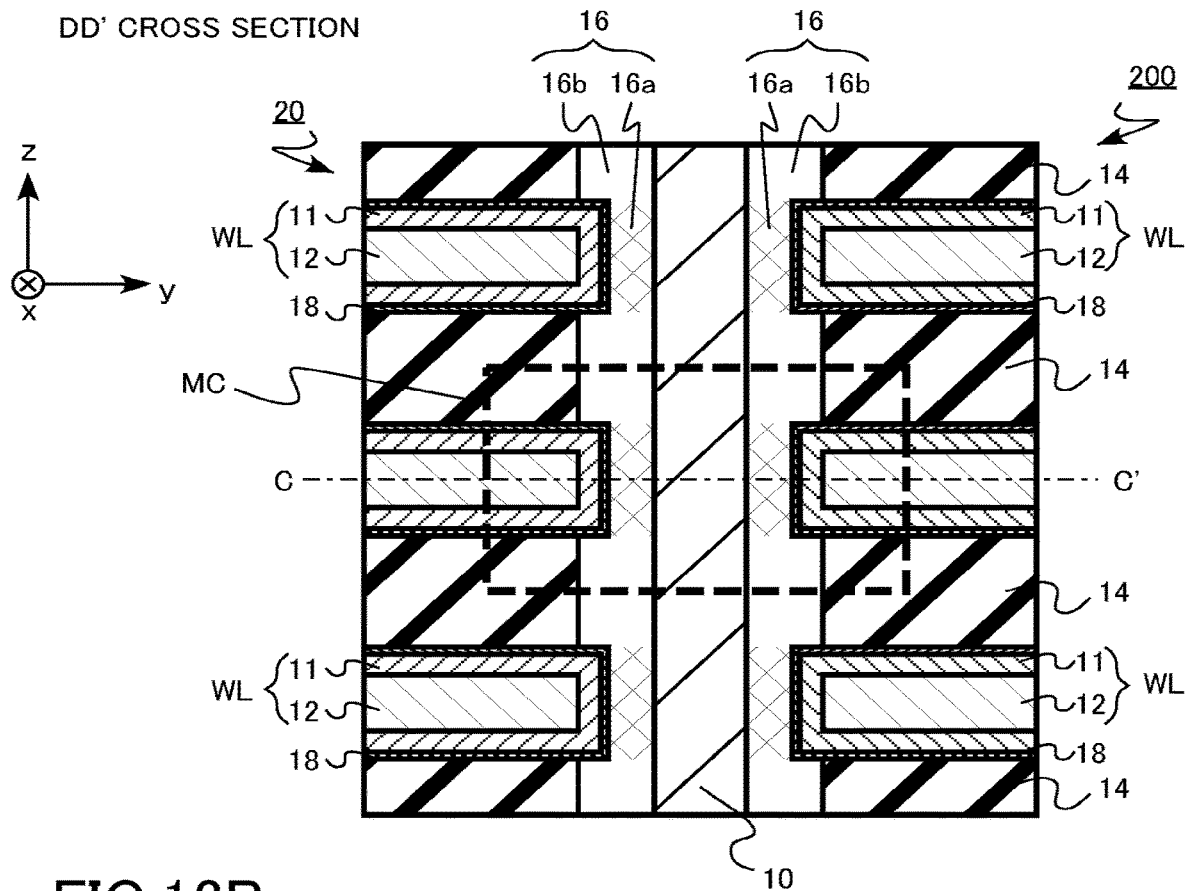
FIGS. 13A and 13B are schematic cross-sectional views of a portion of a memory cell array of a storage device according to a second embodiment.
Figure 13B:
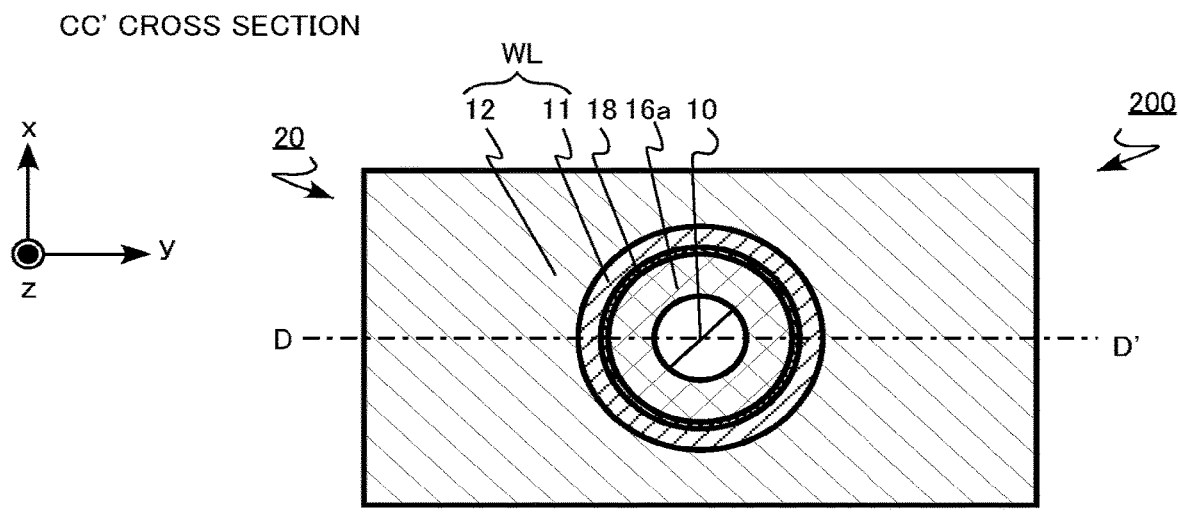

FIGS. 13A and 13B are schematic cross-sectional views of a portion of the memory cell array of the storage device according to the second embodiment. FIGS. 13A and 13B are cross-sectional views corresponding to FIGS. 2A and 2B of the first embodiment.

FIG. 13A is a yz cross-sectional view of the memory cell array 200. FIG. 13A is a DD' cross section of FIG. 13B. FIG. 13B is an xy cross-sectional view of the memory cell array 200. FIG. 13B is a CC' cross section of FIG. 13A. In FIG. 13A, a region surrounded by a broken line is one memory cell MC.

Figure 14:
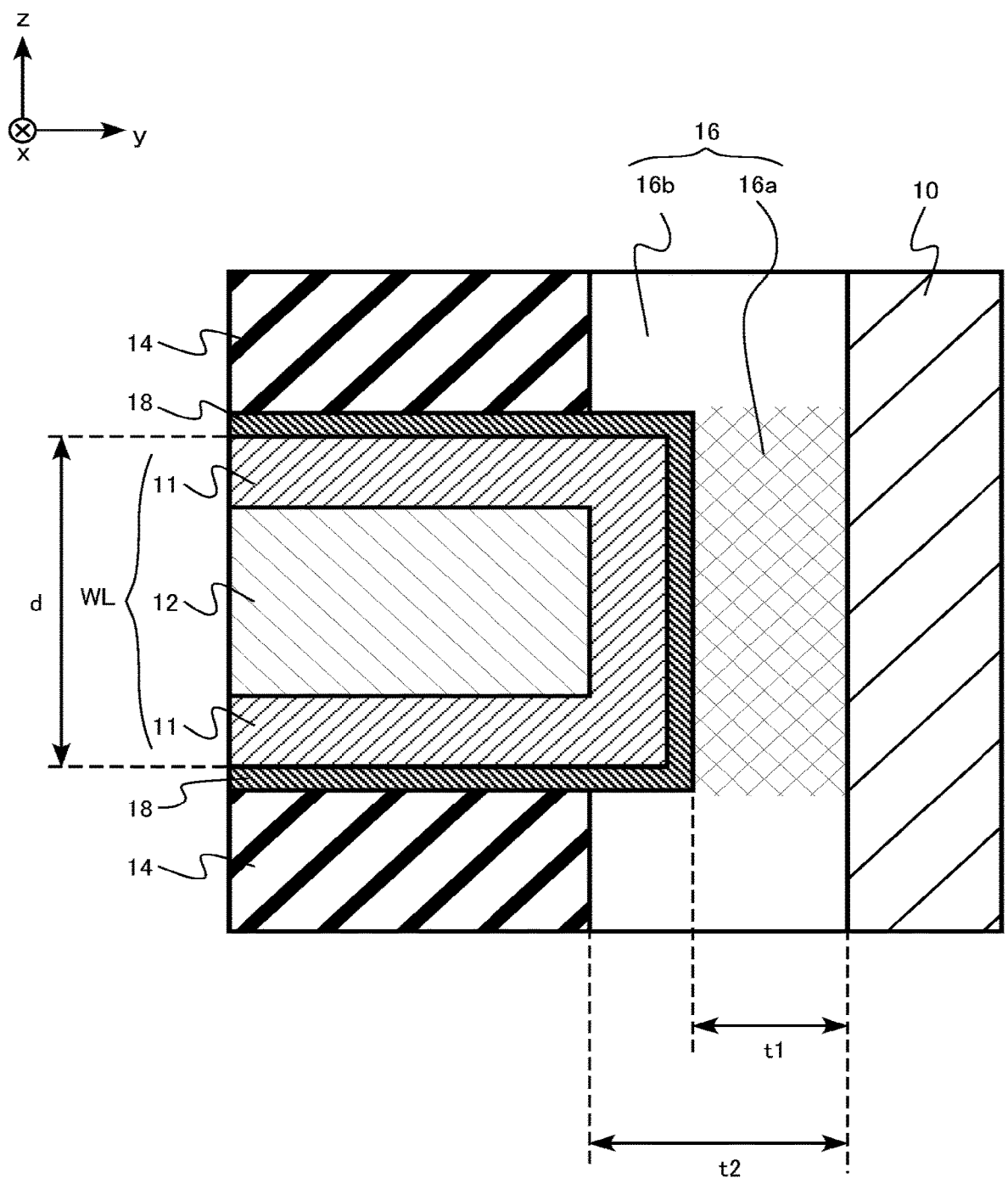
FIG. 14 is a schematic cross-sectional view of a memory cell of the storage device according to the second embodiment.
Figure 15:
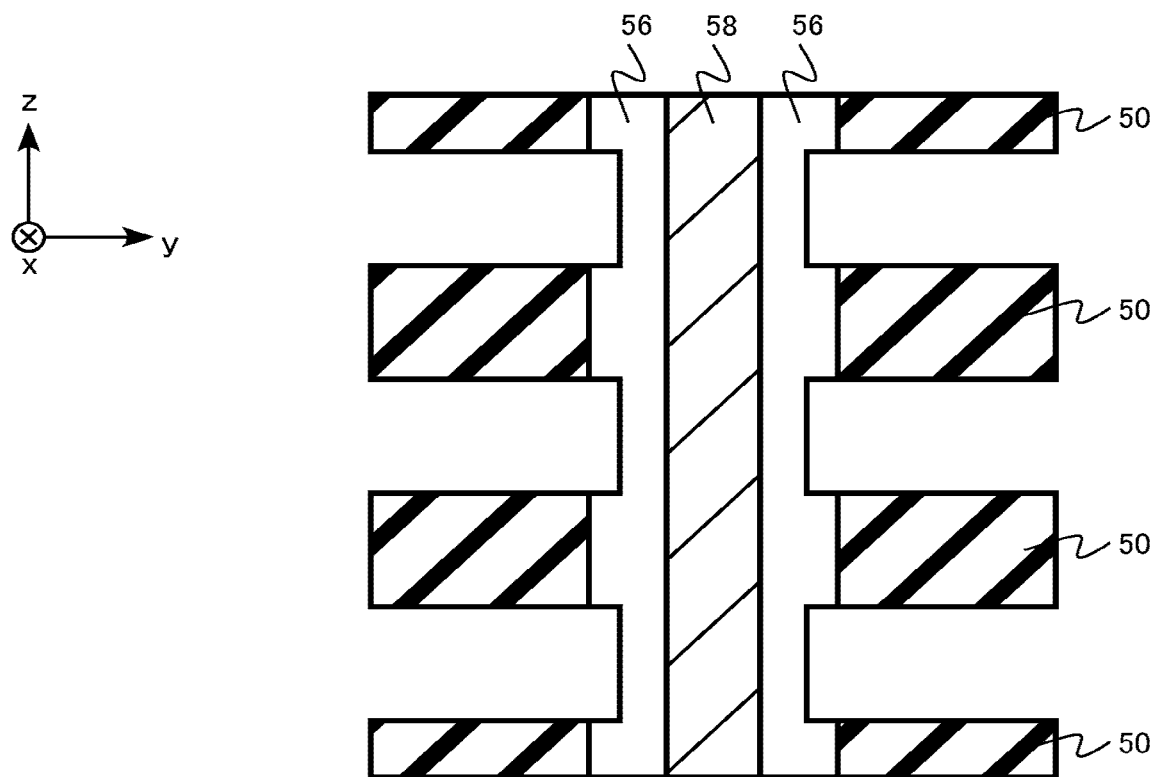
FIG. 15 is a schematic cross-sectional view illustrating a method of manufacturing the storage device according to the second embodiment.

FIG. 14 is a schematic cross-sectional view of the memory cell of the storage device according to the second embodiment. FIG. 14 is an enlarged cross-sectional view of a portion of the memory cell MC. FIG. 14 is a yz cross-sectional view of the memory cell MC.

As illustrated in FIGS. 13A, 13B, and 14, the memory cell array 200 is configured to include: a plurality of word lines WL (gate electrode layers); a semiconductor layer 10; a plurality of interlayer insulating layers 14 (insulating layers); a gate insulating film 16; and an intermediate layer 18. The plurality of word lines WL and the plurality of interlayer insulating layers 14 constitute a stacked body 20.

The word line WL has a barrier metal layer 11 and a main metal layer 12. The gate insulating film 16 has a ferroelectric region 16a (first region, third region) and a paraelectric region 16b (second region).

The ferroelectric region 16a contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The paraelectric region 16b contains or does not contain the additive element.

The chemical composition of the ferroelectric region 16a is different from the chemical composition of the paraelectric region 16b.

The containing of the above-mentioned additive element allows the hafnium oxide to easily exhibit ferroelectricity.

From the viewpoint of exhibiting ferroelectricity in the hafnium oxide, the concentration of the additive element is preferably 0.1 atomic % or more and 60% or less. A suitable range of the concentration of the above-mentioned additive element for allowing the hafnium oxide to exhibit ferroelectricity differs depending on the type of the additive element. For example, in a case where the additive element is silicon (Si), a suitable range of the concentration of the additive element for exhibiting ferroelectricity is 3 atomic % or more and 7 atomic % or less. For example, in a case where the additive element is barium (Ba), a suitable range of the concentration of the additive element for exhibiting ferroelectricity is 0.1 atomic % or more and 3 atomic % or less. For example, in a case where the additive element is zirconium (Zr), a suitable range of the concentration of the additive element for exhibiting ferroelectricity is 10 atomic % or more and 60 atomic % or less.

The concentration (first concentration) of the additive element in the ferroelectric region 16a is different from, for example, the concentration (second concentration) of the additive element in the paraelectric region 16b. The concentration (first concentration) of the additive element in the ferroelectric region 16a is higher than, for example, the concentration (second concentration) of the additive element in the paraelectric region 16b. In a case where the paraelectric region 16b does not contain the additive element, the concentration of the additive element in the paraelectric region 16b is zero.

The first concentration of the additive element in the ferroelectric region 16a is, for example, 10 times or more the second concentration of the additive element in the paraelectric region 16b.

The intermediate layer 18 is provided between the word line WL and the interlayer insulating layer 14. The intermediate layer 18 is provided between the word line WL and the ferroelectric region 16a. The intermediate layer 18 contains the above-mentioned additive element. The intermediate layer 18 becomes a supply source of the additive element to the ferroelectric region 16a at the time of manufacturing the memory cell array 200.

The concentration (third concentration) of the additive element in the intermediate layer 18 is higher than the concentration (fourth concentration) of the additive element in the interlayer insulating layer 14.

The intermediate layer 18 is made of, for example, a metal, a semiconductor, a metal semiconductor compound, a metal nitride, a metal carbide, an oxide insulator, or a nitride insulator. The intermediate layer 18 is made of, for example, aluminum (Al) or silicon (Si).

The thickness of the intermediate layer 18 in the z direction (first direction) is smaller than, for example, the thickness of the barrier metal layer 11 in the z direction. The thickness of the intermediate layer 18 in the z direction (first direction) is, for example, 1 nm or more and 3 nm or less.

Next, an example of a method of manufacturing the storage device according to the second embodiment will be described. FIGS. 15, 16, 17, and 18 are schematic cross-sectional views illustrating the method of manufacturing the storage device according to the second embodiment. FIGS. 15, 16, 17, and 18 illustrate the respective cross sections corresponding to FIG. 13A. FIGS. 15, 16, 17, and 18 illustrate an example of the method of manufacturing the memory cell array 200 of the storage device.

The processes up to the process of selectively removing a portion of the hafnium oxide film 56 using a groove for etching (not illustrated) (FIG. 15) are similar to those of the method of manufacturing the storage device according to the first embodiment.

Figure 16:
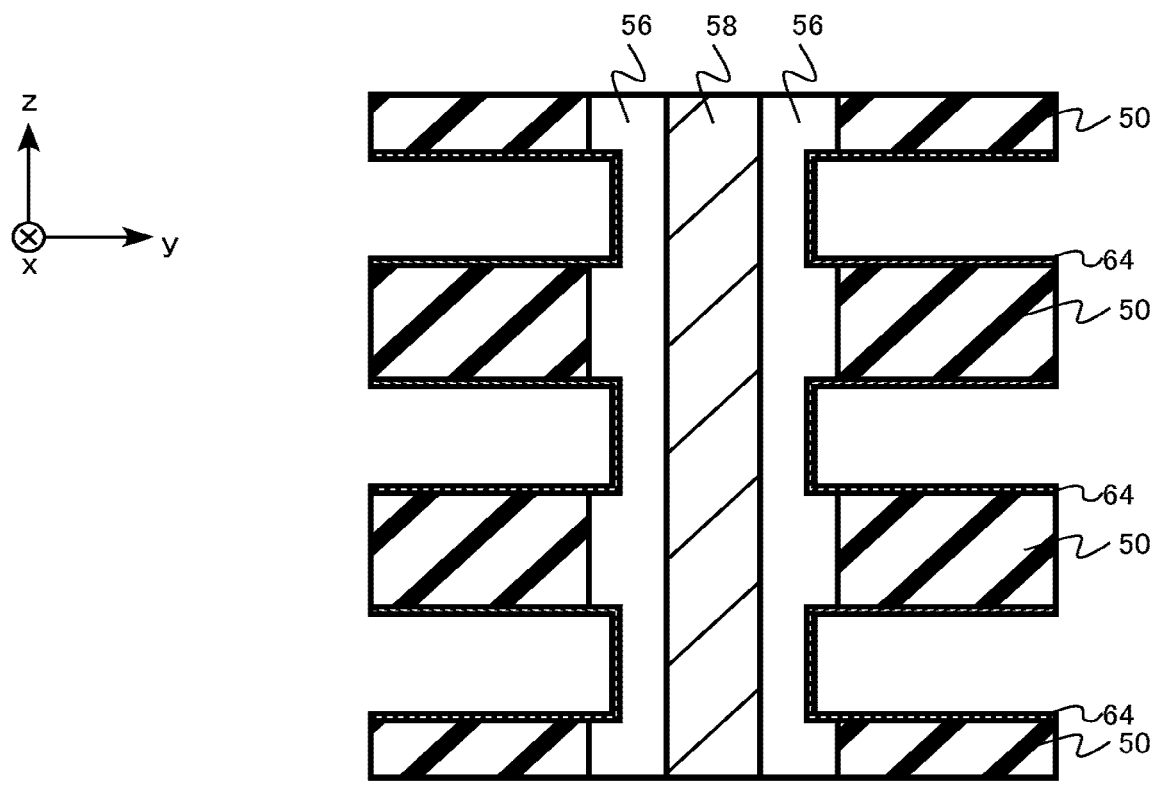
FIG. 16 is a schematic cross-sectional view illustrating the method of manufacturing the storage device according to the second embodiment.

Next, an aluminum film 64 is formed (FIG. 16). The aluminum film 64 is formed by, for example, a CVD method. The aluminum film 64 is an example of the intermediate layer 18.

Figure 17:
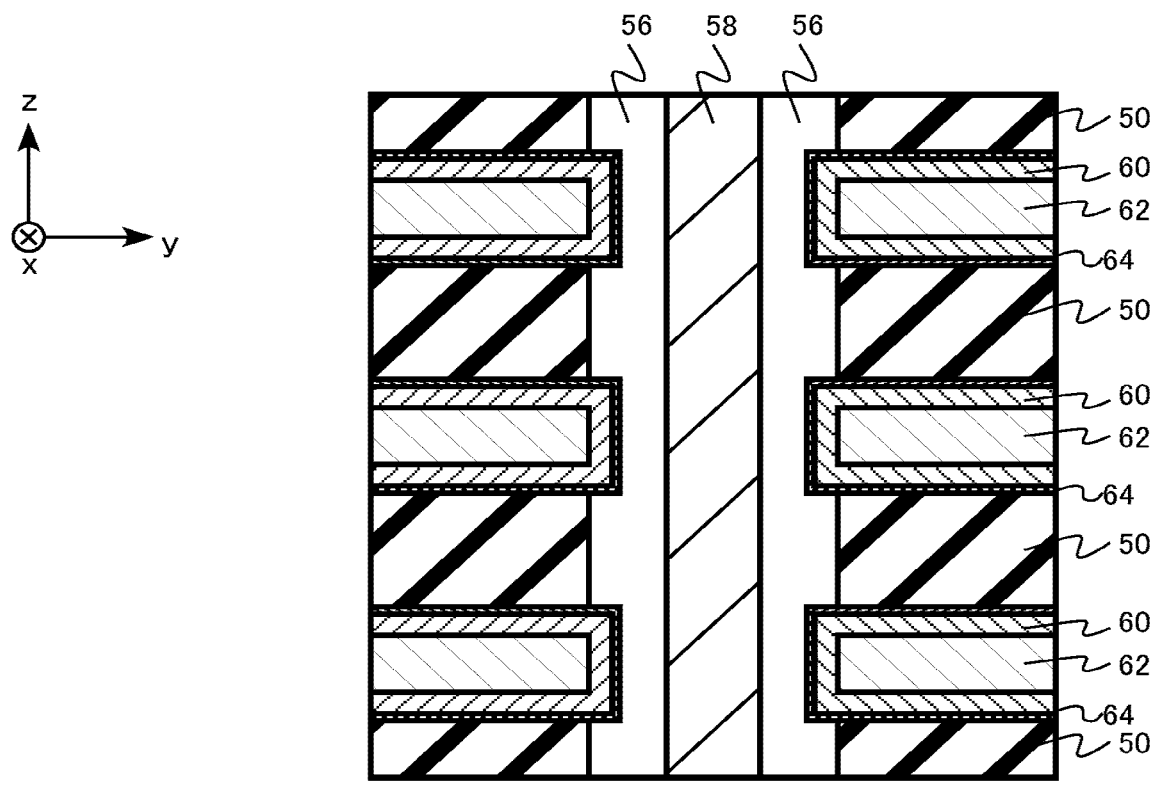
FIG. 17 is a schematic cross-sectional view illustrating the method of manufacturing the storage device according to the second embodiment.

Next, a titanium nitride film 60 and a tungsten film 62 are formed (FIG. 17). The titanium nitride film 60 and the tungsten film 62 are formed by, for example, a CVD method. The titanium nitride film 60 and the tungsten film 62 are examples of the barrier metal layer 11 and the main metal layer 12, respectively.

Figure 18:
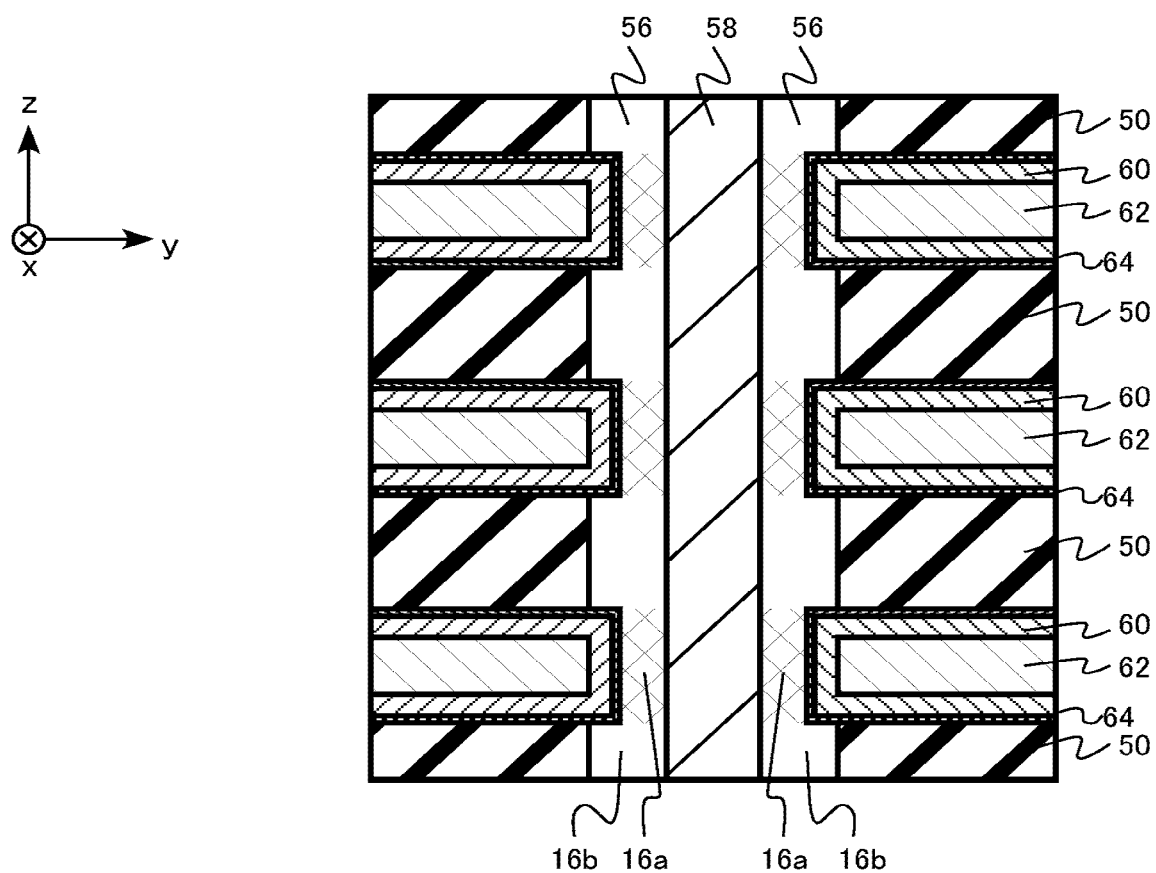
FIG. 18 is a schematic cross-sectional view illustrating the method of manufacturing the storage device according to the second embodiment.

Next, the crystallization annealing is performed (FIG. 18). By the crystallization annealing, a region of the hafnium oxide film 56 between the amorphous silicon film 58 and the titanium nitride film 60 becomes a ferroelectric material. This region becomes the ferroelectric region 16a. On the other hand, a region of the hafnium oxide film 56 between the amorphous silicon film 58 and the silicon oxide layer 50 becomes a paraelectric material. This region becomes the paraelectric region 16b. In addition, the amorphous silicon film 58 is crystallized into polycrystalline.

In the crystallization annealing, aluminum diffuses from the aluminum film 64 into the hafnium oxide film 56 to facilitate the formation of the ferroelectric region 16a.

With the above-described manufacturing method, the memory cell array 200 of the storage device according to the second embodiment is manufactured.

In the memory cell array 200 of the storage device according to the second embodiment, the concentration (first concentration) of the additive element in the ferroelectric region 16a is higher than the concentration (second concentration) of the additive element in the paraelectric region 16b. The concentration of the additive element is high, and thus, the ferroelectricity of the ferroelectric region 16a is improved.

From the viewpoint of improving the ferroelectricity of the ferroelectric region 16a, the concentration (first concentration) of the additive element in the ferroelectric region 16a is, for example, preferably 10 times or more the concentration (second concentration) of the additive element in the paraelectric region 16b, and more preferably 100 times or more.

In addition, since the memory cell array 200 is configured with the intermediate layer 18 containing the above-mentioned additive element, the improvement of the ferroelectricity of the ferroelectric region 16a is facilitated. From the viewpoint of facilitating the manufacturing, the intermediate layer 18 is made of, preferably, aluminum or silicon.

As described above, according to the second embodiment, similarly to the first embodiment, the ferroelectric material under the word line WL and the ferroelectric material under the adjacent word line WL are physically separated. Therefore, it is possible to realize a storage device in which degradation of memory characteristics due to inter-cell interference and a variation in threshold voltage is suppressed. In addition, it is possible to further improve the ferroelectricity of the ferroelectric region.

Third Embodiment

A storage device according to a third embodiment is different from the storage device according to the second embodiment in that the first thickness of the first region in the second direction from the first gate electrode layer toward the semiconductor layer is equal to the second thickness of the second region in the second direction. Hereinafter, a portion of description of contents overlapping with those of the first and second embodiments will be omitted.

Figure 19A:
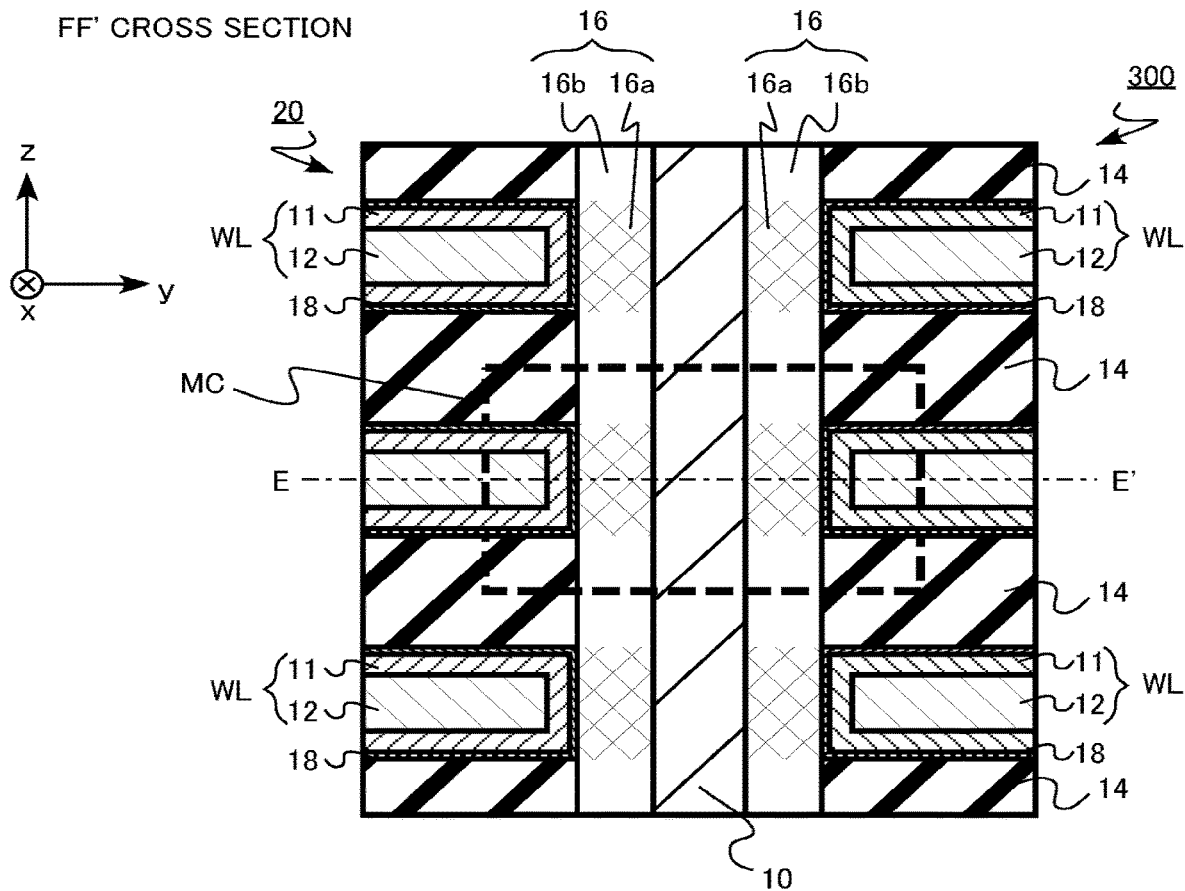
FIGS. 19A and 19B are schematic cross-sectional views of a portion of a memory cell array of a storage device according to a third embodiment.
Figure 19B:
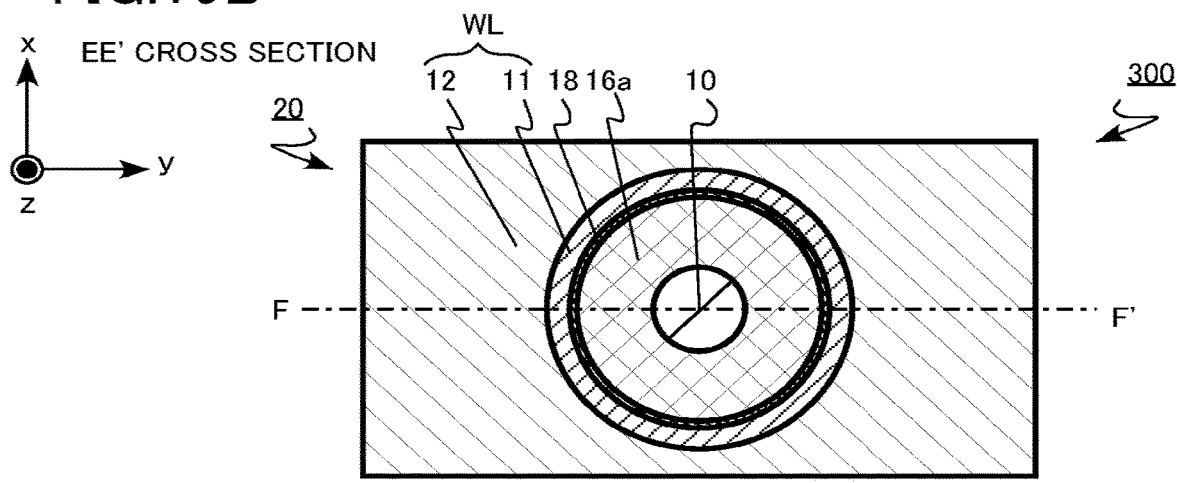

FIGS. 19A and 19B are schematic cross-sectional views of a portion of the memory cell array of the storage device according to the third embodiment. FIGS. 19A and 19B are cross-sectional views corresponding to FIGS. 2A and 2B of the first embodiment.

FIG. 19A is a yz cross-sectional view of the memory cell array 300. FIG. 19A is an FF' cross section of FIG. 19B. FIG. 19B is an xy cross-sectional view of the memory cell array 300. FIG. 19B is an EE' cross section of FIG. 19A. In FIG. 19A, a region surrounded by a broken line is one memory cell MC.

Figure 20:
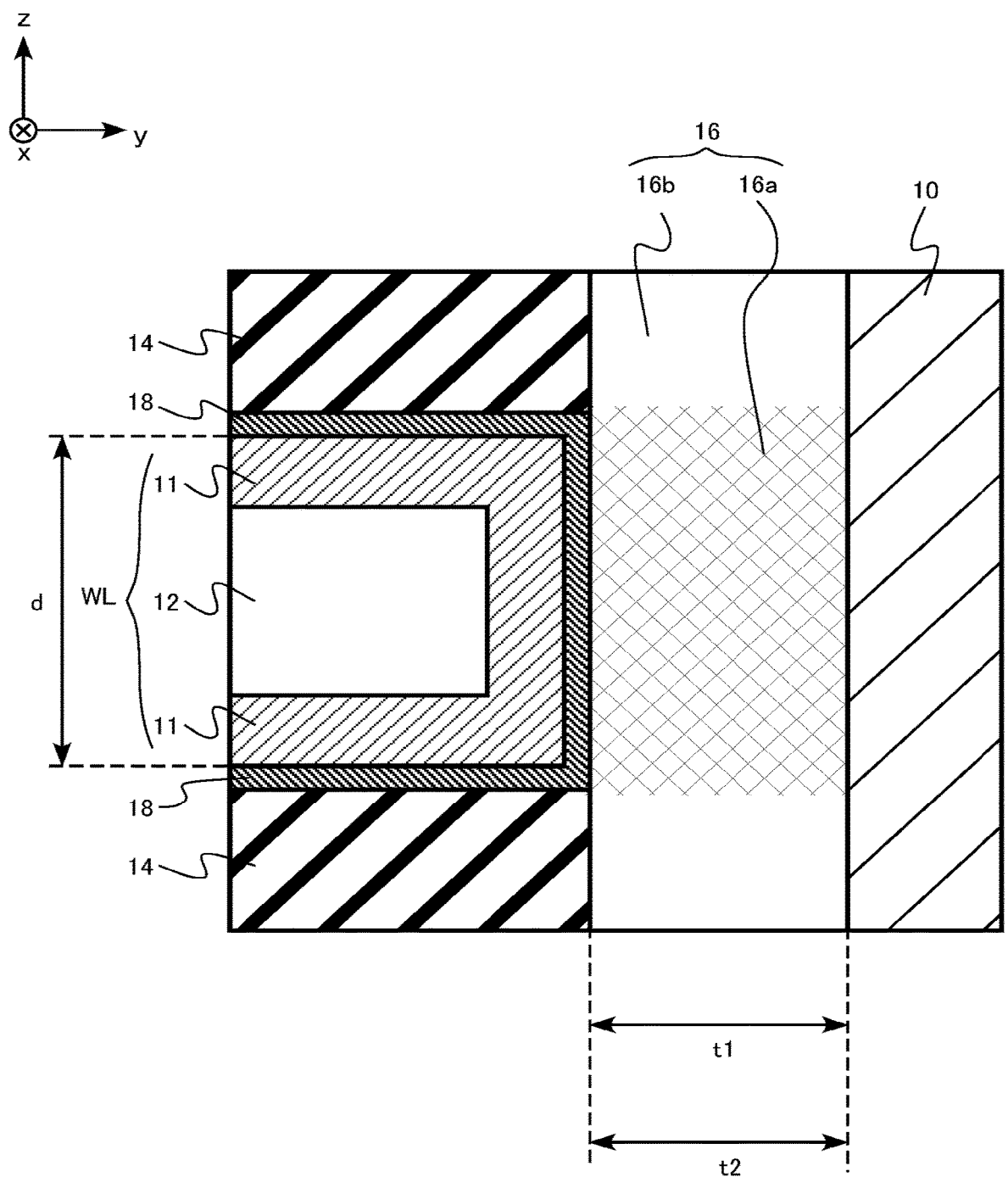
FIG. 20 is a schematic cross-sectional view of a memory cell of the storage device according to the third embodiment.

FIG. 20 is a schematic cross-sectional view of a memory cell of the storage device according to the third embodiment. FIG. 20 is an enlarged cross-sectional view of a portion of the memory cell. FIG. 20 is a yz cross-sectional view of the memory cell.

As illustrated in FIGS. 19A, 19B, and 20, the memory cell array 300 is configured to include: a plurality of word lines WL (gate electrode layers); a semiconductor layer 10; a plurality of interlayer insulating layers 14 (insulating layers); a gate insulating film 16; and an intermediate layer 18. The plurality of word lines WL and the plurality of interlayer insulating layers 14 constitute a stacked body 20.

The word line WL has a barrier metal layer 11 and a main metal layer 12. The gate insulating film 16 has a ferroelectric region 16a (first region, third region) and a paraelectric region 16b (second region).

The first thickness (t1 in FIG. 20) of the ferroelectric region 16a in the y direction (second direction) from the semiconductor layer 10 toward the word line WL is equal to the second thickness (t2 in FIG. 20) of the paraelectric region 16b in the y direction.

The ferroelectric region 16a contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The paraelectric region 16b contains or does not contain the additive element.

The chemical composition of the ferroelectric region 16a is different from the chemical composition of the paraelectric region 16b.

The containing of the above-mentioned additive element allows the hafnium oxide to easily exhibit ferroelectricity.

The memory cell array 300 of the storage device according to the third embodiment can be manufactured by omitting the process of removing a portion of the hafnium oxide film 56 in the method of manufacturing the memory cell array 200 of the storage device according to the second embodiment.

In the memory cell array 300 of the storage device according to the third embodiment, the ferroelectric region 16a is allowed to selectively exhibit ferroelectricity by using an additive element.

As described above, according to the third embodiment, similarly to the first embodiment, the ferroelectric material under the word line WL and the ferroelectric material under the adjacent word line WL are physically separated. Therefore, it is possible to realize a storage device in which degradation of memory characteristics due to inter-cell interference and a variation in threshold voltage is suppressed.

Fourth Embodiment

A storage device according to a fourth embodiment is configured to include: a first conductive layer extending in a first direction; a second conductive layer extending in the first direction; a third conductive layer extending in a second direction intersecting the first direction; a first insulating film including a first region, a second region, and a third region, the second region interposed between the first region and the third region, the first region interposed between the first conductive layer and the third conductive layer, the third region interposed between the second conductive layer and the third conductive layer, and the gate insulating film containing a hafnium oxide; and a second insulating film provided between the first insulating film and the third conductive layer and made of a material different from that of the first insulating film, in which a first thickness of the first region in a third direction from the first conductive layer toward the third conductive layer is smaller than a second thickness of the second region in the third direction. The storage device according to the fourth embodiment is different from the storage device according to the first embodiment in that the storage device is a two-terminal type memory.

Figure 21:
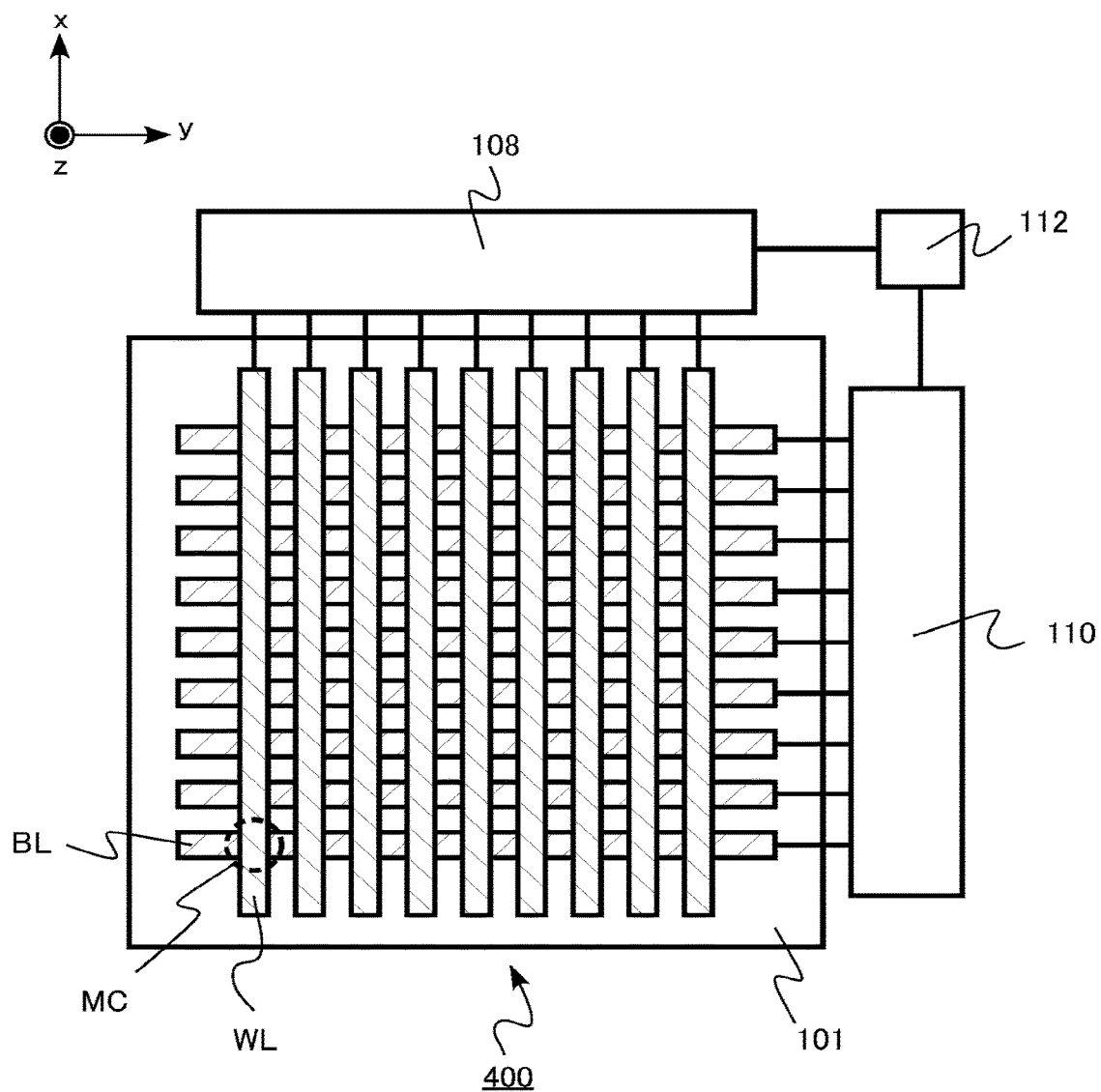
FIG. 21 is a block diagram of a storage device according to a fourth embodiment.

FIG. 21 is a block diagram of a storage device according to the fourth embodiment. The storage device according to the fourth embodiment is an FTJ memory.

The FTJ memory is configured to include: a memory cell array 400; a semiconductor substrate 101; a plurality of word lines WL; a plurality of bit lines BL; a first control circuit 108; a second control circuit 110; and a sense circuit 112. In the memory cell array 400 in FIG. 21, a region indicated by a dotted circle is one memory cell MC.

In the memory cell array 400, for example, a plurality of bit lines BL and a plurality of word lines WL intersecting the bit lines BL are provided on the semiconductor substrate 101 through an insulating layer. The word line WL is provided in a lower layer of the bit line BL. In addition, the first control circuit 108, the second control circuit 110, and the sense circuit 112 are provided as peripheral circuits around the memory cell array 100.

A plurality of memory cells MC are provided in the region where the bit lines BL and the word lines WL intersect. The storage device according to the fourth embodiment is an FTJ memory having a cross-point structure. The memory cell MC is a two-terminal element.

Each of the plurality of word lines WL is connected to the first control circuit 108. In addition, each of the plurality of bit lines BL is connected to the second control circuit 110. The sense circuit 112 is connected to the first control circuit 108 and the second control circuit 110.

The first control circuit 108 and the second control circuit 110 have functions of, for example, selecting a desired memory cell MC and performing writing of data into the memory cell, reading of data from the memory cell, erasing of data from the memory cell, and the like. At the time of reading data, the data in the memory cell is read as the amount of current flowing between the word line WL and the bit line BL. The sense circuit 112 has a function of determining the amount of current and determining the polarity of data. For example, "0" and "1" of the data are determined. The sense circuit 112 determines the amount of tunnel current flowing through the memory cell to determine the polarity of data.

The first control circuit 108, the second control circuit 110, and the sense circuit 112 constitute, for example, an electronic circuit using a semiconductor device formed on the semiconductor substrate 101.

Figure 22A:
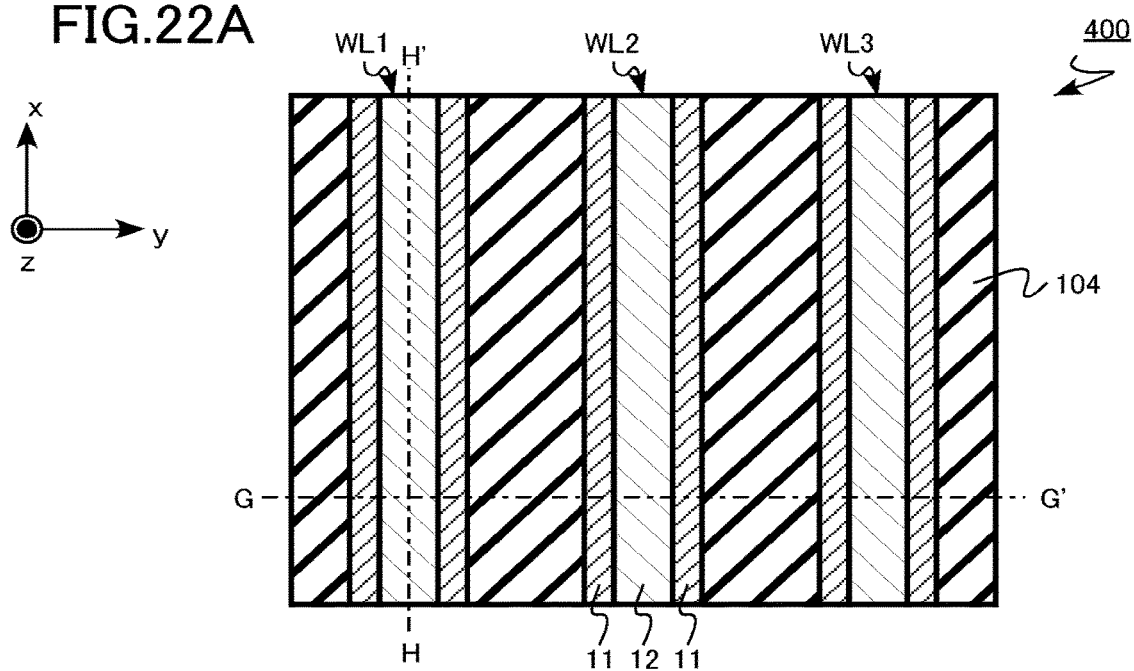
FIGS. 22A, 22B, and 22C are schematic views of a portion of a memory cell array of the storage device according to the fourth embodiment.
Figure 22B:
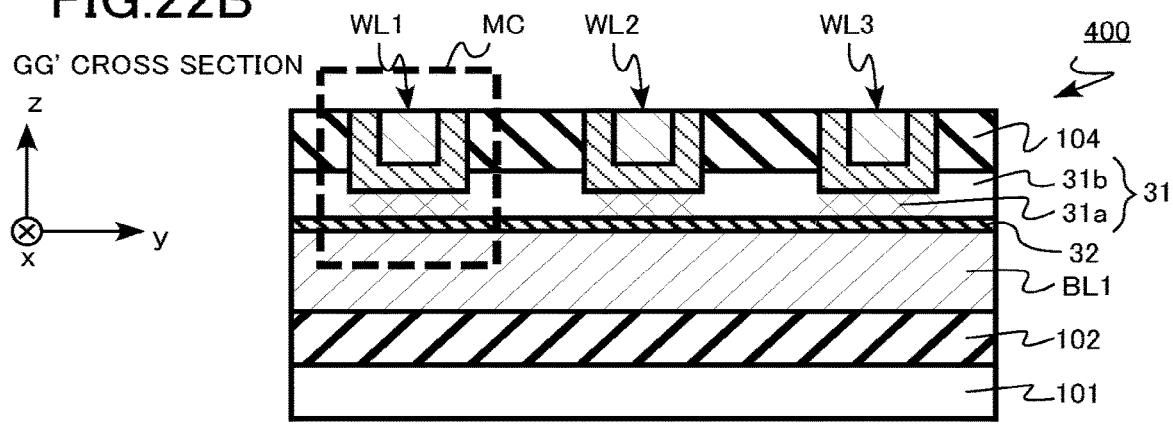
Figure 22C:
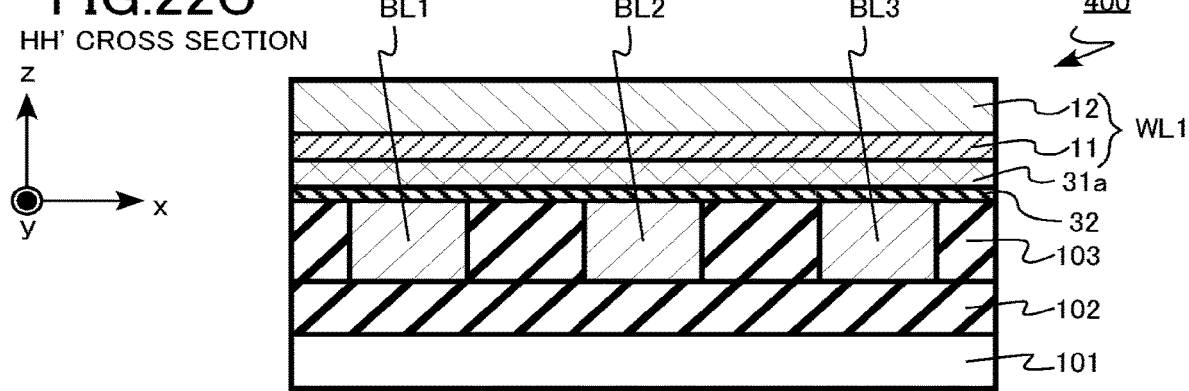

FIGS. 22A, 22B, and 22C are schematic views of a portion of the memory cell array of the storage device according to the fourth embodiment. FIG. 22A is a top view. FIG. 22A is an xy cross-sectional view of the memory cell array 400. FIG. 22B is a yz cross-sectional view of the memory cell array 400. FIG. 22B is a GG' cross section of FIG. 22A. FIG. 22C is an xz cross-sectional view of the memory cell array 400. FIG. 22C is an HH' cross section of FIG. 22A. In FIG. 22B, a region surrounded by a broken line is one memory cell MC.

Figure 23:
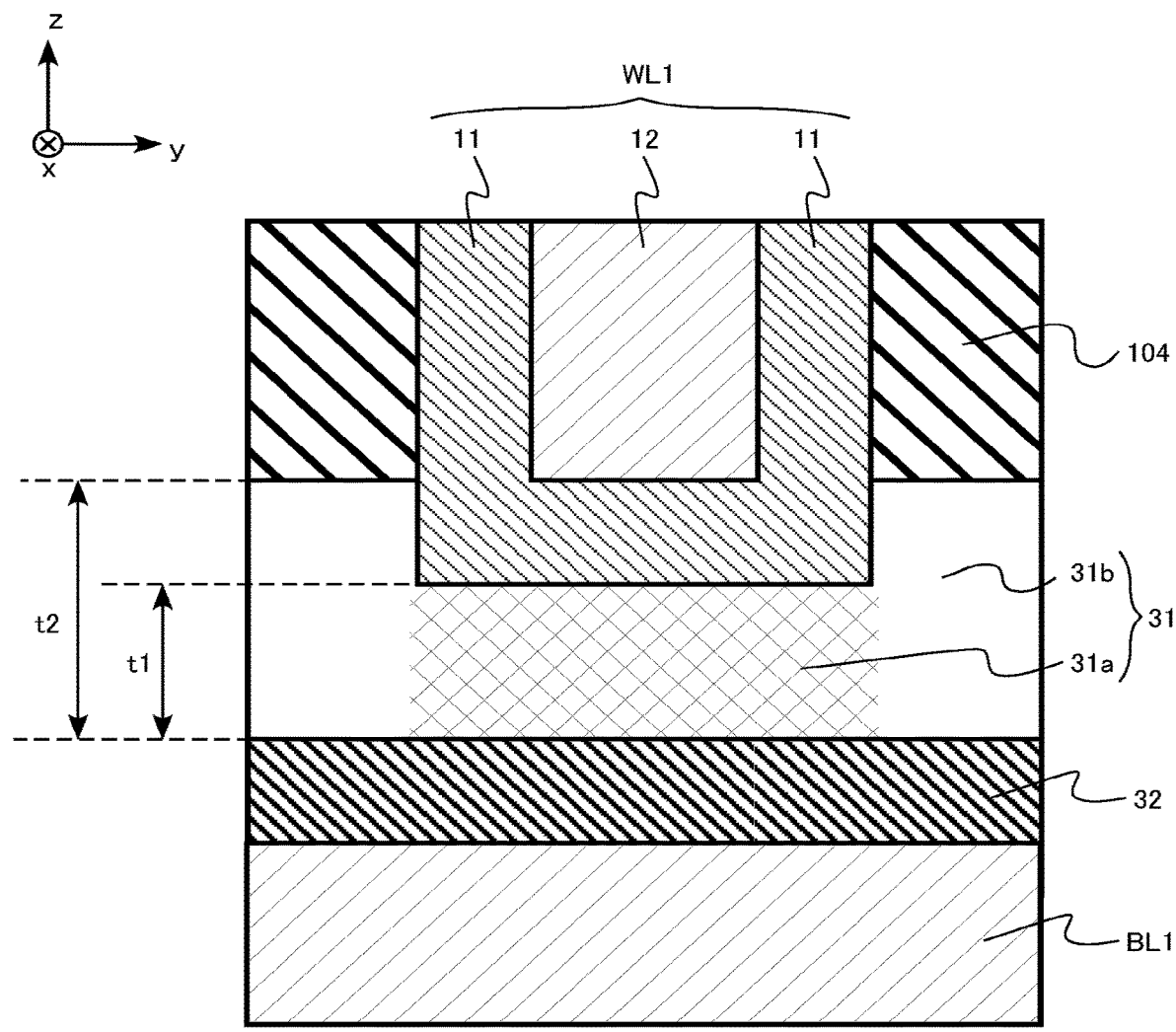
FIG. 23 is a schematic cross-sectional view of a memory cell of the storage device according to the fourth embodiment.

FIG. 23 is a schematic cross-sectional view of the memory cell of the storage device according to the fourth embodiment. FIG. 23 is an enlarged cross-sectional view of a portion of the memory cell MC. FIG. 23 is a yz cross-sectional view of the memory cell.

The memory cell array 400 is configured to include: a word line WL1 (first conductive layer); a word line WL2 (second conductive layer); a word line WL3; a bit line BL1 (third conductive layer); a bit line BL2; a bit line BL3; a first insulating film 31; a second insulating film 32; a semiconductor substrate 101; a first interlayer insulating layer 102; a second interlayer insulating layer 103; and a third interlayer insulating layer 104 (insulating layer). Hereinafter, in some cases, the word line WL1 (first conductive layer), the word line WL2 (second conductive layer), and the word line WL3 may be collectively referred to simply as a word line WL. In addition, in some cases, the bit line BL1 (third conductive layer), the bit line BL2, and the bit line BL3 may be collectively referred to simply as a bit line BL.

The word line WL has a barrier metal layer 11 and a main metal layer 12. The first insulating film 31 has a ferroelectric region 31a (first region, third region) and a paraelectric region 31b (second region).

Hereinafter, the x direction illustrated in FIGS. 21 to 23 is defined as a first direction, the y direction is defined as a second direction, and the z direction is defined as a third direction.

The word line WL extends in the x direction (first direction). The word lines WL are repeatedly arranged in the y direction (second direction).

The word line WL contains, for example, a metal, a metal nitride, a metal carbide, or a semiconductor. The word line WL has a barrier metal layer 11 and a main metal layer 12.

The barrier metal layer 11 is made of, for example, a metal nitride. The barrier metal layer 11 is made of, for example, a titanium nitride, a tantalum nitride, tungsten nitride, a tantalum nitride, a titanium carbide, a tungsten carbide, or a tantalum carbide. The main metal layer 12 is made of, for example, a metal. The main metal layer 12 is made of, for example, tungsten (W), titanium (Ti), or tantalum (Ta).

The bit line BL extends in the y direction (second direction). The y direction (second direction) intersects the x direction (first direction). The y direction is perpendicular to the x direction. The bit lines BL are repeatedly arranged in the x direction.

The bit line BL contains, for example, a metal, a metal nitride, a metal carbide, or a semiconductor. The bit line BL is made of, for example, a titanium nitride, a tantalum nitride, a tungsten nitride, a tantalum nitride, a titanium carbide, a tungsten carbide, a tantalum a carbide, tungsten (W), titanium (Ti), or tantalum (Ta).

The word line WL1 is an example of a first conductive layer. The word line WL2 is an example of a second conductive layer. The bit line BL1 is an example of a third conductive layer.

The semiconductor substrate 101 is, for example, a silicon substrate.

The first interlayer insulating layer 102 is provided on the semiconductor substrate 101. The first interlayer insulating layer 102 is provided between the semiconductor substrate 101 and the bit line BL. The first interlayer insulating layer 102 contains, for example, a silicon oxide.

The second interlayer insulating layer 103 is provided between the bit lines BL. The second interlayer insulating layer 103 contains, for example, a silicon oxide. The second interlayer insulating layer 103 is disposed under the first insulating film 31 and the second insulating film 32.

The third interlayer insulating layer 104 is provided on the bit line BL. The third interlayer insulating layer 104 is provided between the word lines WL. The third interlayer insulating layer 104 contains, for example, a silicon oxide. The third interlayer insulating layer 104 is an example of an insulating layer.

The first insulating film 31 is provided between the bit line BL and the word line WL. The first insulating film 31 is provided between the bit line BL and the interlayer insulating layer 104. The first insulating film 31 is provided between the bit line BL1 (third conductive layer) and the word line WL1 (first conductive layer).

The first insulating film 31 contains a hafnium oxide. The first insulating film 31 contains, for example, the hafnium oxide as a main component. The phrase "contains the hafnium oxide as a main component" denotes that the molar ratio of the hafnium oxide is the highest among the materials contained in the first insulating film 31. The molar ratio of the hafnium oxide is, for example, 90% or more.

The hafnium oxide forming the first insulating film 31 may contain at least one additive element selected from a group consisting of, for example, silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The containing of the above-mentioned additive element allows the hafnium oxide to easily exhibit ferroelectricity.

The first insulating film 31 has a ferroelectric region 31a (first region) and a paraelectric region 31b (second region). The ferroelectric region 31a is provided between the word line WL and the bit line BL. The paraelectric region 31b is provided between the third interlayer insulating layer 104 and the bit line BL. The paraelectric region 31b is disposed between two ferroelectric regions 31a adjacent to each other in the y direction. The paraelectric region 31b is disposed, for example, between the ferroelectric region 31a between the word line WL1 and the bit line BL1 and the ferroelectric region 31a between the word line WL2 and the bit line BL1.

The ferroelectric region 31a and the paraelectric region 31b have, for example, the same chemical composition. The phrase "the same chemical composition" denotes that the composition is within a range of a variation of the composition occurring unavoidably, for example, in manufacturing.

The ferroelectric region 31a contains a ferroelectric material. The ferroelectric region 31a contains a hafnium oxide of a ferroelectric material. For example, the main component of the ferroelectric region 31a is a hafnium oxide. The ferroelectric region 31a is made of, for example, a hafnium oxide of a ferroelectric material.

The ferroelectric region 31a contains an orthorhombic hafnium oxide. The hafnium oxide contained in the ferroelectric region 31a mainly has an orthorhombic crystal. More specifically, the hafnium oxide contained in the ferroelectric region 31a mainly has a third orthorhombic crystal (orthorhombic III, space group Pbc21, space group number 29). A main crystal structure of the hafnium oxide contained in the ferroelectric region 31a is orthorhombic. The proportion of the crystals occupied by the orthorhombic crystal to the crystal of the hafnium oxide contained in the ferroelectric region 31a is the largest. In addition, the orthorhombic crystal is also called a rhombic crystal.

The paraelectric region 31b contains a paraelectric material. The paraelectric region 31b contains a hafnium oxide of a paraelectric material. For example, the main component of the paraelectric region 31b is a hafnium oxide. The paraelectric region 31b is made of, for example, a hafnium oxide of a paraelectric material.

The paraelectric region 31b contains a hafnium oxide having a crystal other than the orthorhombic crystal. The crystal other than the orthorhombic crystal is a cubic crystal, a hexagonal crystal, a tetragonal crystal, a monoclinic crystal, or a triclinic crystal. The hafnium oxide contained in the paraelectric region 31b mainly has a crystal other than the orthorhombic crystal. A main crystal structure of the hafnium oxide contained in the paraelectric region 31b is a crystal structure other than the orthorhombic. The proportion occupied by the crystal other than the orthorhombic crystal to the crystal of the hafnium oxide contained in the paraelectric region 31b is the largest.

The first thickness (t1 in FIG. 23) of the ferroelectric region 31a in the z direction (third direction) from the bit line BL toward the word line WL is smaller than the second thickness (t2 in FIG. 23) of the paraelectric region 31b in the z direction. The second thickness t2 is, for example, 1.2 times or more and 3 times or less the first thickness t1.

The first thickness t1 of the ferroelectric region 31a is, for example, 5 nm or more and 10 nm or less. The second thickness t2 of the paraelectric region 31b is, for example, 15 nm or more and 30 nm or less.

The second insulating film 32 is provided between the first insulating film 31 and the bit line BL. The second insulating film 32 is made of a material different from that of the first insulating film 31.

The second insulating film 32 is made of, for example, an oxide, a nitride, or an oxynitride. The second insulating film 32 contains, for example, a silicon oxide or a titanium oxide. The second insulating film 32 is made of a paraelectric material.

The thickness of the second insulating film 32 is, for example, 0.5 nm or more and 2 nm or less.

In the FTJ memory according to the fourth embodiment, the polarization inversion of the first insulating film 31 which is made of a ferroelectric material is allowed to occur by changing the voltage applied between the word line WL and the bit line BL. The shape of the tunnel barrier formed by the first insulating film 31 and the second insulating film 32 is changed depending on the polarization state of the first insulating film 31. The tunnel current flowing between the word line WL and the bit line BL is changed according to a change of the shape of the tunnel barrier.

For example, when the OFF state (high resistance state) where the tunnel current hardly flows is defined as data "0" and the ON state (low resistance state) where the tunnel current easily flows is defined as data "1", the memory cell MC can store 1-bit data of "0" and "1".

The memory cell array 400 according to the fourth embodiment can be manufactured by using a known process technique with reference to the method of manufacturing the memory cell array 100 according to the first embodiment. For example, in forming the word line WL, after depositing films corresponding to the first insulating film 31 and the third interlayer insulating layer 104, a groove is formed in a region where the word line WL is to be formed so that a portion of the first insulating film 31 is removed by a dry etching method. By burying the material of the word line WL in the formed groove, it is possible to form the ferroelectric region 31a and the paraelectric region 31b having different thicknesses in the first insulating film 31.

Next, the functions and the effects of the storage device according to the fourth embodiment will be described.

For example, when the memory cell array of the FTJ memory is scaled down, there is a concern in that memory characteristics may be degraded due to inter-cell interference between adjacent memory cells. For example, when the interval between the word lines WL is reduced due to the scaling-down, the polarization states of the ferroelectric films under the adjacent word lines WL are changed due to the voltages applied to the word lines WL, and there is a concern in that erroneous writing may occur.

The memory cell array 400 of the storage device according to the fourth embodiment has a structure in which the ferroelectric regions 31a under the two word lines WL are physically separated by the paraelectric region 31b. The paraelectric material has a lower dielectric constant than ferroelectric material. Therefore, degradation of memory characteristics due to inter-cell interference is suppressed.

In addition, in the memory cell array 400, the first insulating film 31 between the bit line BL and the word line WL is thinner than the first insulating film 31 between the bit line BL and the third interlayer insulating layer 104. Therefore, in the crystallization annealing, the first insulating film 31 between the bit line BL and the word line WL is likely to be made of a ferroelectric material.

From the viewpoint of facilitating the use of a ferroelectric material for the first insulating film 31 between the bit line BL and the word line WL, the word line WL preferably contains a titanium nitride. In addition, the titanium nitride is preferably in contact with first insulating film 31.

From the viewpoint of facilitating the use of a ferroelectric material for the first insulating film 31 between the bit line BL and the word line WL, the second thickness t2 of the paraelectric region 31b is 1.2 times or more the first thickness t1 of the ferroelectric region 31a.

From the viewpoint of facilitating the use of a ferroelectric material for the first insulating film 31 between the bit line BL and the word line WL, the first thickness t1 of the ferroelectric region 31a is preferably 10 nm or less.

As described above, according to the fourth embodiment, the ferroelectric material under the word line WL and the ferroelectric material under the adjacent word line WL are physically separated. Therefore, it is possible to realize a storage device in which degradation of memory characteristics due to inter-cell interference is suppressed.

Fifth Embodiment

A storage device according to a fifth embodiment is different from the storage device according to the fourth embodiment in that the first region contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba), and the second region contains or does not contain the at least one element, and the first concentration of at least one element in the first region is higher than the second concentration of the at least one element in the second region. In addition, the storage device of the fifth embodiment is different from the storage device of the fourth embodiment in that an intermediate layer containing at least one element is included between the first conductive layer and the insulating layer. Hereinafter, a portion of description of contents overlapping with those of the fourth embodiment will be omitted.

Figure 24A:
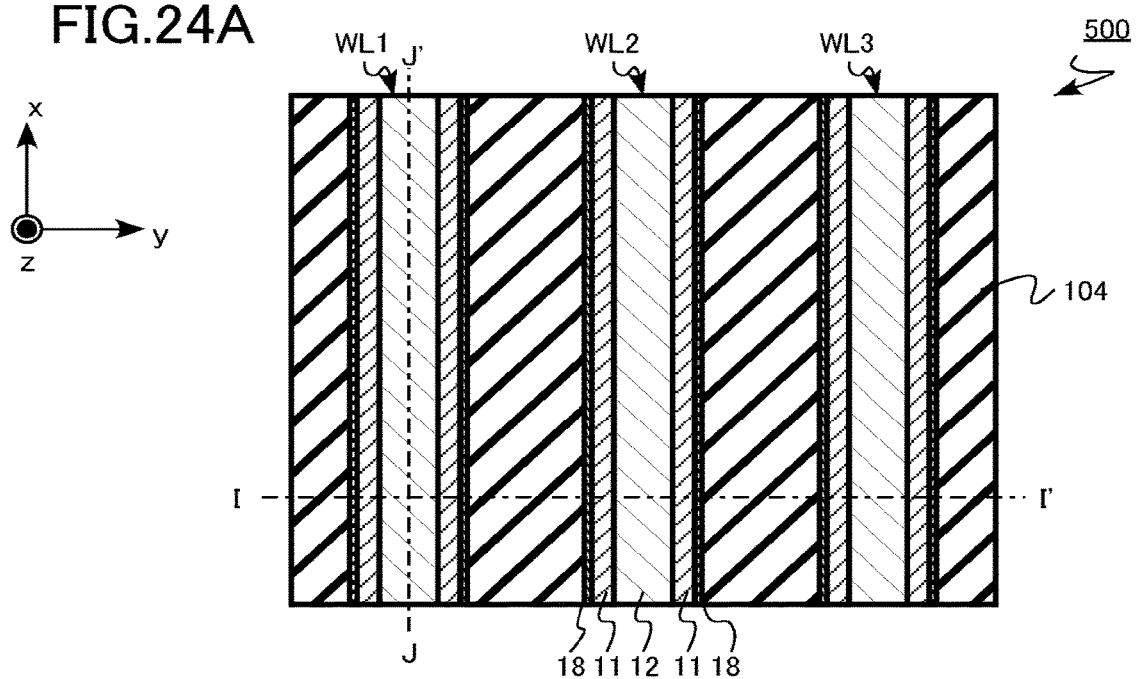
FIGS. 24A, 24B, and 24C are schematic views of a portion of a memory cell array of a storage device according to a fifth embodiment.
Figure 24B:
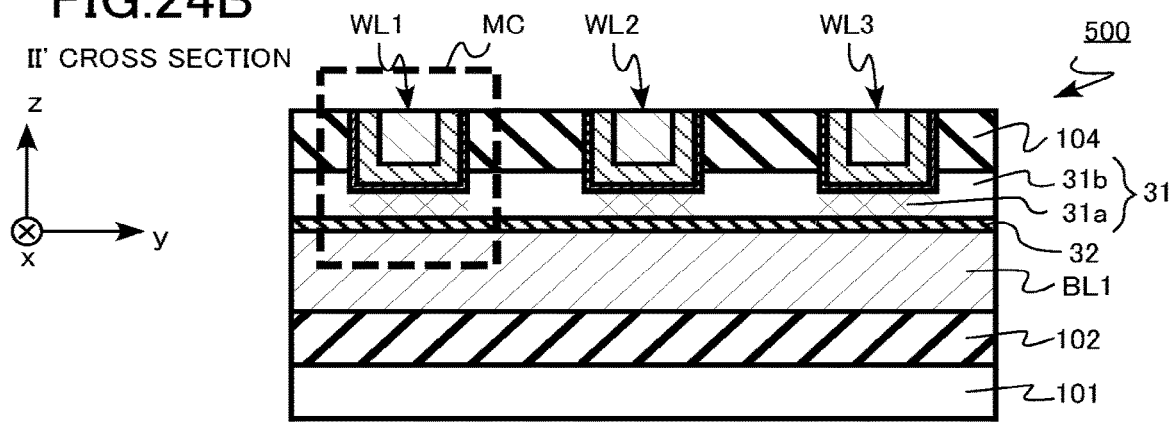
Figure 24C:
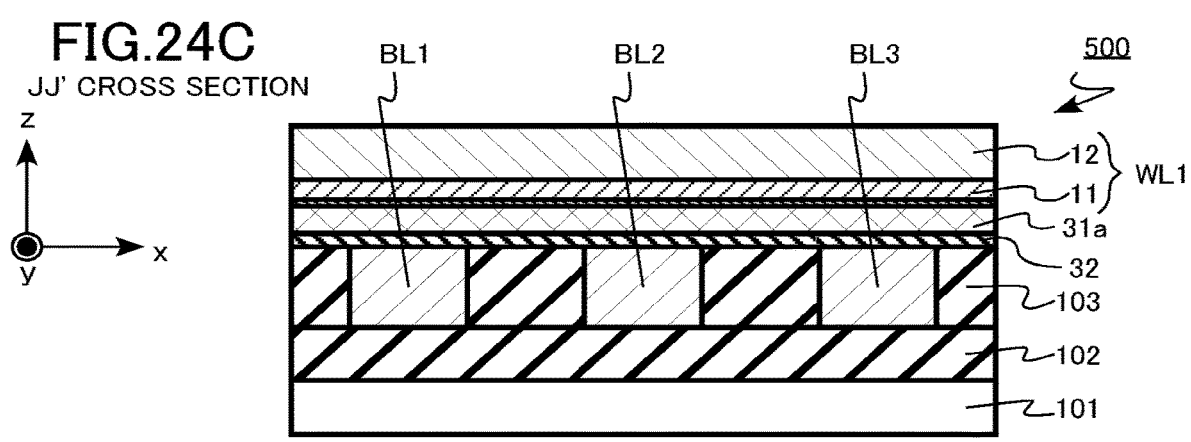

FIGS. 24A, 24B, and 24C are schematic views of a portion of the memory cell array of the storage device according to the fifth embodiment. FIG. 24A is a top view. FIG. 24A is an xy cross-sectional view of the memory cell array 500. FIG. 24B is a yz cross-sectional view of the memory cell array 500. FIG. 24B is an II' cross section of FIG. 24A. FIG. 24C is an xz cross-sectional view of the memory cell array 500. FIG. 24C is a JJ' cross section of FIG. 24A. In FIG. 24B, a region surrounded by a broken line is one memory cell MC.

Figure 25:
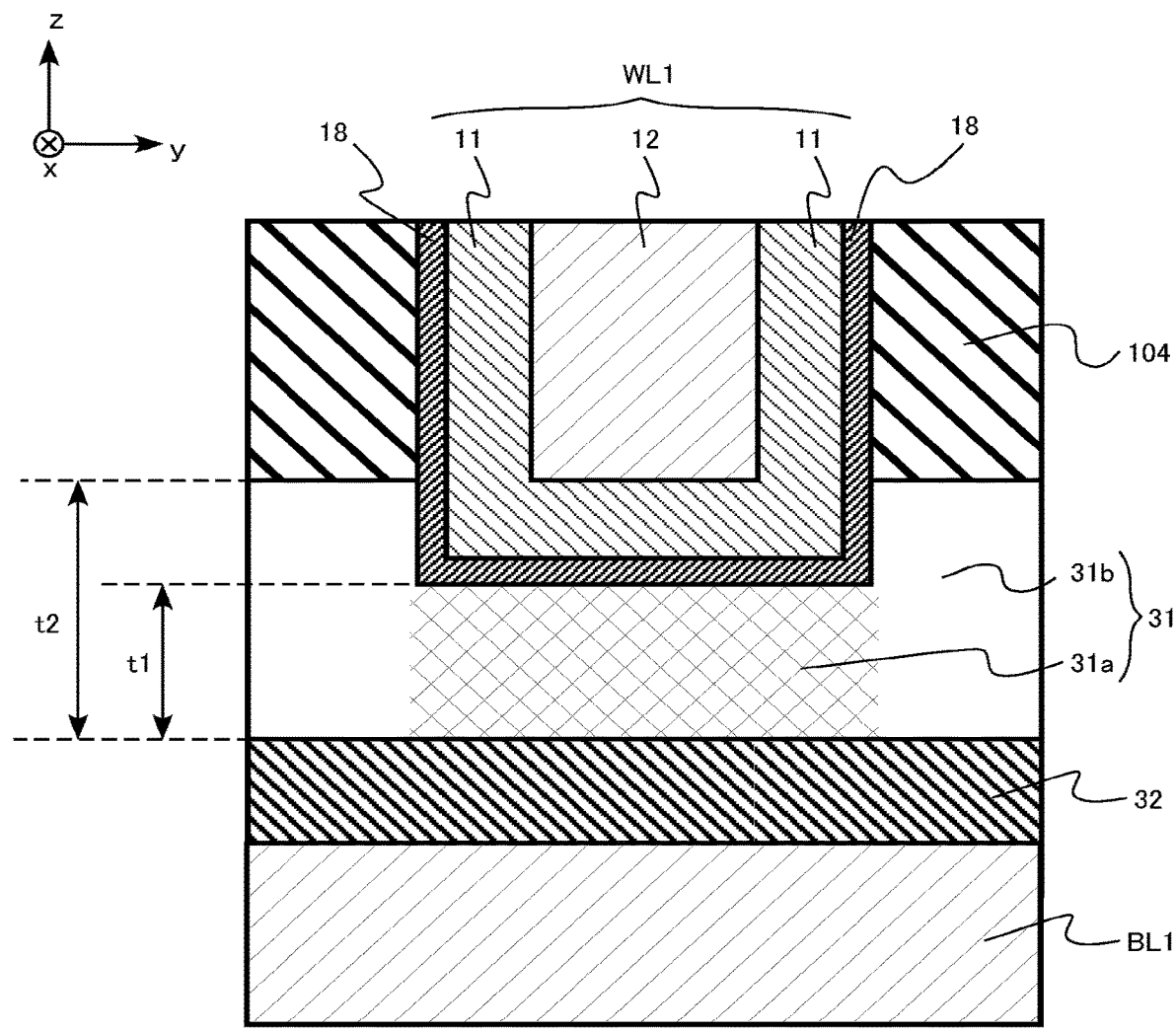
FIG. 25 is a schematic cross-sectional view of a memory cell of the storage device according to the fifth embodiment.

FIG. 25 is a schematic cross-sectional view of the memory cell of the storage device according to the fifth embodiment. FIG. 25 is an enlarged cross-sectional view of a portion of the memory cell MC. FIG. 25 is a yz cross-sectional view of the memory cell MC.

The memory cell array 500 is configured to include: a word line WL1 (first conductive layer); a word line WL2 (second conductive layer); a word line WL3; a bit line BL1 (third conductive layer); a bit line BL2; a bit line BL3; a first insulating film 31; a second insulating film 32; a semiconductor substrate 101; a first interlayer insulating layer 102; a second interlayer insulating layer 103; a third interlayer insulating layer 104 (insulating layer); and an intermediate layer 18. Hereinafter, in some cases, the word line WL1 (first conductive layer), the word line WL2 (second conductive layer), and the word line WL3 may be collectively referred to simply as a word line WL. In addition, in some cases, the bit line BL1 (third conductive layer), the bit line BL2, and the bit line BL3 may be collectively referred to simply as a bit line BL.

The word line WL has a barrier metal layer 11 and a main metal layer 12. The first insulating film 31 has a ferroelectric region 31a (first region, third region) and a paraelectric region 31b (second region).

Hereinafter, the x direction illustrated in FIGS. 24 and 25 is defined as a first direction, the y direction is defined as a second direction, and the z direction is defined as a third direction.

The ferroelectric region 31a contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The paraelectric region 31b contains or does not contain the above-mentioned additive element.

The chemical composition of the ferroelectric region 31a is different from the chemical composition of the paraelectric region 31b.

The containing of the above-mentioned additive element allows the hafnium oxide to easily exhibit ferroelectricity.

The concentration (first concentration) of the additive element in the ferroelectric region 31a is higher than the concentration (second concentration) of the additive element in the paraelectric region 31b. In a case where the paraelectric region 31b does not contain the additive element, the concentration of the additive element in the paraelectric region 31b is zero.

The concentration (first concentration) of the additive element in the ferroelectric region 31a is, for example, 10 times or more the concentration (second concentration) of the additive element in the paraelectric region 31b.

The intermediate layer 18 is provided between the word line WL and the third interlayer insulating layer 104 (insulating layer). The intermediate layer 18 is provided between the word line WL and the ferroelectric region 31a. The intermediate layer 18 contains the above-mentioned additive element. The intermediate layer 18 becomes a supply source of the additive element to the ferroelectric region 31a at the time of manufacturing the memory cell array 500.

The concentration (third concentration) of the additive element in the intermediate layer 18 is higher than the concentration (fourth concentration) of the additive element in the interlayer insulating layer 104.

The intermediate layer 18 is made of, for example, a metal, a semiconductor, a metal semiconductor compound, a metal nitride, a metal carbide, an oxide insulator, or a nitride insulator. The intermediate layer 18 is made of, for example, aluminum or silicon.

The thickness of the intermediate layer 18 in the y direction (second direction) is smaller than, for example, the thickness of the barrier metal layer 11 in the y direction. The thickness of the intermediate layer 18 in the y direction is, for example, 1 nm or more and 3 nm or less.

The memory cell array 500 according to the fifth embodiment can be manufactured by using a known process technique with reference to the methods of manufacturing the memory cell array 200 according to the second embodiment and the memory cell array 400 according to the fourth embodiment.

In the memory cell array 500 of the storage device according to the fifth embodiment, the concentration (first concentration) of the additive element in the ferroelectric region 31a is higher than the concentration (second concentration) of the additive element in the paraelectric region 31b. The concentration of the additive element is high, and thus, the ferroelectricity of the ferroelectric region 31a is improved.

From the viewpoint of improving the ferroelectricity of the ferroelectric region 31a, the concentration (first concentration) of the additive element in the ferroelectric region 31a is, for example, preferably 10 times or more the concentration (second concentration) of the additive element in the paraelectric region 31b, and more preferably 100 times or more.

In addition, since the memory cell array 500 is configured with the intermediate layer 18 containing the above-mentioned additive element, the improvement of the ferroelectricity of the ferroelectric region 31a is facilitated. From the viewpoint of facilitating the manufacturing, the intermediate layer 18 is made of, preferably, aluminum or silicon.

As described above, according to the fifth embodiment, similarly to the fourth embodiment, the ferroelectric material under the word line WL and the ferroelectric material under the adjacent word line WL are physically separated. Therefore, it is possible to realize a storage device in which degradation of memory characteristics due to inter-cell interference is suppressed. In addition, it is possible to further improve the ferroelectricity of the ferroelectric region.

Sixth Embodiment

A storage device according to a sixth embodiment is different from the storage device according to the fifth embodiment in that the first thickness of the first region in the third direction from the third conductive layer toward the first conductive layer is equal to the second thickness of the second region in the third direction. Hereinafter, a portion of description of contents overlapping with those of the fourth and fifth embodiments will be omitted.

Figure 26A:
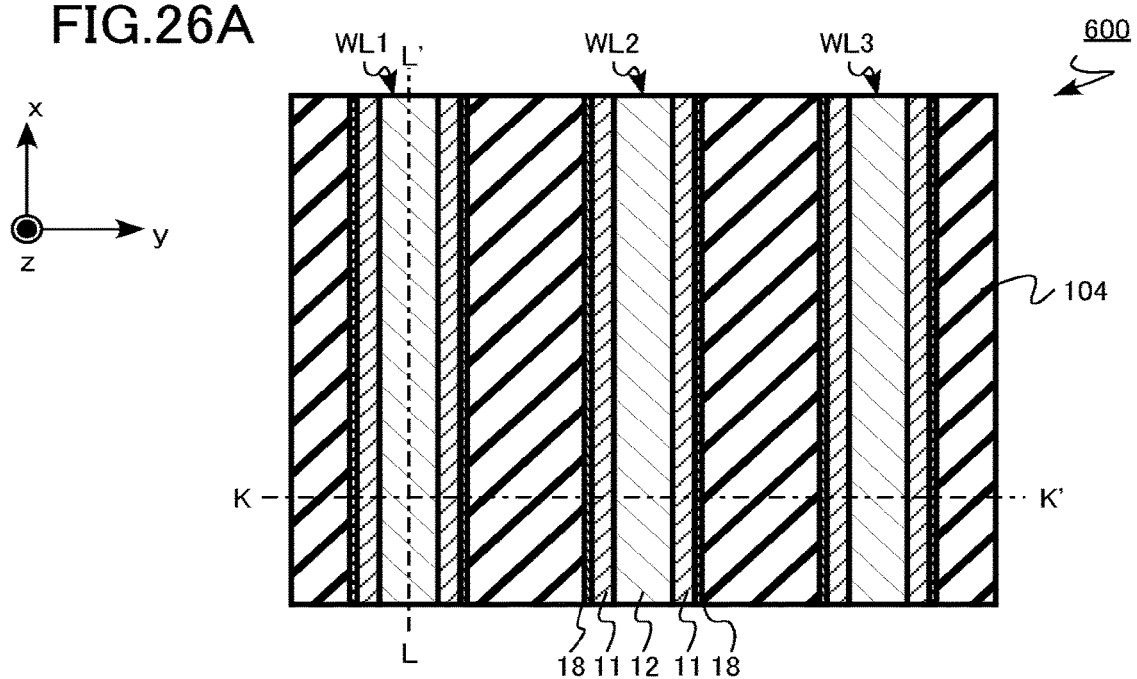
FIGS. 26A, 26B, and 26C are schematic views of a portion of a memory cell array of a storage device according to a sixth embodiment.
Figure 26B:
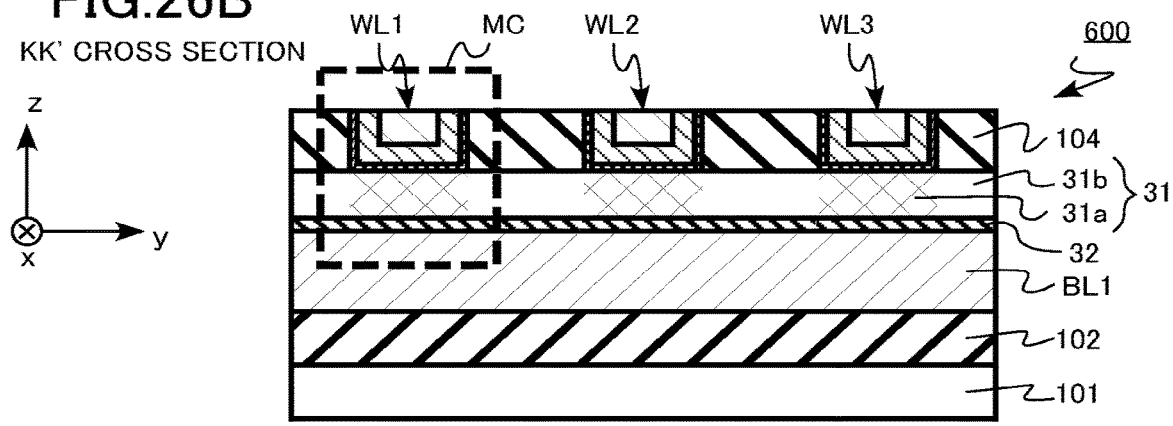
Figure 26C:
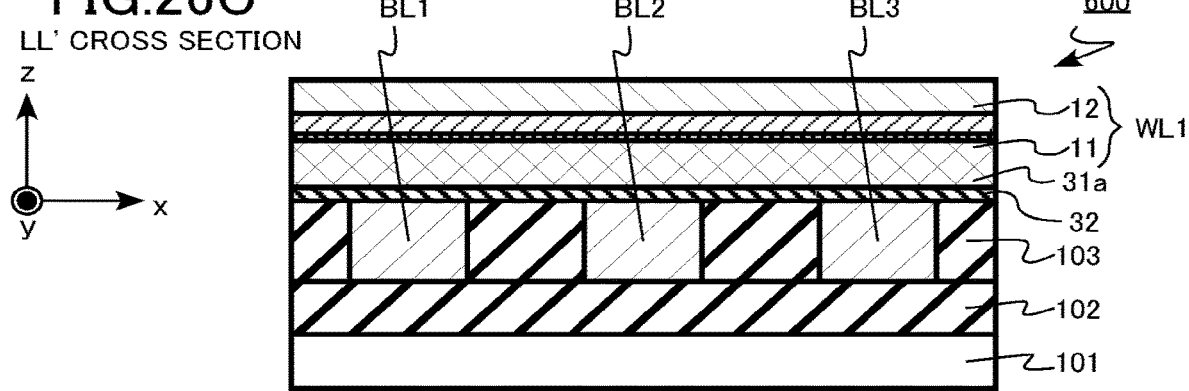

FIGS. 26A, 26B, and 26C are schematic views of a portion of the memory cell array of the storage device according to the sixth embodiment. FIG. 26A is a top view. FIG. 26A is an xy cross-sectional view of the memory cell array 600. FIG. 26B is a yz cross-sectional view of the memory cell array 600. FIG. 26B is a KK' cross section of FIG. 26A. FIG. 26C is an xz cross-sectional view of the memory cell array 600. FIG. 26C is an LL' cross section of FIG. 26A. In FIG. 26B, a region surrounded by a broken line is one memory cell MC.

Figure 27:
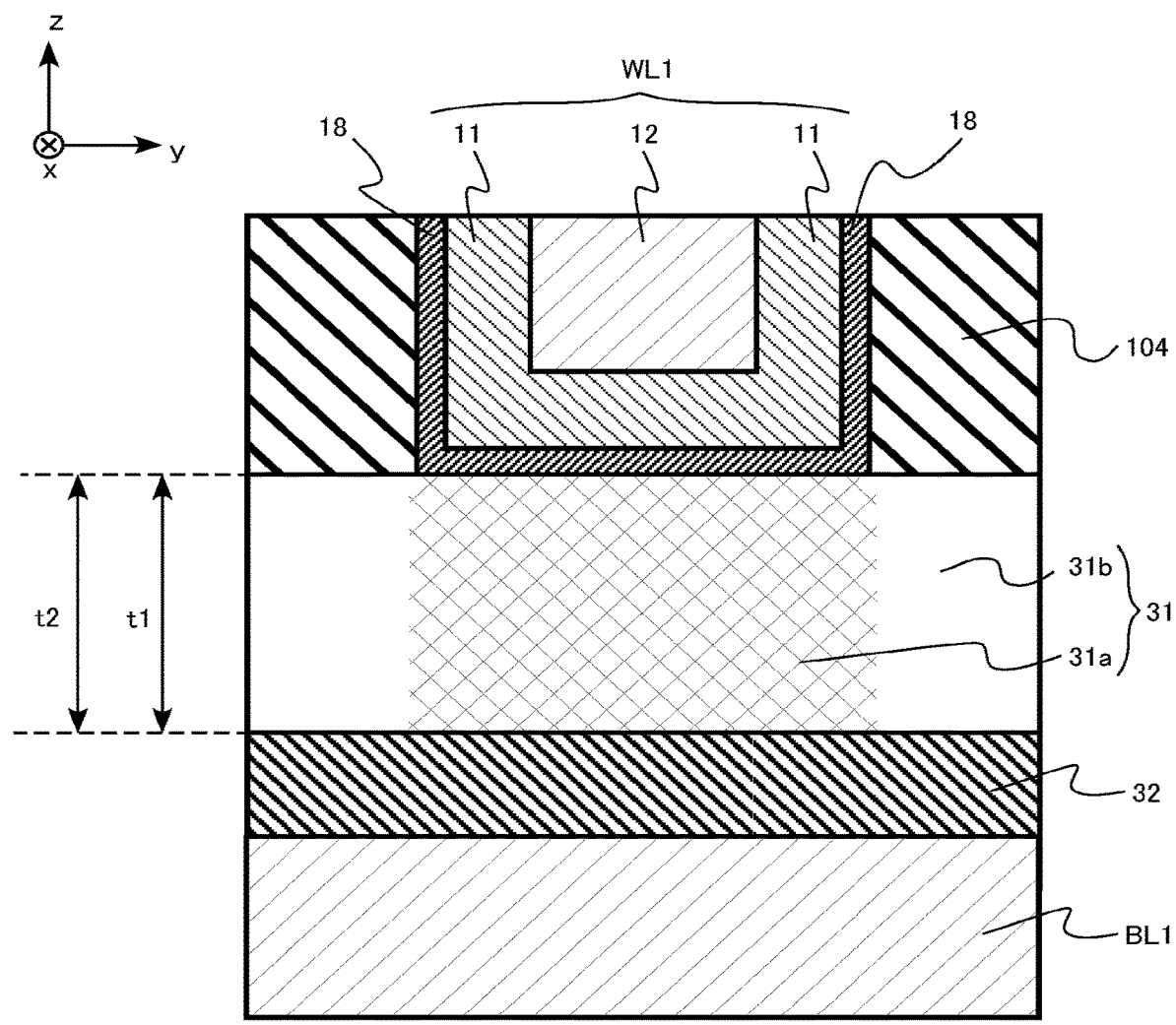
FIG. 27 is a schematic cross-sectional view of a memory cell of the storage device according to the sixth embodiment.

FIG. 27 is a schematic cross-sectional view of the memory cell of the storage device according to the sixth embodiment. FIG. 27 is an enlarged cross-sectional view of a portion of the memory cell MC. FIG. 27 is a yz cross-sectional view of the memory cell MC.

The memory cell array 600 is configured to include: a word line WL1 (first conductive layer); a word line WL2 (second conductive layer); a word line WL3; a bit line BL1 (third conductive layer); a bit line BL2; a bit line BL3; a first insulating film 31; a second insulating film 32; a semiconductor substrate 101; a first interlayer insulating layer 102; a second interlayer insulating layer 103; a third interlayer insulating layer 104 (insulating layer); and an intermediate layer 18. Hereinafter, in some cases, the word line WL1 (first conductive layer), the word line WL2 (second conductive layer), and the word line WL3 may be collectively referred to simply as a word line WL. In addition, in some cases, the bit line BL1 (third conductive layer), the bit line BL2, and the bit line BL3 may be collectively referred to simply as a bit line BL.

The word line WL has a barrier metal layer 11 and a main metal layer 12. The first insulating film 31 has a ferroelectric region 31a (first region, third region) and a paraelectric region 31b (second region).

Hereinafter, the x direction illustrated in FIGS. 26A, 26B, 26C, and 27 is defined as a first direction, the y direction is defined as a second direction, and the z direction is defined as a third direction.

The first thickness (t1 in FIG. 27) of the ferroelectric region 31a in the z direction (third direction) from the bit line BL toward the word line WL is equal to the second thickness (t2 in FIG. 27) of the paraelectric region 31b in the z direction.

The ferroelectric region 31a contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The paraelectric region 31b contains or does not contain the above-mentioned additive element.

The chemical composition of the ferroelectric region 31a is different from the chemical composition of the paraelectric region 31b.

When the ferroelectric region 31a contains the above-mentioned additive element, it is easy for the hafnium oxide to exhibit ferroelectricity.

The memory cell array 600 of the storage device according to the sixth embodiment can be manufactured by omitting a process of removing a portion of the first insulating film 31 in the method of manufacturing the memory cell array 500 of the storage device according to the fifth embodiment.

In the memory cell array 600 of the storage device according to the sixth embodiment, the ferroelectric region 31a is allowed to selectively exhibit ferroelectricity by using an additive element.

As described above, according to the sixth embodiment, similarly to the fourth embodiment, the ferroelectric material under the word line WL and the ferroelectric material under the adjacent word line WL are physically separated. Therefore, it is possible to realize a storage device in which degradation of memory characteristics due to inter-cell interference is suppressed.

Seventh Embodiment

A storage device according to a seventh embodiment is different from the storage device according to the fourth embodiment in that the memory cell array has a three-dimensional structure. Hereinafter, a portion of description of contents overlapping with those of the fourth embodiment will be omitted.

Figure 28:
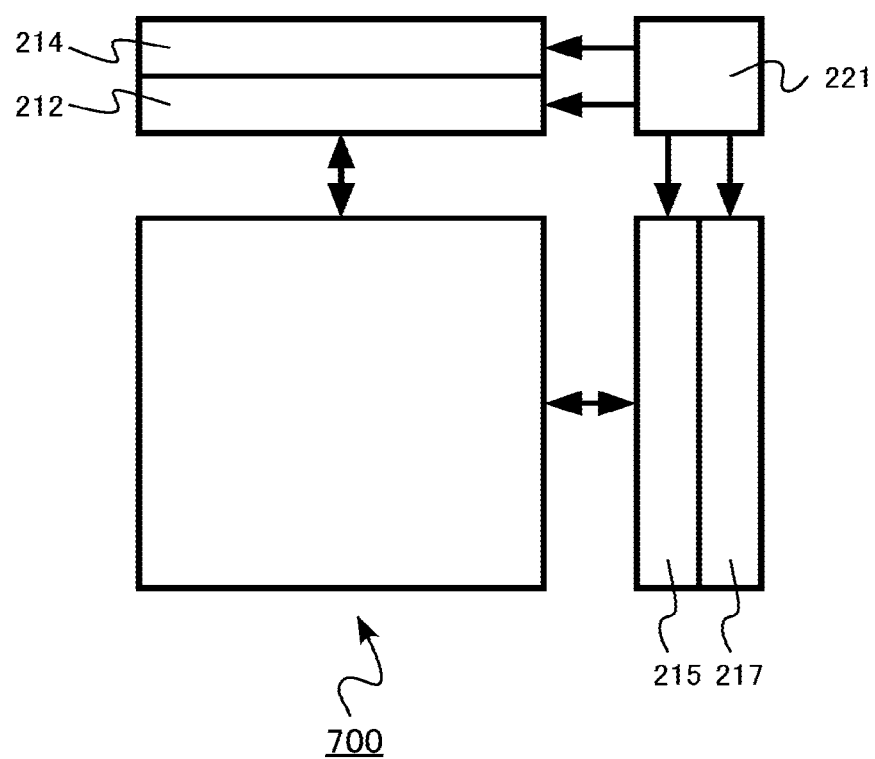
FIG. 28 is a block diagram of a storage device according to a seventh embodiment.
Figure 29:
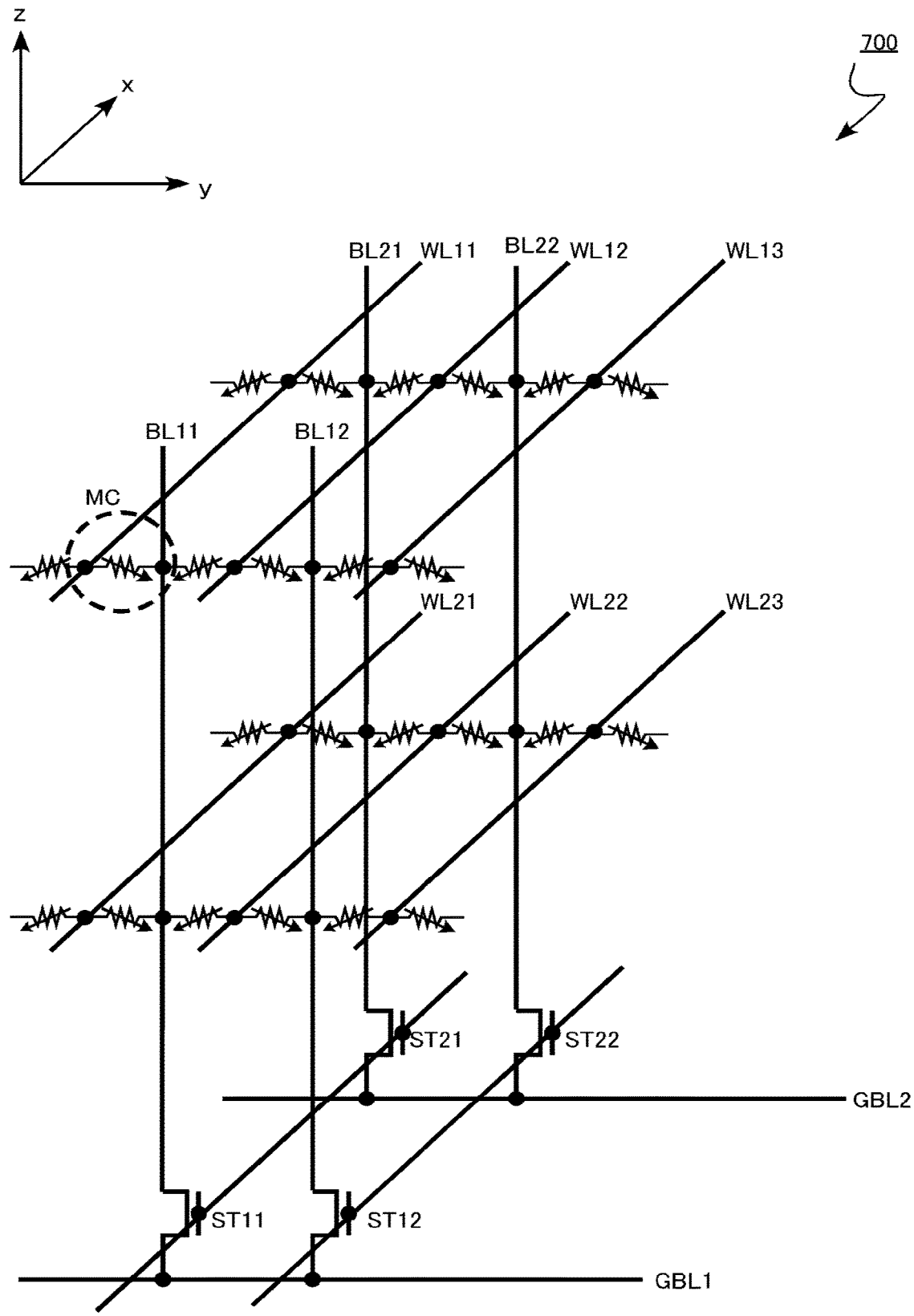
FIG. 29 is an equivalent circuit diagram of a memory cell array of the storage device according to the seventh embodiment.

FIG. 28 is a block diagram of the storage device according to the seventh embodiment. FIG. 29 is an equivalent circuit diagram of the memory cell array of the storage device according to the seventh embodiment. FIG. 29 schematically illustrates a wiring structure in the memory cell array. The memory cell array 700 according to the seventh embodiment has a three-dimensional structure in which the memory cells MC are sterically arranged.

As illustrated in FIG. 28, the storage device according to the seventh embodiment is configured to include: a memory cell array 700; a word line driver circuit 212; a row decoder circuit 214; a sense amplifier circuit 215; a column decoder circuit 217; and a control circuit 221.

In addition, as illustrated in FIG. 29, a plurality of the memory cells MC are sterically arranged in the memory cell array 700. In FIG. 29, a region surrounded by a dotted line corresponds to one memory cell MC.

The memory cell array 700 is configured with, for example, a plurality of word lines WL (WL11, WL12, WL13, WL21, WL22, WL23) and a plurality of bit lines BL (BL11, BL12, BL21, BL22). The word line WL extends in the x direction. The bit line BL extends in the z direction. The word lines WL and the bit lines BL intersect each other vertically. A memory cell MC is arranged at an intersection between a word line WL and a bit line BL.

The plurality of word lines WL are electrically connected to the row decoder circuit 214. The plurality of bit lines BL are connected to a sense amplifier circuit 215. The select transistors ST (ST11, ST21, ST12, ST22) and global bit lines GBL (GBL1, GBL2) are provided between the plurality of bit lines BL and the sense amplifier circuit 215.

The row decoder circuit 214 has a function of selecting a word line WL according to an input row address signal. The word line driver circuit 212 has a function of applying a predetermined voltage to the word line WL selected by the row decoder circuit 214.

The column decoder circuit 217 has a function of selecting a bit line BL according to an input column address signal. The sense amplifier circuit 215 has a function of applying a predetermined voltage to the bit line BL selected by the column decoder circuit 217. In addition, sense amplifier circuit 215 has a function of detecting and amplifying a current flowing between the selected word line WL and the selected bit line BL.

The control circuit 221 has a function of controlling the word line driver circuit 212, the row decoder circuit 214, the sense amplifier circuit 215, the column decoder circuit 217, and other circuits (not illustrated).

The circuits such as the word line driver circuit 212, the row decoder circuit 214, the sense amplifier circuit 215, the column decoder circuit 217, and the control circuit 221 are configured with, for example, transistors and wiring layers using semiconductor layers (not illustrated).

Figure 30A:
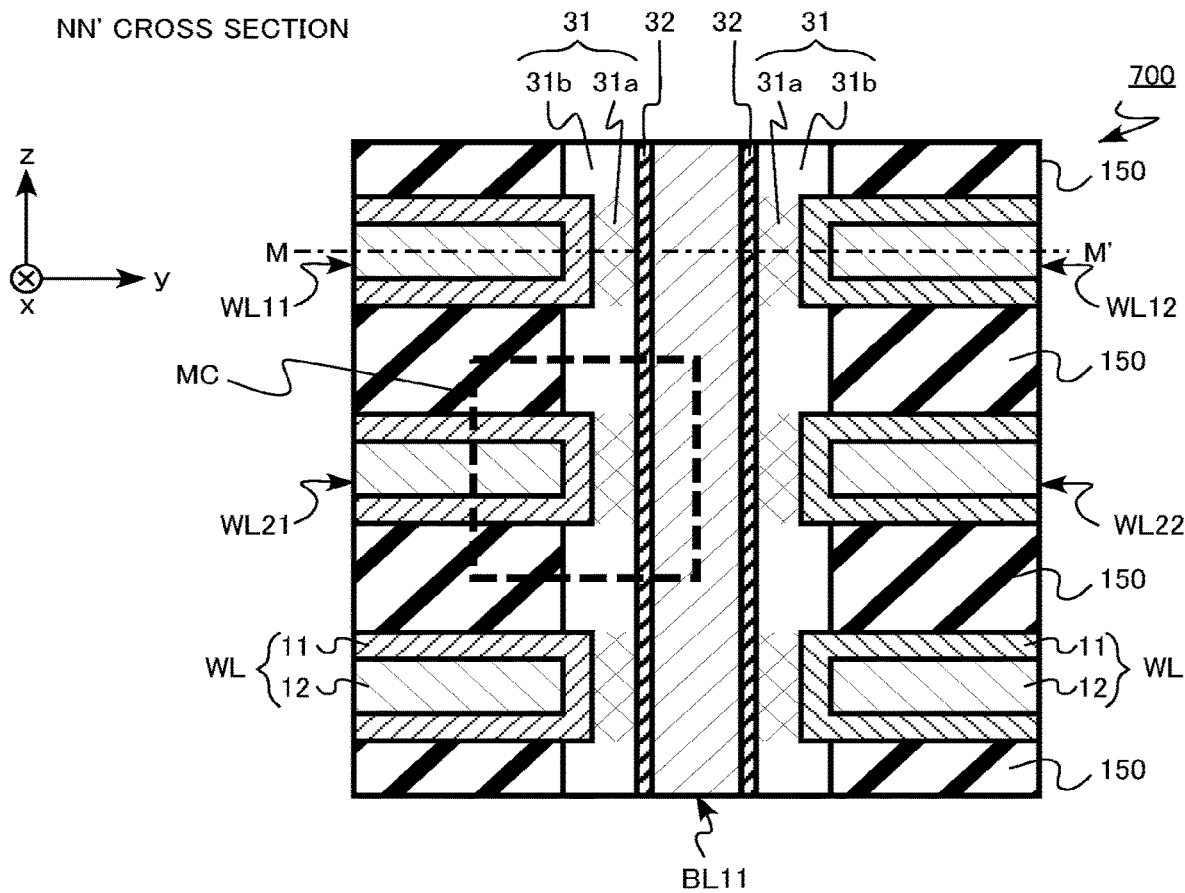
FIGS. 30A and 30B are schematic cross-sectional views of a portion of the memory cell array of the storage device according to the seventh embodiment.
Figure 30B:
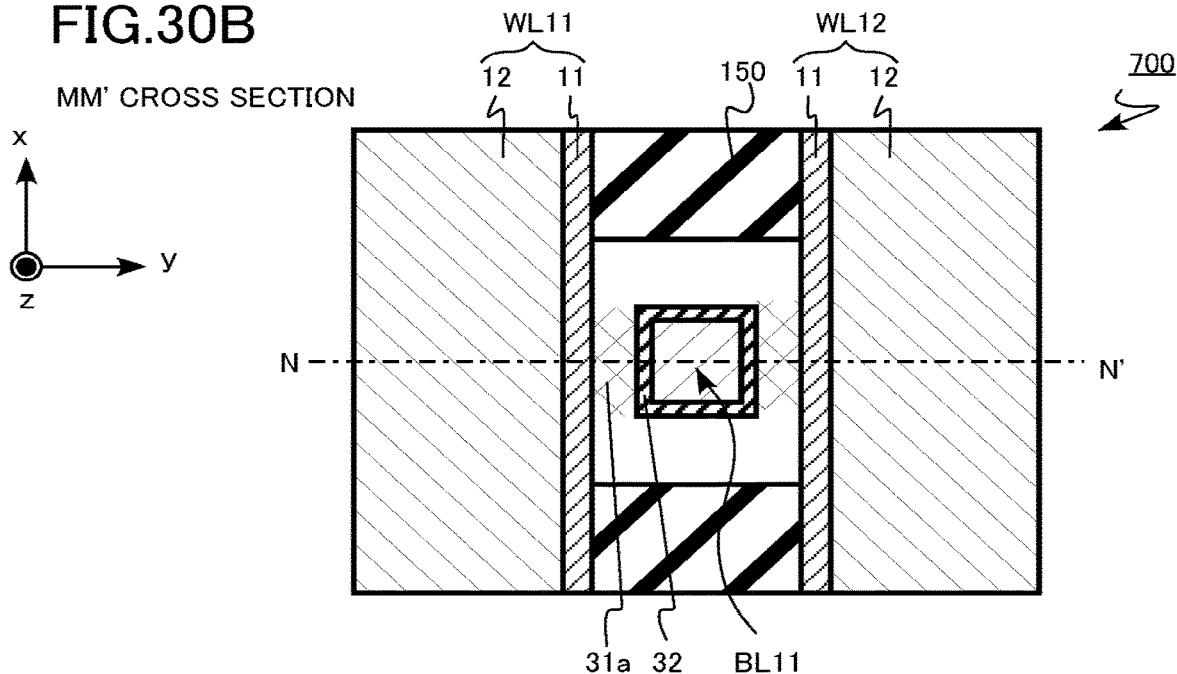

FIGS. 30A and 30B are schematic cross-sectional views of a portion of the memory cell array of the storage device according to the seventh embodiment. FIG. 30A is a yz cross-sectional view of the memory cell array 700. FIG. 30B is an xy cross-sectional view of the memory cell array 700. FIG. 30A is an NN' cross section of FIG. 30B, and FIG. 30B is an MM' cross section of FIG. 30A. In FIG. 30A, a region surrounded by a broken line is one memory cell MC.

Figure 31:
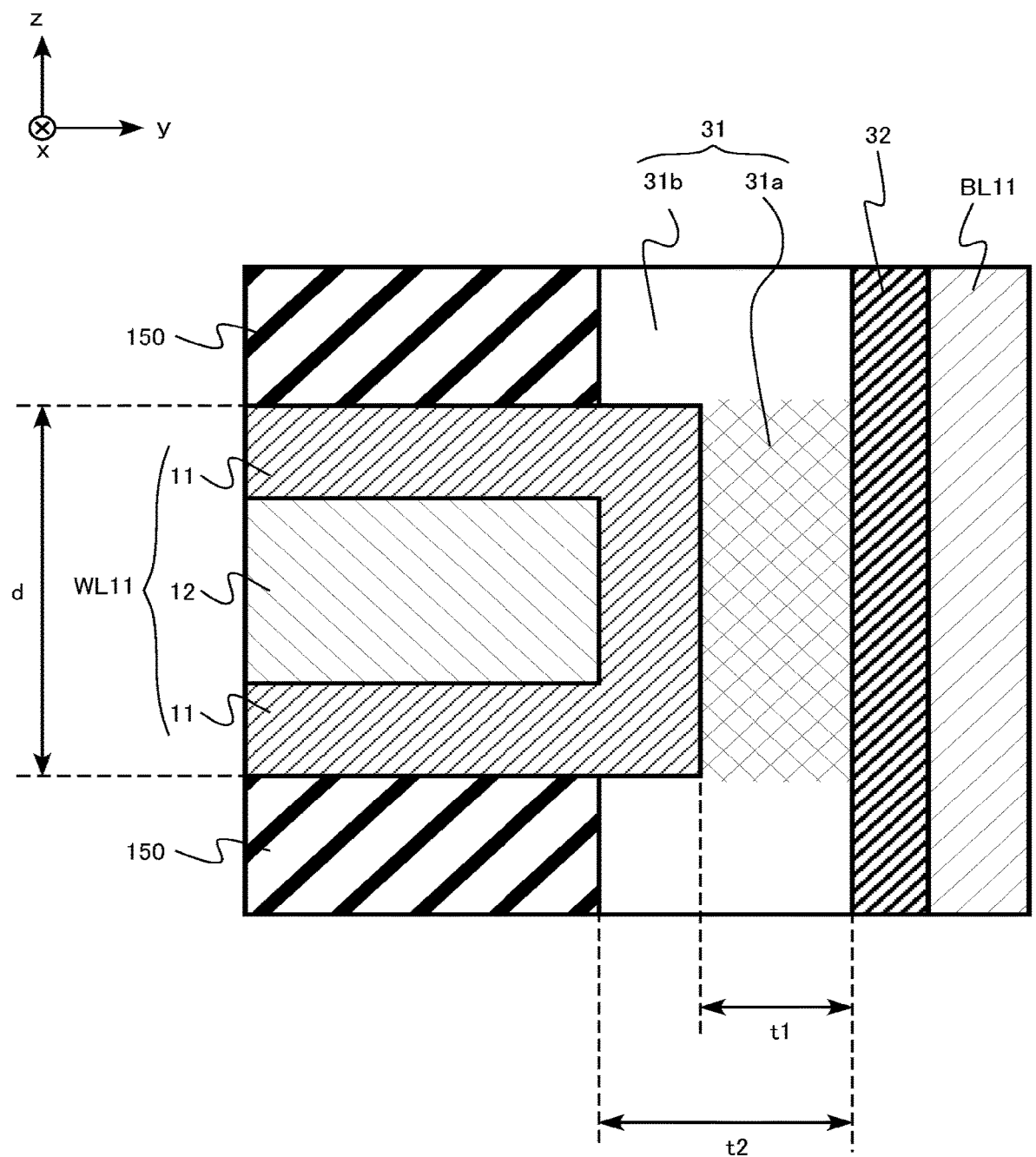
FIG. 31 is a schematic cross-sectional view of a memory cell of the storage device according to the seventh embodiment.

FIG. 31 is a schematic cross-sectional view of the memory cell of the storage device according to the seventh embodiment. FIG. 31 is an enlarged cross-sectional view of a portion of the memory cell MC. FIG. 31 is a yz cross-sectional view of the memory cell MC.

The memory cell array 700 is configured to include: a word line WL11 (first conductive layer); a plurality of word lines including a word line WL21 (second conductive layer); a bit line BL11 (third conductive layer); a plurality of bit lines including a bit line BL21; a first insulating film 31; a second insulating film 32; and an interlayer insulating layer 150 (insulating layer). Hereinafter, in some cases, the word line WL11 (first conductive layer) and the plurality of the word lines including the word line WL12 (second conductive layer) may collectively be referred to simply as a word line WL. In addition, in some cases, the bit line BL11 (third conductive layer) and the plurality of the bit lines including the bit line BL12 may be collectively referred to simply as a bit line BL.

The word line WL has, for example, a barrier metal layer 11 and a main metal layer 12. The first insulating film 31 has a ferroelectric region 31a (first region, third region) and a paraelectric region 31b (second region).

Hereinafter, the x direction illustrated in FIGS. 28 to 31 is defined as a first direction, the y direction is defined as a third direction, and the z direction is defined as a second direction.

The word lines WL are alternately stacked with the interlayer insulating layers 150 in the z direction (second direction). The word line WL extends in the x direction (first direction). The word lines WL are repeatedly arranged in the y direction (third direction).

The word line WL contains, for example, a metal, a metal nitride, a metal carbide, or a semiconductor. The word line WL has, for example, a barrier metal layer 11 and a main metal layer 12.

The barrier metal layer 11 is made of, for example, a metal nitride. The barrier metal layer 11 is made of, for example, a titanium nitride, a tantalum nitride, a tungsten nitride, a tantalum nitride, a titanium carbide, a tungsten carbide, or a tantalum carbide. The main metal layer 12 is made of, for example, tungsten (W), titanium (Ti), or tantalum (Ta).

The thickness (d in FIG. 31) of the word line WL in the z direction (second direction) is, for example, 5 nm or more and 40 nm or less.

The bit line BL extends in the z direction (second direction). The z direction (second direction) intersects the x direction. The z direction (second direction) is perpendicular to the x direction. The bit lines BL are repeatedly arranged in the x direction and the y direction.

The bit line BL contains, for example, a metal, a metal nitride, a metal carbide, or a semiconductor. The bit line BL is made of, for example, a titanium nitride, a tantalum nitride, a tungsten nitride, a tantalum nitride, a titanium carbide, a tungsten carbide, a tantalum carbide, tungsten (W), titanium (Ti), or tantalum (Ta).

The word line WL11 is an example of a first conductive layer. The word line WL21 is an example of a second conductive layer. The bit line BL11 is an example of a third conductive layer.

The interlayer insulating layer 150 is provided between the word lines WL. The interlayer insulating layer 150 contains a silicon oxide. The interlayer insulating layer 150 is an example of an insulating layer.

The first insulating film 31 is provided between the bit line BL and the word line WL. The first insulating film 31 is provided between the bit line BL and the interlayer insulating layer 150. The first insulating film 31 is provided between the word line WL11 (first conductive layer) and the bit line BL11 (third conductive layer). The first insulating film 31 is provided between the word line WL21 (second conductive layer) and the bit line BL11 (third conductive layer).

The first insulating film 31 contains a hafnium oxide. The first insulating film 31 contains, for example, the hafnium oxide as a main component. The phrase "contains the hafnium oxide as a main component" denotes that the molar ratio of the hafnium oxide is the highest among the materials contained in the first insulating film 31. The molar ratio of the hafnium oxide is, for example, 90% or more.

The hafnium oxide constituting the first insulating film 31 may contain, for example, at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The containing of the above-mentioned additive element allows the hafnium oxide to easily exhibit ferroelectricity.

The first insulating film 31 has a ferroelectric region 31a (first region) and a paraelectric region 31b (second region). The ferroelectric region 31a is provided between the word line WL and the bit line BL. The paraelectric region 16b is provided between the interlayer insulating layer 150 and the bit line BL. The paraelectric region 31b is disposed between two ferroelectric regions 31a adjacent to each other in the y direction. The paraelectric region 31b is disposed, for example, between the ferroelectric region 31a between the word line WL11 and the bit line BL11 and the ferroelectric region 31a between the word line WL21 and the bit line BL11.

The ferroelectric region 31a and the paraelectric region 31b have, for example, the same chemical composition. The phrase "the same chemical composition" denotes that the composition is within a range of a variation of the composition occurring unavoidably, for example, in manufacturing.

The ferroelectric region 31a contains a ferroelectric material. The ferroelectric region 31a contains a hafnium oxide of a ferroelectric material. For example, the main component of the ferroelectric region 31a is a hafnium oxide. The ferroelectric region 31a is made of, for example, a hafnium oxide of a ferroelectric material.

The ferroelectric region 31a contains an orthorhombic hafnium oxide. The hafnium oxide contained in the ferroelectric region 31a mainly has an orthorhombic crystal. More specifically, the hafnium oxide contained in the ferroelectric region 31a mainly has a third orthorhombic crystal (orthorhombic III, space group Pbc2l, space group number 29). A main crystal structure of the hafnium oxide contained in the ferroelectric region 31a is orthorhombic. The proportion occupied by the orthorhombic crystal to the crystal of the hafnium oxide contained in the ferroelectric region 31a is the largest. In addition, the orthorhombic crystal is also called a rhombic crystal.

The paraelectric region 31b contains a paraelectric material. The paraelectric region 31b contains a hafnium oxide of a paraelectric material. For example, the main component of the paraelectric region 31b is a hafnium oxide. The paraelectric region 31b is made of, for example, a hafnium oxide of a paraelectric material.

The paraelectric region 31b contains a hafnium oxide having a crystal other than the orthorhombic crystal. The crystal other than the orthorhombic crystal is a cubic crystal, a hexagonal crystal, a tetragonal crystal, a monoclinic crystal, or a triclinic crystal. The hafnium oxide contained in the paraelectric region 31b mainly has a crystal other than the orthorhombic crystal. A main crystal structure of the hafnium oxide contained in the paraelectric region 31b is a crystal structure other than the orthorhombic. The proportion occupied by the crystal other than the orthorhombic crystal to the crystal of the hafnium oxide contained in the paraelectric region 31b is the largest.

The first thickness (t1 in FIG. 31) of the ferroelectric region 31a in the y direction (third direction) from the word line WL toward the bit line BL is smaller than the second thickness (t2 in FIG. 31) of the paraelectric region 31b in the y direction. The second thickness t2 is, for example, 1.2 times or more and 3 times or less the first thickness t1.

The first thickness t1 of the ferroelectric region 31a is, for example, 5 nm or more and 10 nm or less. The second thickness t2 of the paraelectric region 31b is, for example, 15 nm or more and 30 nm or less.

The second insulating film 32 is provided between the first insulating film 31 and the bit line BL. The second insulating film 32 is made of a material different from that of the first insulating film 31.

The second insulating film 32 is made of, for example, an oxide, a nitride, or an oxynitride. The second insulating film 32 contains, for example, a silicon oxide or a titanium oxide. The second insulating film 32 is made of a paraelectric material.

The thickness of the second insulating film 32 is, for example, 0.5 nm or more and 2 nm or less.

In the FTJ memory according to the seventh embodiment, the polarization inversion of the first insulating film 31 which is made of a ferroelectric material is allowed to occur by changing the voltage applied between the word line WL and the bit line BL. The shape of the tunnel barrier formed by the first insulating film 31 and the second insulating film 32 is changed depending on the polarization state of the first insulating film 31. The tunnel current flowing between the word line WL and the bit line BL is changed according to a change of the shape of the tunnel barrier.

For example, when the OFF state (high resistance state) where the tunnel current hardly flows is defined as data "0" and the ON state (low resistance state) where the tunnel current easily flows is defined as data "1", the memory cell MC can store 1-bit data of "0" and "1".

The memory cell array 700 according to the seventh embodiment can be manufactured by using a known process technique with reference to, for example, the method of manufacturing the memory cell array 100 according to the first embodiment and the method of manufacturing the memory cell array 400 according to the fourth embodiment.

Next, the functions and the effects of the storage device according to the seventh embodiment will be described.

For example, when the memory cell array of the FTJ memory is scaled down, there is a concern in that memory characteristics may be degraded due to inter-cell interference between adjacent memory cells. For example, when the interval between the word lines WL is reduced due to the scaling-down, the polarization states of the ferroelectric films under the adjacent word lines WL are changed due to the voltages applied to the word lines WL, and there is a concern in that erroneous writing may occur.

The memory cell array 700 of the storage device according to the seventh embodiment has a structure in which the ferroelectric region 31a under the two word lines WL is physically separated by the paraelectric region 31b. The paraelectric material has a lower dielectric constant than ferroelectric material. Therefore, degradation of memory characteristics due to inter-cell interference is suppressed.

In addition, in the memory cell array 700, the first insulating film 31 between the bit line BL and the word line WL is thinner than the first insulating film 31 between the bit line BL and the interlayer insulating layer 150. Therefore, in the crystallization annealing at the time of the manufacturing of the memory cell array 700, the first insulating film 31 between the bit line BL and the word line WL is likely to be made of a ferroelectric material.

From the viewpoint of facilitating the use of a ferroelectric material for the first insulating film 31 between the bit line BL and the word line WL, the word line WL preferably contains a titanium nitride. The titanium nitride is preferably in contact with the first insulating film 31.

From the viewpoint of facilitating the use of a ferroelectric material for the first insulating film 31 between the bit line BL and the word line WL, the second thickness t2 of the paraelectric region 31b is preferably 1.2 times or more the first thickness t1 of the ferroelectric region 31a.

From the viewpoint of facilitating the use of a ferroelectric material for the first insulating film 31 between the bit line BL and the word line WL, the first thickness t1 of the ferroelectric region 31a is preferably 10 nm or less.

As described above, according to the seventh embodiment, the ferroelectric material under the word line WL and the ferroelectric material under the adjacent word line WL are physically separated. Therefore, it is possible to realize a storage device in which degradation of memory characteristics due to inter-cell interference is suppressed. Then, due to the configuration with the three-dimensional structure, it is possible to obtain the effect of improving the degree of integration of the storage device.

Eighth Embodiment

A storage device according to an eighth embodiment is different from the storage device according to the seventh embodiment in that the first region contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba), and the second region contains or does not contain the at least one element, and the first concentration of at least one element in the first region is higher than the second concentration of at least one element in the second region. In addition, the storage device according to the eighth embodiment is different from the storage device according to the seventh embodiment in that an intermediate layer containing at least one element is included between the first conductive layer and the insulating layer. Hereinafter, a portion of description of contents overlapping with those of the seventh embodiment will be omitted.

Figure 32A:
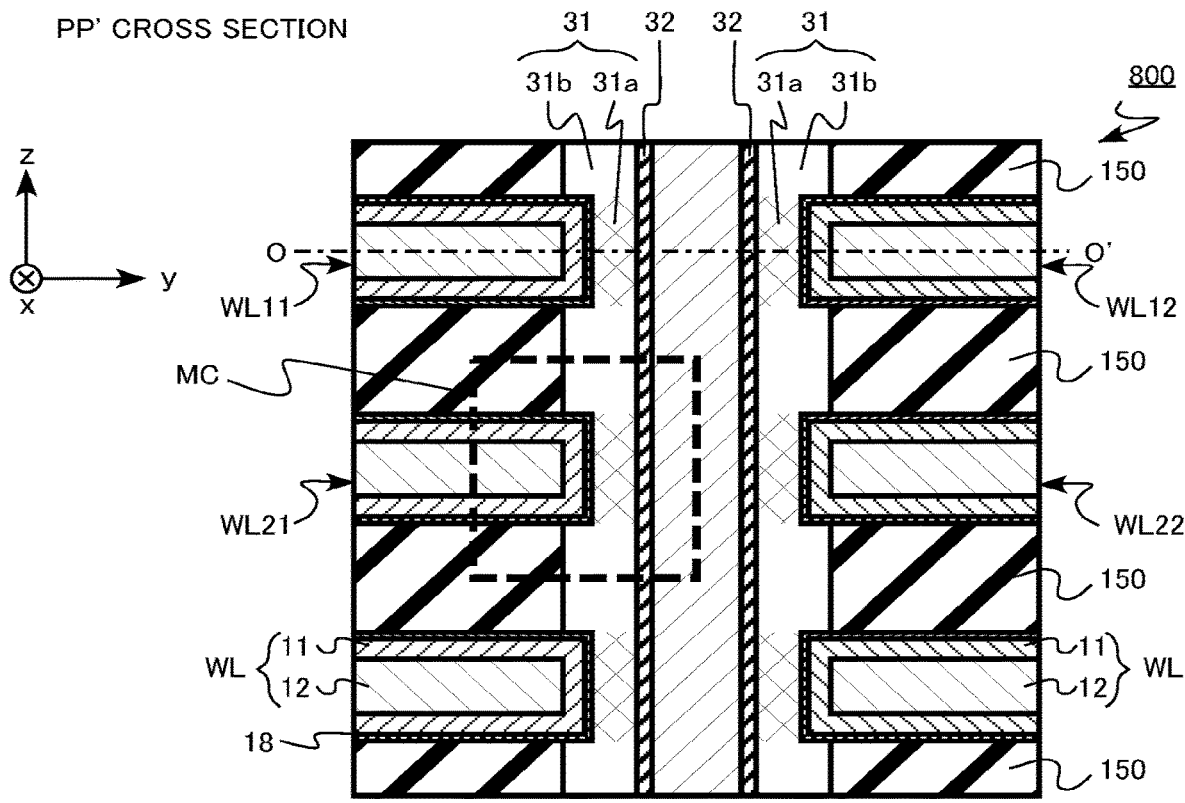
FIGS. 32A and 32B are schematic cross-sectional views of a portion of a memory cell array of a storage device according to an eighth embodiment.
Figure 32B:
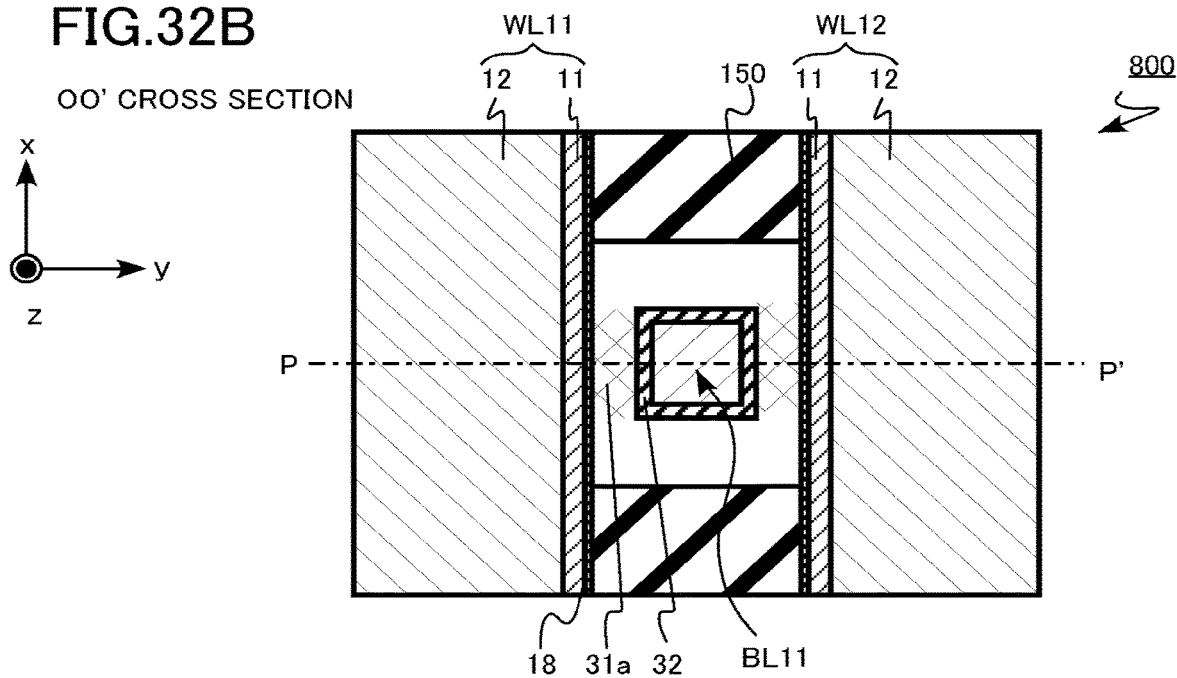

FIGS. 32A and 32B are schematic cross-sectional views of a portion of the memory cell array of the storage device according to the eighth embodiment. FIG. 32A is a yz cross-sectional view of the memory cell array 800. FIG. 32B is an xy cross-sectional view of the memory cell array 800. FIG. 32A is a PP' cross section of FIG. 32B, and FIG. 32B is an OO' cross section of FIG. 32A. In FIG. 32A, a region surrounded by a broken line is one memory cell MC.

Figure 33:
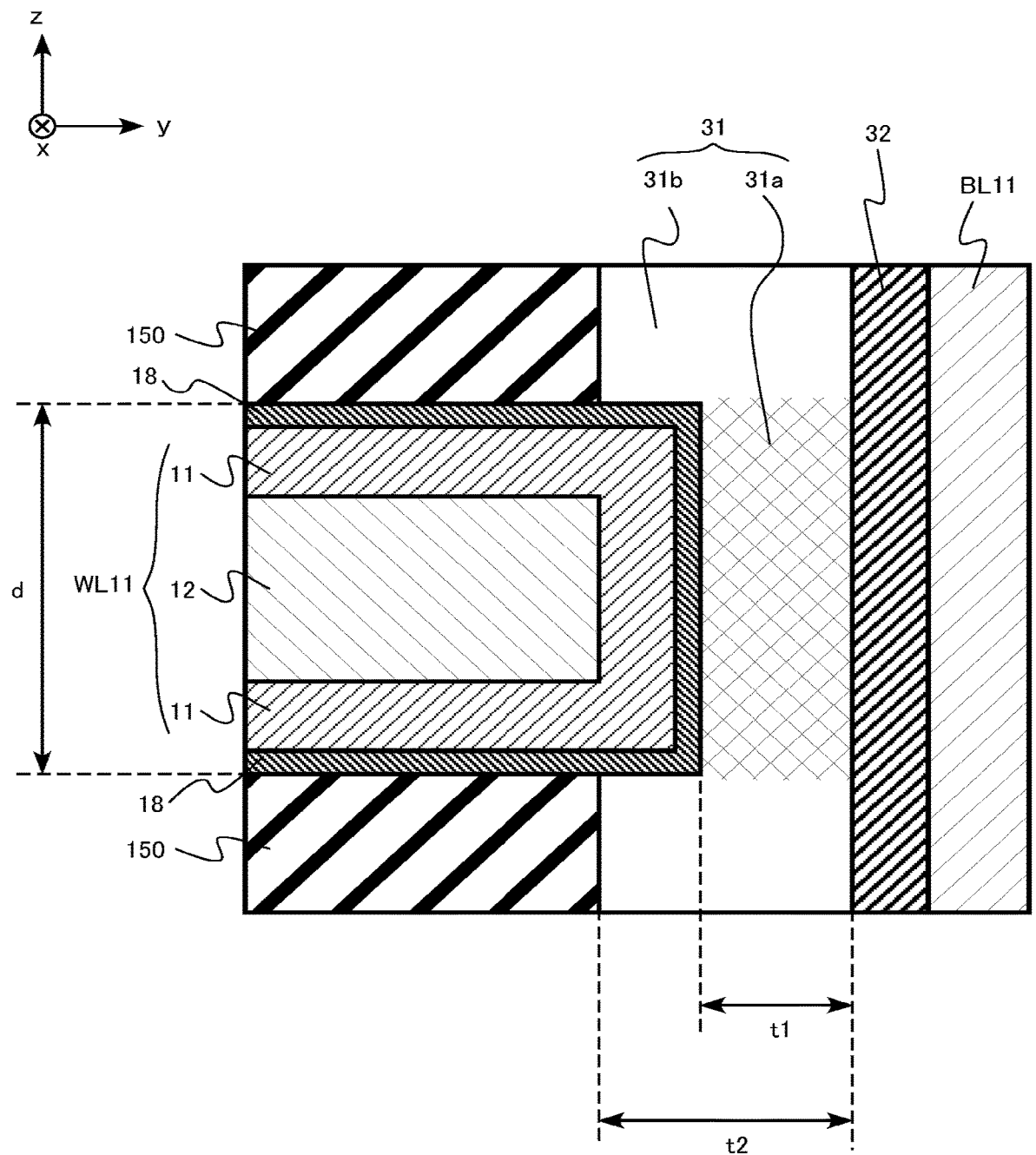
FIG. 33 is a schematic cross-sectional view of a memory cell of the storage device according to the eighth embodiment.

FIG. 33 is a schematic cross-sectional view of a memory cell of the storage device according to the eighth embodiment. FIG. 33 is an enlarged cross-sectional view of a portion of the memory cell MC. FIG. 33 is a yz cross-sectional view of the memory cell MC.

The memory cell array 800 is configured to include: a word line WL11 (first conductive layer); a plurality of word lines including a word line WL21 (second conductive layer); a bit line BL11 (third conductive layer); a plurality of bit lines including a bit line BL21; a first insulating film 31; a second insulating film 32; an interlayer insulating layer 150 (insulating layer); and an intermediate layer 18. Hereinafter, in some cases, the word line WL11 (first conductive layer) and the plurality of word lines including the word line WL12 (second conductive layer) may be collectively referred to simply as a word line WL. In addition, in some cases, the bit line BL11 (third conductive layer) and the plurality of bit lines including the bit line BL12 may be collectively referred to simply as a bit line BL.

The word line WL has, for example, a barrier metal layer 11 and a main metal layer 12. The first insulating film 31 has a ferroelectric region 31a (first region, third region) and a paraelectric region 31b (second region).

Hereinafter, the x direction illustrated in FIGS. 32A, 32B, and 33 is defined as a first direction, the y direction is defined as a third direction, and the z direction is defined as a second direction.

The ferroelectric region 31a contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The paraelectric region 31b contains or does not contain the above-mentioned additive element. The chemical composition of the ferroelectric region 31a is different from the chemical composition of the paraelectric region 31b.

The containing of the above-mentioned additive element allows the hafnium oxide to easily exhibit ferroelectricity.

The concentration (first concentration) of the additive element in the ferroelectric region 31a is higher than the concentration (second concentration) of the additive element in the paraelectric region 31b. In a case where the paraelectric region 31b does not contain the additive element, the second concentration of the additive element in the paraelectric region 31b is zero.

The concentration (first concentration) of the additive element in the ferroelectric region 31a is, for example, 10 times or more the concentration (second concentration) of the additive element in the paraelectric region 31b.

The intermediate layer 18 is provided between the word line WL and the interlayer insulating layer 150 (insulating layer). The intermediate layer 18 is provided between the word line WL and the ferroelectric region 31a. The intermediate layer 18 contains the above-mentioned additive element. The intermediate layer 18 becomes a supply source of the additive element to the ferroelectric region 31a at the time of the manufacturing of the memory cell array 800.

The concentration (third concentration) of the additive element in the intermediate layer 18 is higher than the concentration (fourth concentration) of the additive element in the interlayer insulating layer 150.

The intermediate layer 18 is made of, for example, a metal, a semiconductor, a metal semiconductor compound, a metal nitride, a metal carbide, an oxide insulator, or a nitride insulator. The intermediate layer 18 is made of, for example, aluminum or silicon.

The thickness of the intermediate layer 18 in the y direction (second direction) is smaller than, for example, the thickness of the barrier metal layer 11 in the y direction. The thickness of the intermediate layer 18 in the y direction is, for example, 1 nm or more and 3 nm or less.

The memory cell array 800 according to the eighth embodiment can be manufactured by using a known process technique with reference to the methods of manufacturing the memory cell array 200 according to the second embodiment and the memory cell array 700 according to the seventh embodiment.

In the memory cell array 800 of the storage device according to the eighth embodiment, the concentration (first concentration) of the additive element in the ferroelectric region 31a is higher than the concentration (second concentration) of the additive element in the paraelectric region 31b. The concentration of the additive element is high, and thus, the ferroelectricity of the ferroelectric region 31a is improved.

From the viewpoint of improving the ferroelectricity of the ferroelectric region 31a, the first concentration of the additive element in the ferroelectric region 31a is, for example, preferably 10 times or more the second concentration of the additive element in the paraelectric region 31b and more preferably 100 times or more.

In addition, since the memory cell array 800 includes the intermediate layer 18 containing the above-mentioned additive element, the improvement of the ferroelectricity of the ferroelectric region 31a is facilitated. From the viewpoint of facilitating the manufacturing, the intermediate layer 18 is made of, preferably, aluminum or silicon.

As described above, according to the eighth embodiment, similarly to the seventh embodiment, the ferroelectric material under the word line WL and the ferroelectric material under the adjacent word line WL are physically separated. Therefore, it is possible to realize a storage device in which degradation of memory characteristics due to inter-cell interference is suppressed. Then, due to the configuration with the three-dimensional structure, it is possible to obtain the effect of improving the degree of integration of the storage device. In addition, it is possible to further improve the ferroelectricity of the ferroelectric region.

Ninth Embodiment

A storage device according to a ninth embodiment is different from the storage device according to the eighth embodiment in that the first thickness of the first region in the third direction from the third conductive layer toward the first conductive layer is equal to the second thickness of the second region in the third direction. Hereinafter, a portion of description of contents overlapping with those of the seventh and eighth embodiments will be omitted.

Figure 34A:
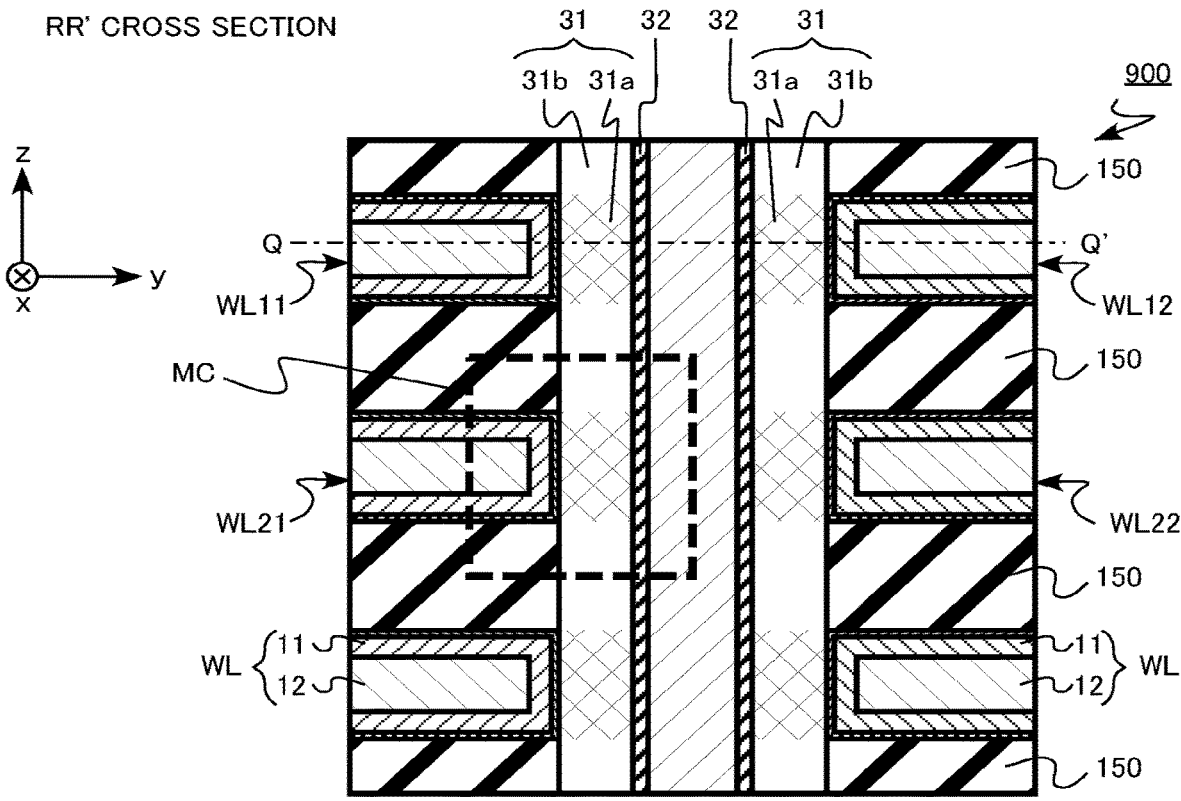
FIGS. 34A and 34B are schematic cross-sectional views of a portion of a memory cell array of a storage device according to a ninth embodiment.
Figure 34B:
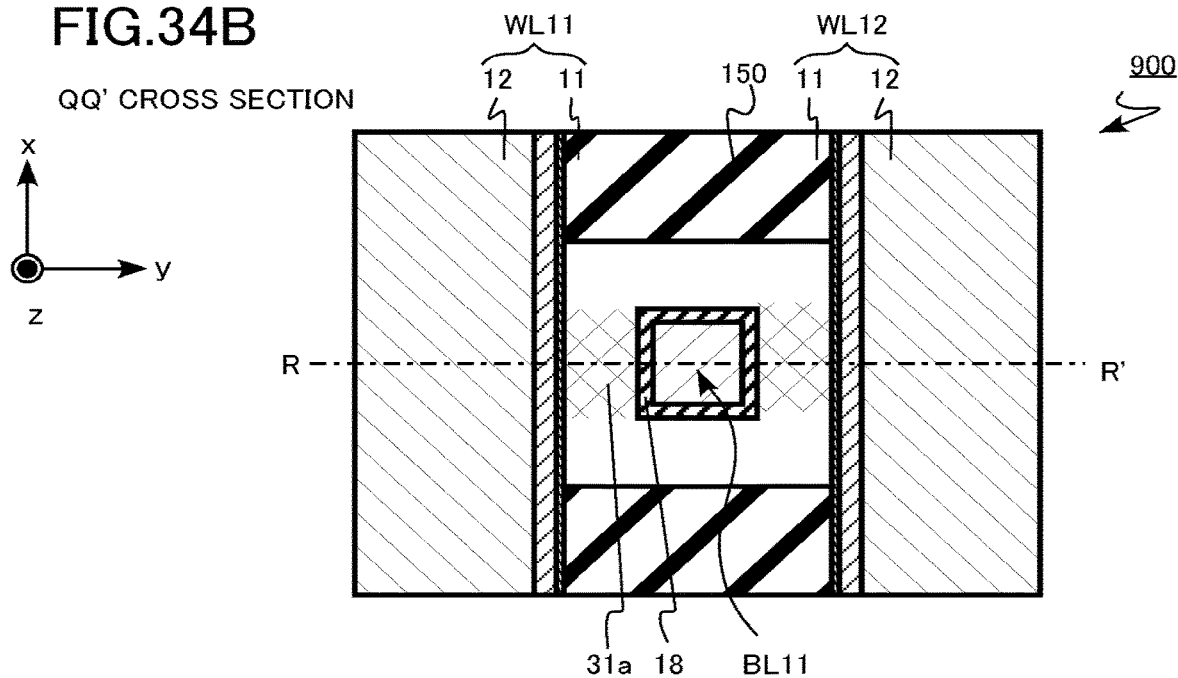

FIGS. 34A and 34B are schematic cross-sectional views of a portion of the memory cell array of the storage device according to the ninth embodiment. FIG. 34A is a yz cross-sectional view of the memory cell array 900. FIG. 34B is an xy cross-sectional view of the memory cell array 900. FIG. 34A is an RR' cross section of FIG. 34B, and FIG. 34B is a QQ' cross section of FIG. 34A. In FIG. 34A, a region surrounded by a broken line is one memory cell MC.

Figure 35:
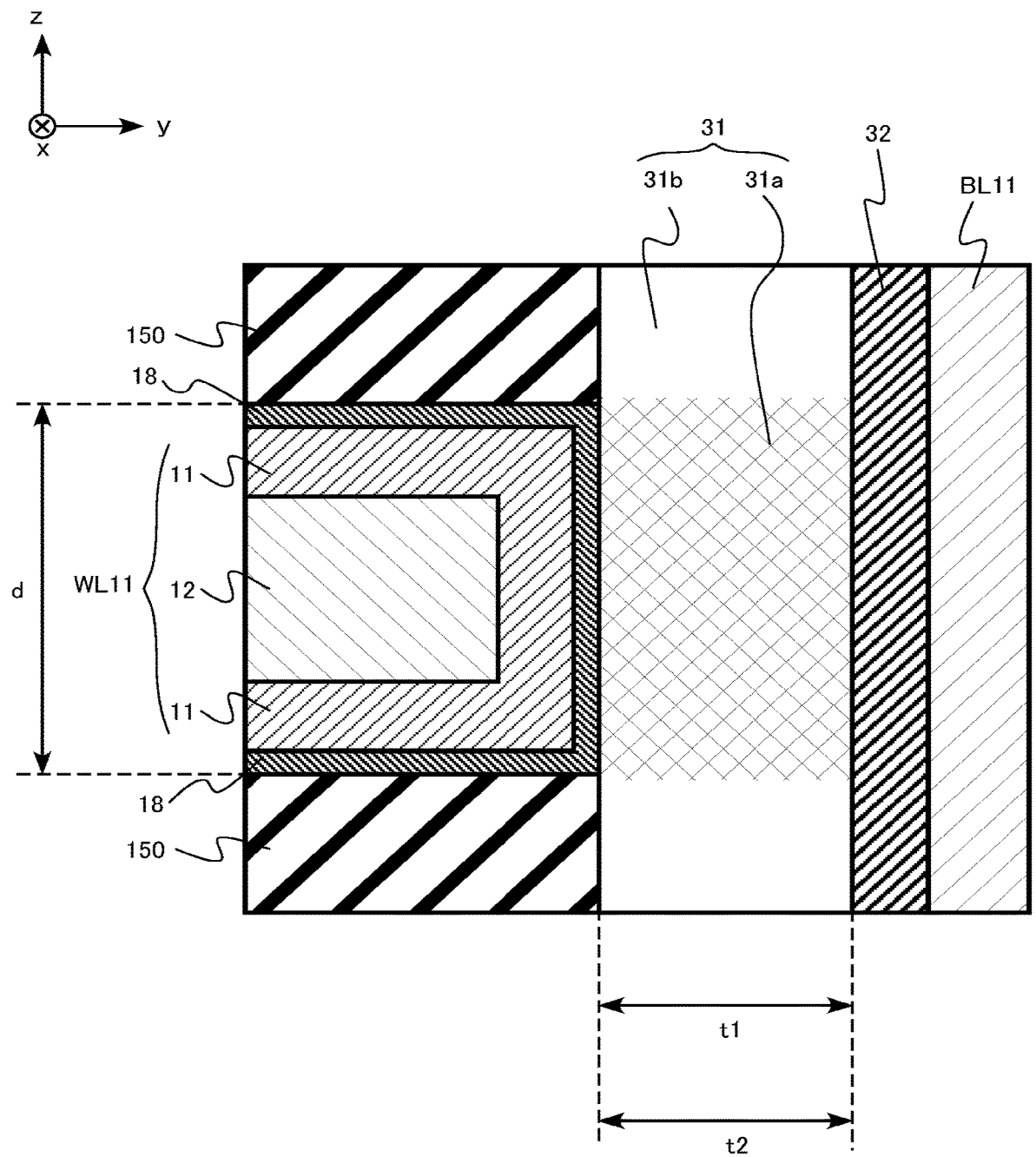
FIG. 35 is a schematic cross-sectional view of a memory cell of the storage device according to the ninth embodiment.

FIG. 35 is a schematic cross-sectional view of a memory cell of the storage device according to the ninth embodiment. FIG. 35 is an enlarged cross-sectional view of a portion of the memory cell MC. FIG. 35 is a yz cross-sectional view of the memory cell MC.

The memory cell array 900 is configured to include: a word line WL11 (first conductive layer); a plurality of word lines including a word line WL21 (second conductive layer); a bit line BL11 (third conductive layer); a plurality of bit lines including a bit line BL21; a first insulating film 31; a second insulating film 32; an interlayer insulating layer 150 (insulating layer); and an intermediate layer 18. Hereinafter, in some cases, the word line WL11 (first conductive layer) and the plurality of word lines including the word line WL12 (second conductive layer) may be collectively referred to simply as a word line WL. In addition, in some cases, the bit line BL11 (third conductive layer) and the plurality of bit lines including the bit line BL12 may be collectively referred to simply as a bit line BL.

The word line WL has, for example, a barrier metal layer 11 and a main metal layer 12. The first insulating film 31 has a ferroelectric region 31a (first region) and a paraelectric region 31b (second region).

Hereinafter, the x direction illustrated in FIGS. 32A, 32B, and 33 is defined as a first direction, the y direction is defined as a third direction, and the z direction is defined as a second direction.

The first thickness (t1 in FIG. 35) of the ferroelectric region 31a in the y direction (third direction) from the bit line BL toward the word line WL is equal to the second thickness (t2 in FIG. 35) of the paraelectric region 31b in they direction.

The ferroelectric region 31a contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The paraelectric region 31b contains or does not contain the above-mentioned additive element.

The chemical composition of the ferroelectric region 31a is different from the chemical composition of the paraelectric region 31b.

The containing of the above-mentioned additive element allows the hafnium oxide to easily exhibit ferroelectricity.

The memory cell array 900 of the storage device according to the ninth embodiment can be manufactured by omitting the process of removing a portion of the first insulating film 31 in the method of manufacturing the memory cell array 800 of the storage device according to the eighth embodiment.

In the memory cell array 900 of the storage device according to the ninth embodiment, the ferroelectric region 31a is allowed to selectively exhibit ferroelectricity by using the additive element.

As described above, according to the ninth embodiment, similarly to the seventh embodiment, the ferroelectric material under the word line WL and the ferroelectric material under the adjacent word line WL are physically separated. Therefore, it is possible to realize a storage device in which degradation of memory characteristics due to inter-cell interference is suppressed. Then, due to the configuration with the three-dimensional structure, it is possible to obtain the effect of improving the degree of integration of the storage device.

In the first to ninth embodiments, cases where the insulating layer is provided between the word lines WL have been described as examples. However, the space between the word lines WL may be, for example, a cavity.

In the fourth to sixth embodiments, cases where the memory cell array has only one cross-point structure have been described as examples. However, a three-dimensional structure in which a plurality of the memory cell arrays of the fourth to sixth embodiments are stacked may be employed.

While certain embodiments have been described, these embodiments have been presented by way of example only, and are not intended to limit the scope of the inventions. Indeed, storage devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A storage device comprising:
a stacked body including gate electrode layers stacked in a first direction, the gate electrode layers including a first gate electrode layer and a second gate electrode layer neighboring the first gate electrode layer in the first direction;
a semiconductor layer provided in the stacked body and extending in the first direction; and
a gate insulating film including a first region, a second region, and a third region, the second region interposed between the first region and the third region, the first region interposed between the first gate electrode layer and the semiconductor layer, the third region interposed between the second gate electrode layer and the semiconductor layer, and the gate insulating film containing a hafnium oxide,
wherein a first thickness of the first region in a second direction from the first gate electrode layer toward the semiconductor layer is smaller than a second thickness of the second region in the second direction, and
wherein a main crystal structure of the hafnium oxide contained in the first region is orthorhombic, and a main crystal structure of the hafnium oxide contained in the second region is a crystal structure other than the orthorhombic.

2. The storage device according to claim 1, wherein the stacked body includes an insulating layer provided between the first gate electrode layer and the second gate electrode layer.

3. The storage device according to claim 1, wherein the second thickness is 1.2 times or more the first thickness.

4. The storage device according to claim 1, wherein the first thickness is 5 nm or more and 10 nm or less.

5. The storage device according to claim 1, wherein a chemical composition of the first region is the same as a chemical composition of the second region.

6. The storage device according to claim 1,
wherein the first region contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba), and the second region contains or does not contain the at least one element, and
wherein a first concentration of the at least one element in the first region is higher than a second concentration of the at least one element in the second region.

7. The storage device according to claim 1, wherein the gate electrode layers contain titanium nitride.

8. The storage device according to claim 1, wherein the first region contains a ferroelectric material, and the second region contains a paraelectric material.

9. A storage device comprising:
a first conductive layer extending in a first direction;
a second conductive layer extending in the first direction;
a third conductive layer extending in a second direction intersecting the first direction;
a first insulating film including a first region, a second region, and a third region, the second region interposed between the first region and the third region, the first region interposed between the first conductive layer and the third conductive layer, the third region interposed between the second conductive layer and the third conductive layer, and the first insulating film containing a hafnium oxide; and
a second insulating film provided between the first insulating film and the third conductive layer and made of a material different from that of the first insulating
wherein a first thickness of the first region in a third direction from the first conductive layer toward the third conductive layer is smaller than a second thickness of the second region in the third direction, and wherein a main crystal structure of the hafnium oxide contained in the first region is orthorhombic, and a main crystal structure of the hafnium oxide contained in the second region is a crystal structure other than the orthorhombic.

10. The storage device according to claim 9, further comprising: an insulating layer provided between the first conductive layer and the second conductive layer.

11. The storage device according to claim 9, wherein the second thickness is 1.2 times or more the first thickness.

12. The storage device according to claim 9, wherein the first thickness is 5 nm or more and 10 nm or less.

13. The storage device according to claim 9, wherein a chemical composition of the first region is the same as a chemical composition of the second region.

14. The storage device according to claim 9,
wherein the first region contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba), and the second region contains or does not contain the at least one element, and
wherein a first concentration of the at least one element in the first region is higher than a second concentration of the at least one element in the second region.

15. The storage device according to claim 9, wherein the first conductive layer contains a titanium nitride.

16. The storage device according to claim 9, wherein the first region contains a ferroelectric material, and the second region contains a paraelectric material.

* * * * *